(12) United States Patent
Shirato et al.

(10) Patent No.: US 11,086,236 B2
(45) Date of Patent: Aug. 10, 2021

(54) EXPOSURE APPARATUS AND EXPOSURE METHOD, AND FLAT PANEL DISPLAY MANUFACTURING METHOD

(71) Applicant: NIKON CORPORATION, Tokyo (JP)

(72) Inventors: Akinori Shirato, Sagamihara (JP); Takashi Shibuya, Fujisawa (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/911,748

(22) Filed: Jun. 25, 2020

(65) Prior Publication Data

US 2020/0326638 A1   Oct. 15, 2020

Related U.S. Application Data

(62) Division of application No. 15/763,432, filed as application No. PCT/JP2016/078778 on Sep. 29, 2016, now Pat. No. 10,732,517.

(30) Foreign Application Priority Data

Sep. 30, 2015   (JP) .............................. JP2015-195268

(51) Int. Cl.
| | | |
|---|---|---|
| *G03F 7/20* | (2006.01) | |
| *G03B 27/42* | (2006.01) | |
| *G02F 1/13* | (2006.01) | |
| *G03F 7/00* | (2006.01) | |
| *G03F 7/22* | (2006.01) | |
| *G01D 5/347* | (2006.01) | |

(52) U.S. Cl.
CPC ........ *G03F 7/70775* (2013.01); *G02F 1/1303* (2013.01); *G03F 7/0007* (2013.01);
(Continued)

(58) Field of Classification Search
CPC .. G03F 7/70775; G03F 7/2057; G03F 7/0007; G03F 7/2002; G03F 7/2022;
(Continued)

(56) References Cited

U.S. PATENT DOCUMENTS

| | | |
|---|---|---|
| 5,610,715 A | 3/1997 | Yoshii et al. |
| 5,729,331 A | 3/1998 | Tanaka et al. |

(Continued)

FOREIGN PATENT DOCUMENTS

| | | |
|---|---|---|
| CN | 104838469 A | 8/2015 |
| EP | 2905805 A1 | 8/2015 |

(Continued)

OTHER PUBLICATIONS

Dec. 27, 2016 International Search Report issued in International Patent Application No. PCT/JP2016/078778.

(Continued)

*Primary Examiner* — Mesfin T Asfaw
(74) *Attorney, Agent, or Firm* — Oliff PLC

(57) ABSTRACT

In an exposure apparatus, on a substrate holder (34), a plurality of grating areas (RG) is arranged mutually apart in the X-axis direction, and a plurality of heads (66a to 66d) that irradiates a measurement beam with respect to the grating area and can move in the Y-axis direction is arranged outside of the substrate holder. A control system controls movement of the substrate holder in at least directions of three degrees of freedom within an XY plane, based on measurement information of at least three heads of the plurality of heads facing the grating area and measurement information of a measurement device that measures position information of the plurality of heads. The measurement beam of each of the plurality of heads, during the movement of substrate holder in the X-axis direction, moves off of one of the plurality of grating areas and switches to another adjacent grating area.

43 Claims, 22 Drawing Sheets

(52) U.S. Cl.
CPC .......... *G03F 7/2002* (2013.01); *G03F 7/2022* (2013.01); *G03F 7/2057* (2013.01); *G03F 7/22* (2013.01); *G03F 7/7085* (2013.01); *G03F 7/70475* (2013.01); *G03F 7/70725* (2013.01); *G03F 7/70758* (2013.01); *G01D 5/34746* (2013.01)

(58) Field of Classification Search
CPC .... G03F 7/22; G03F 7/70475; G03F 7/70725; G03F 7/70758; G03F 7/7085; G03F 7/70133; G03F 7/70108; G03F 7/20; G03F 7/70341; G03F 7/709; G03F 7/70191; G03F 7/70716; G03F 7/707; G03F 7/70508; G03F 7/7055; G03F 7/7075; G02F 1/1303; G01D 5/34746; H01L 21/0274; H01L 21/0273
See application file for complete search history.

(56) References Cited

U.S. PATENT DOCUMENTS

| | | | |
|---|---|---|---|
| 6,552,775 | B1 | 4/2003 | Yanagihara et al. |
| 6,639,686 | B1 | 10/2003 | Ohara |
| 6,761,482 | B2 | 7/2004 | Ueno |
| 7,561,280 | B2 | 7/2009 | Schluchter et al. |
| 2008/0030702 | A1 | 2/2008 | Kawamura |
| 2008/0094592 | A1 | 4/2008 | Shibazaki |
| 2008/0129762 | A1 | 6/2008 | Shiomi |
| 2010/0018950 | A1 | 1/2010 | Aoki et al. |
| 2012/0057140 | A1 | 3/2012 | Aoki |
| 2015/0286147 | A1 | 10/2015 | Shibazaki |

FOREIGN PATENT DOCUMENTS

| | | |
|---|---|---|
| WO | 2010/131485 A1 | 11/2010 |
| WO | 2014/054690 A1 | 4/2014 |

OTHER PUBLICATIONS

Dec. 27, 2016 Written Opinion of the International Searching Authority issued in International Patent Application No. PCT/JP2016/078778.

Dec. 20, 2018 Restriction/Election Requirement issued in U.S. Appl. No. 15/763,432.

Jul. 17, 2019 Office Action issued in U.S. Appl. No. 15/763,432.

Mar. 24, 2020 Notice of Allowance issued in U.S. Appl. No. 15/763,432.

Sep. 18, 2020 Office Action issued in Chinese Patent Application No. 201680058222.6.

EXPOSURE APPARATUS AND EXPOSURE METHOD, AND FLAT PANEL DISPLAY MANUFACTURING METHOD

This is a Divisional of U.S. patent application Ser. No. 15/763,432 filed Mar. 26, 2018, which is the U.S. National Stage of International Application No. PCT/JP2016/078778 filed Sep. 29, 2016, which claims priority from Japanese Application No. 2015-195268 filed in Japan on Sep. 30, 2015. The disclosure of each of the above-identified applications is incorporated by reference herein in its entirety.

TECHNICAL FIELD

The present invention relates to exposure apparatuses and exposure methods, and flat panel display manufacturing methods, and more particularly, to an exposure apparatus and an exposure method used in a lithography process for producing micro-devices such as a liquid crystal display device, and a flat panel display manufacturing method using the exposure apparatus and the exposure method.

BACKGROUND ART

Conventionally, in a lithography process for producing electronic devices (micro-devices) such as a liquid crystal display device or a semiconductor device (such as an integrated circuit), exposure apparatuses are used such as an exposure apparatus of a step-and-scan method (a so-called scanning stepper (also called a scanner)) that transfers a pattern formed on a mask irradiated with an energy beam, while a mask (photomask) or a reticle (hereinafter collectively called a "mask") and a glass plate or a wafer (hereinafter collectively called a "substrate") are moved synchronously along a predetermined scanning direction (scan direction).

As this type of exposure apparatus, an exposure apparatus equipped with an optical interferometer system is known that obtains position information within a horizontal plane of a substrate subject to exposure using a bar mirror (long mirror) that a substrate stage device has (for example, refer to PTL 1).

Here, in the case of obtaining position information of the substrate using the optical interferometer system, influence of the so-called air fluctuation cannot be ignored. While the influence of air fluctuation mentioned above can be reduced using an encoder system, due to the increasing size of substrates in recent years, it is becoming difficult to prepare a scale that can cover the entire moving range of the substrate.

CITATION LIST

Patent Literature

[PTL 1] U.S. Patent Application Publication No. 2010/0018950

SUMMARY OF THE INVENTION

Means for Solving the Problem

According to a first aspect of the present invention, there is provided an exposure apparatus that irradiates an object with an illumination light via an optical system, comprising: a movable body arranged below the optical system that holds the object; a drive system that can move the movable body in a first direction and a second direction orthogonal to each other within a predetermined plane orthogonal to an optical axis of the optical system; a measurement system in which one of a grating member with a plurality of grating areas arranged mutually apart in the first direction and a plurality of heads each irradiating the grating member with a measurement beam that can move in the second direction is provided at the movable body, and the other of the grating member and the plurality of heads is provided facing the movable body, the measurement system having a measurement device that measures position information of the plurality of heads in the second direction, and the measurement system measuring position information of the movable body in at least directions of three degrees of freedom within the predetermined plane, based on measurement information of at least three heads of the plurality of heads irradiating at least one of the plurality of grating areas with the measurement beams and measurement information of the measurement device; and a control system that controls the drive system based on position information measured by the measurement system, wherein the measurement beam of each of the plurality of heads moves off of one of the plurality of grating areas and moves to irradiate another grating area adjacent to the one grating area, while the movable body is moving in the first direction.

According to a second aspect of the present invention, there is provided a flat panel display manufacturing method, comprising: exposing a substrate using the exposure apparatus according to the first aspect; and developing the substrate that has been exposed.

According to a third aspect of the present invention, there is provided an exposure method irradiating an object with an illumination light via an optical system, comprising: measuring position information of a movable body in at least directions of three degrees of freedom within a predetermined plane orthogonal to an optical axis of the optical system by a measurement system in which one of a grating member with a plurality of grating areas arranged apart from the plurality of first grating areas in a second direction orthogonal to the first direction within the predetermined plane and apart from one another in the first direction, and a plurality of heads each irradiating the grating member with a measurement beam that can move in the second direction orthogonal to the first direction within the predetermined plane is provided at the movable body, and the other of the grating member and the plurality of heads is provided facing the movable body, and by the measurement system having a measurement device that measures position information of the plurality of heads in the second direction, position information of the movable body is measured based on measurement information of at least three heads of the plurality of heads irradiating at least one of the plurality of grating areas with the measurement beams and measurement information of the measurement device; and moving the movable body based on position information measured by the measurement system; wherein with each of the plurality of heads, the measurement beam moves off one of the plurality of grating areas, and moves to irradiate another grating area adjacent to the one grating area while the movable body is moving in the first direction.

According to a fourth aspect of the present invention, there is provided a flat panel display manufacturing method, comprising: exposing a substrate using the exposure method according to the third aspect; and developing the substrate that has been exposed.

BRIEF DESCRIPTION OF DRAWINGS

FIG. 2 is a view showing an example of a substrate stage device that the liquid crystal exposure apparatus of FIG. 1 is equipped with.

DESCRIPTION OF EMBODIMENTS

First Embodiment

Hereinafter, a first embodiment will be described, using FIGS. 1 to 16B.

Figure 1:
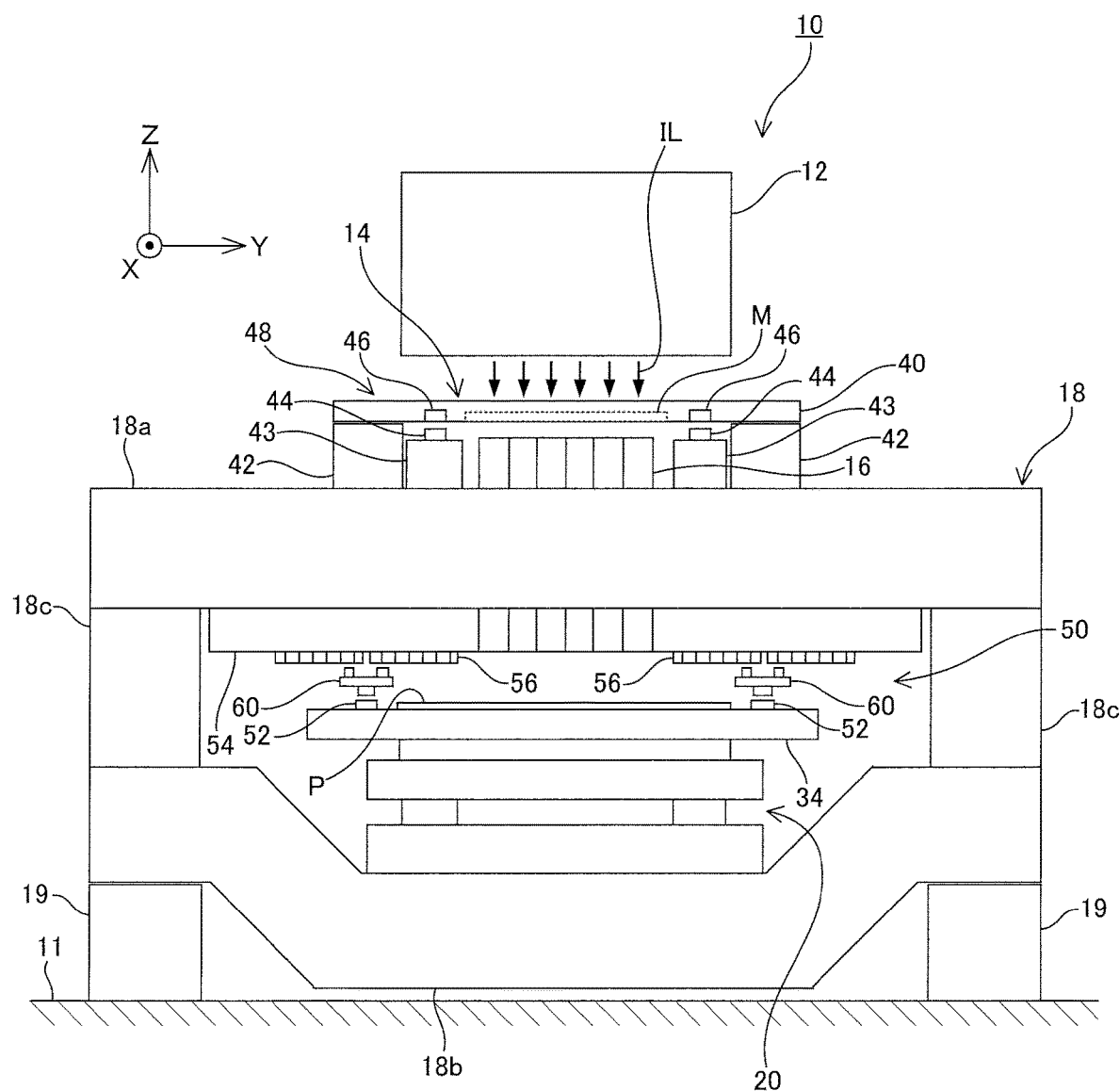
FIG. 1 is a view schematically showing a structure of a liquid crystal exposure apparatus according to a first embodiment.

FIG. 1 schematically shows a structure of a liquid crystal exposure apparatus 10 according to the first embodiment. Liquid crystal exposure apparatus 10 is a projection exposure apparatus of a step-and-scan method, or a so-called scanner whose exposure target is a rectangular (square-shaped) glass substrate P (hereinafter simply referred to as substrate P) used in, for example, a liquid crystal display device (flat panel display) or the like.

Liquid crystal exposure apparatus 10 has an illumination system 12, a mask stage device 14 that holds a mask M on which a circuit pattern and the like is formed, a projection optical system 16, an apparatus main section 18, a substrate stage device 20 that holds substrate P whose surface (a surface facing a +Z side in FIG. 1) is coated with a resist (sensitive agent), a control system for these parts and the like. In the description below, a direction in which mask M and substrate P are each relatively scanned with respect to an illumination light IL at the time of scanning exposure within a predetermined plane (XY plane, a horizontal plane in FIG. 1) orthogonal to an optical axis (coincides with an optical axis of illumination system 12 in the embodiment) of projection optical system 16 will be described as an X-axis direction, a direction orthogonal to the X-axis direction in the horizontal plane will be described as a Y-axis direction, a direction orthogonal to the X-axis and the Y-axis will be described as a Z-axis direction, and rotation directions around the X-axis, the Y-axis, and the Z-axis will each be described as a θx direction, a θy direction, and a θz direction. Also, positions in the X-axis, the Y-axis, and the Z-axis directions will each be described as an X position, a Y position, and a Z position.

Illumination system 12 is structured similarly to the illumination system disclosed in, for example, U.S. Pat. No. 5,729,331 and the like. Illumination system 12 irradiates mask M with a light emitted from a light source not shown (e.g. a mercury lamp) serving as an exposure illumination light (illumination light) IL, via parts such as a reflection mirror, a dichroic mirror, a shutter, a wavelength selection filter, and various kinds of lenses. As illumination light IL, for example, a light including at least one of an i-line (wavelength 365 nm), a g-line (wavelength 436 nm), and an h-line (wavelength 405 nm) (in the embodiment, a synthetic light of the i-line, the g-line, and the h-line described above) is used. Illumination system 12 has a plurality of optical systems that irradiates a plurality of illumination areas whose positions in the Y-axis direction are different with illumination light IL, and the number of this plurality of optical systems is the same as the number of a plurality of optical systems of projection optical system 16 to be described later on.

Mask stage device 14 includes a mask holder (also called a slider or a movable member) 40 that holds mask M, for example, by vacuum suction, a mask drive system 91 (not shown in FIG. 1, refer to FIG. 8) that moves mask holder 40 in a scanning direction (the X-axis direction) in predetermined long strokes and also finely moves the mask holder in the Y-axis direction and the θz direction, and a mask position measurement system that measures at least position information (position information in directions of three degrees of freedom including the X-axis direction, the Y-axis direction, and the θz direction, and the θz direction includes rotation (yawing) information) of mask holder 40 within the XY plane. Mask holder 40 consists of a frame shaped member in which an opening section in a rectangular shape in a planar view is formed, as is disclosed in, for example, U.S. Patent Application Publication No. 2008/0030702. Mask holder 40 is mounted on a pair of mask guides 42 fixed to an upper mount section 18a, which is a part of apparatus main section 18, via, for example, an air bearing (not shown). Mask drive system 91 includes, for example, a linear motor (not shown). While the description below is made with mask holder 40 being moved, a table or a stage having a holding section of mask M may be moved. That is, the mask holder holding the mask does not necessarily have to be provided separately with the mask table or the mask stage and the mask may be held by vacuum suction or the like on the mask table or the mask stage, and in such a case, the mask table or the mask stage holding the mask is to be moved in directions of three degrees of freedom within the XY plane.

The mask position measurement system is equipped with a mask encoder system 48 that has one of a pair of encoder head units 44 (hereinafter simply referred to as a head unit 44) and a plurality of encoder scales 46 (overlapping in a depth direction of the page surface in FIG. 1, refer to FIG. 3A) irradiated with a measurement beam via head unit 44 provided at mask holder 40, and the other of encoder heads 44 and the plurality of encoder scales 46 provided facing mask holder 40. In the embodiment, encoder head 44 is provided at upper mount section 18a via an encoder base 43, and the plurality of encoder scales 46 are provided on the lower surface side of mask holder 40 so that the encoder scales each face the pair of encoder heads 44. Note that encoder head 44 may be provided, not at upper mount section 18a but at, for example, the upper end side of projection optical system 16. The structure of mask encoder system 48 will be described in detail, later on.

Projection optical system (projection system) 16 is supported by upper mount section 18a, and is placed below mask stage device 14. Projection optical system 16 is a so-called multi-lens projection optical system having a structure similar to the projection optical system disclosed in, for example, U.S. Pat. No. 6,552,775 and the like, and is equipped with a plurality of (in the embodiment, e.g. 11; refer to FIG. 3A) optical systems (projection optical systems) that form an upright normal image with a double telecentric equal magnifying system.

In liquid crystal exposure apparatus 10, when an illumination area on mask M is illuminated with illumination light IL from illumination system 12, by the illumination light having passed mask M, a projection image (partial upright image) of the circuit pattern of mask M within the illumination area is formed on an irradiation area (exposure area) of the illumination light on substrate P conjugate with the illumination area, via projection optical system 16. And, by substrate P being relatively moved in the scanning direction with respect to the exposure area (illumination light IL) along with mask M being relatively moved in the scanning direction with respect to the illumination area (illumination light IL), scanning exposure of a shot area on substrate P is performed, and the pattern formed on mask M is transferred onto the shot area.

Apparatus main section (also referred to such as a main section or a frame structure) 18 supports mask stage device 14, projection optical system 16, and substrate stage device 20 described above, and is installed on a floor 11 of a clean room via a plurality of vibration isolation devices 19. Apparatus main section 18 is structured similarly to the apparatus main section disclosed in, for example, U.S. Patent Application Publication No. 2008/0030702. In the embodiment, the apparatus main section has upper mount section 18a (also called an optical surface plate) that supports projection optical system 16 described above, a pair of lower mount sections 18b (one of the lower mount section is not shown in FIG. 1 since the lower mount sections are arranged overlapping in the depth direction of the page surface, refer to FIG. 2) where substrate stage device 20 is arranged, and a pair of middle mount sections 18c.

Substrate stage device 20 is a device used to position substrate P with high precision with respect to the plurality of partial images (exposure light IL) of the mask pattern projected via projection optical system 16 in scanning exposure, and moves substrate P in directions of six degrees of freedom (the X-axis, the Y-axis, and the Z-axis directions, and the θx, the θy, and the θz directions). While the structure of substrate stage device 20 is not limited in particular, a stage device of a so-called coarse/fine movement structure can be used, including a gantry type two-dimensional coarse movement stage and a fine movement stage finely moved with respect to the two-dimensional coarse movement stage, as is disclosed in, for example, U.S. Patent Application Publication No. 2008/129762, U.S. Patent Application Publication No. 2012/0057140 and the like. In this case, substrate P can be moved in directions of three degrees of freedom within the horizontal plane by the coarse movement stage, and substrate P can also be finely moved in directions of six degrees of freedom by the fine movement stage.

Figure 2:
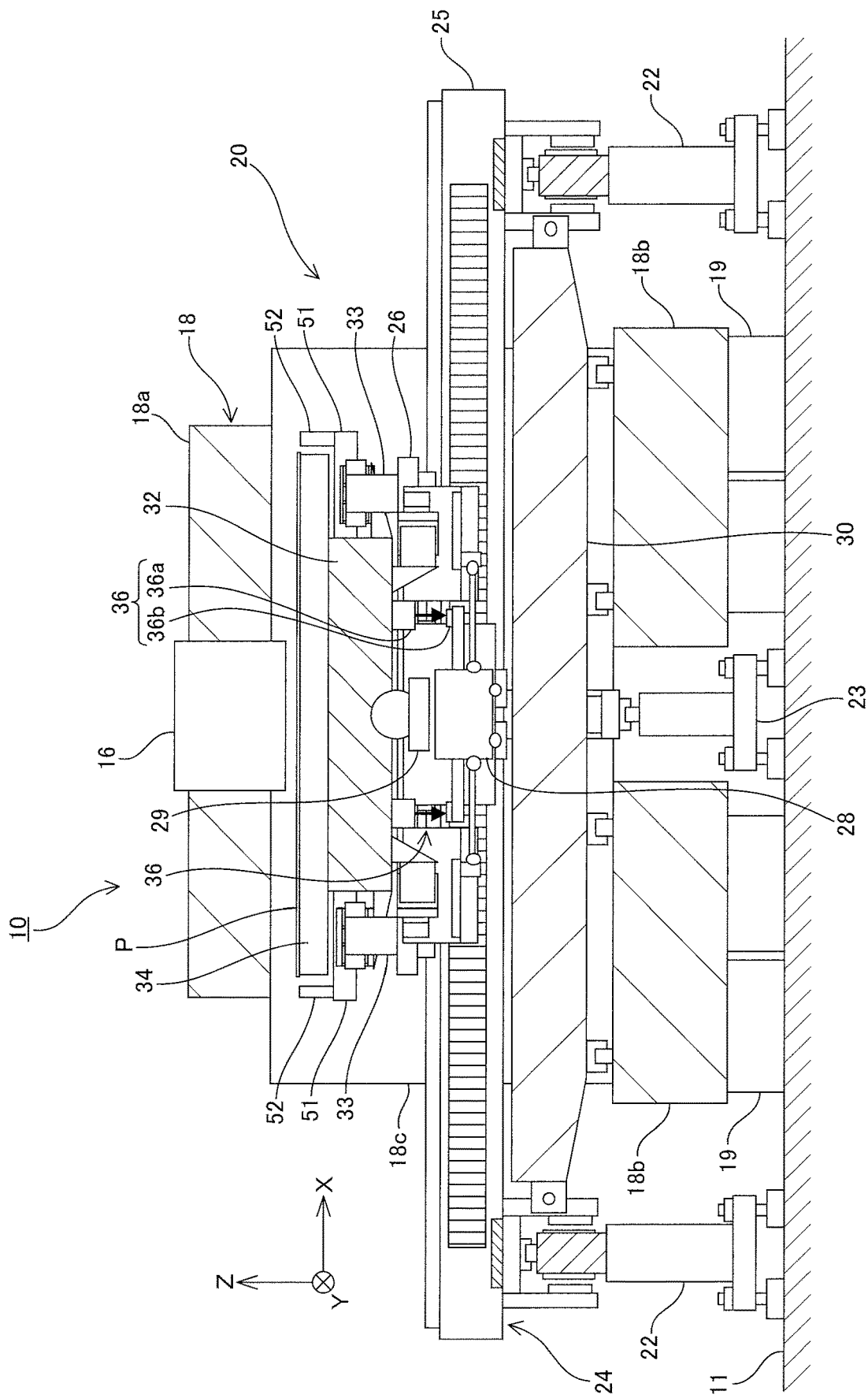

FIG. 2 shows an example of substrate stage device 20 of the so-called coarse/fine movement structure used in liquid crystal exposure apparatus 10 of the embodiment. Substrate stage device 20 is equipped with a pair of base frames 22, a Y coarse movement stage 24, an X coarse movement stage 26, a weight canceling device 28, a Y step guide 30, and a fine movement stage 32.

Base frame 22 consists of a member extending in the Y-axis direction, and is installed on floor 11 in a state vibrationally isolated from apparatus main section 18. Also, an auxiliary base frame 23 is placed in between the pair of lower mount sections 18b of main section 18. Y coarse movement stage 24 has a pair of (one of the pair not shown in FIG. 2) X beams 25 laid between the pair of base frames 22. Auxiliary base frame 23 described earlier supports the center part in the longitudinal direction of X beam 25 from below. Y coarse movement stage 24 is moved in predetermined long strokes in the Y-axis direction on the pair of base frames 22 via a plurality of Y linear motors serving as a part of a substrate drive system 93 (not shown in FIG. 2, refer to FIG. 8) that drives substrate P in directions of six degrees of freedom. X coarse movement stage 26 is mounted on Y coarse movement stage 24 in a state lying in between the pair of X beams 25. X coarse movement stage 26 is moved in predetermined long strokes in the X-axis direction on Y coarse movement stage 24 via a plurality of X linear motors serving as a part of substrate drive system 93. Also, X coarse movement stage 26 is mechanically limited in relative movement in the Y-axis direction with respect to Y coarse movement stage 24, and moves in the Y-axis direction integrally with Y coarse movement stage 24.

Weight canceling device 28 is inserted in between the pair of X beams 25 and is also mechanically connected to X coarse movement stage 26. This allows weight canceling device 28 to move in predetermined long strokes in the X-axis direction and/or the Y-axis direction integrally with X coarse movement stage 26. Y step guide 30 consists of a member extending in the X-axis direction, and is mechanically connected to Y coarse movement stage 24. This allows Y step guide 30 to move in predetermined long strokes in the Y-axis direction integrally with Y coarse movement stage 24. The above weight canceling device 28 is mounted on Y step guide 30 via a plurality of air bearings. Weight canceling device 28, when X coarse movement stage 26 moves only in the X-axis direction, moves in the X-axis direction on Y step guide 30 which is in a stationary state, and when X coarse movement stage 26 moves in the Y-axis direction (including the case when there is also movement in the X-axis direction), weight canceling device 28 moves in the Y-axis direction integrally with Y step guide 30 (so that the weight canceling device does not fall off from Y step guide 30).

Fine movement stage 32 consists of a plate-shaped (or a box-shaped) member rectangular in a planar view, and the center part is supported from below by weight canceling device 28 in a state freely swingable with respect to the XY plane via a spherical bearing device 29. A substrate holder 34 is fixed to the upper surface of fine movement stage 32, and substrate P is mounted on substrate holder 34. Note that the substrate holder holding the substrate does not necessarily have to be provided separately from a table or a stage where the holding section that holds the substrate is provided, in this case, fine movement stage 32, and the substrate may be held by vacuum suction or the like on the table or the stage. Fine movement stage 32 includes a stator that X coarse movement stage 26 has and a mover that fine movement stage 32 has, and is finely moved in directions of six degrees of freedom with respect to X coarse movement stage 26 by a plurality of linear motors 33 (e.g. voice coil motors) that structures a part of the above substrate drive system 93 (not shown in FIG. 2, refer to FIG. 8). Also, fine movement stage 32 moves in predetermined long strokes in the X-axis direction and/or the Y-axis direction along with X coarse movement stage 26 by thrust given by X coarse movement stage 26 via the plurality of linear motors 33 above. The structure of substrate stage device 20 described so far (however excluding the measurement system) is disclosed in, for example, U.S. Patent Application Publication No. 2012/0057140.

Figure 8:
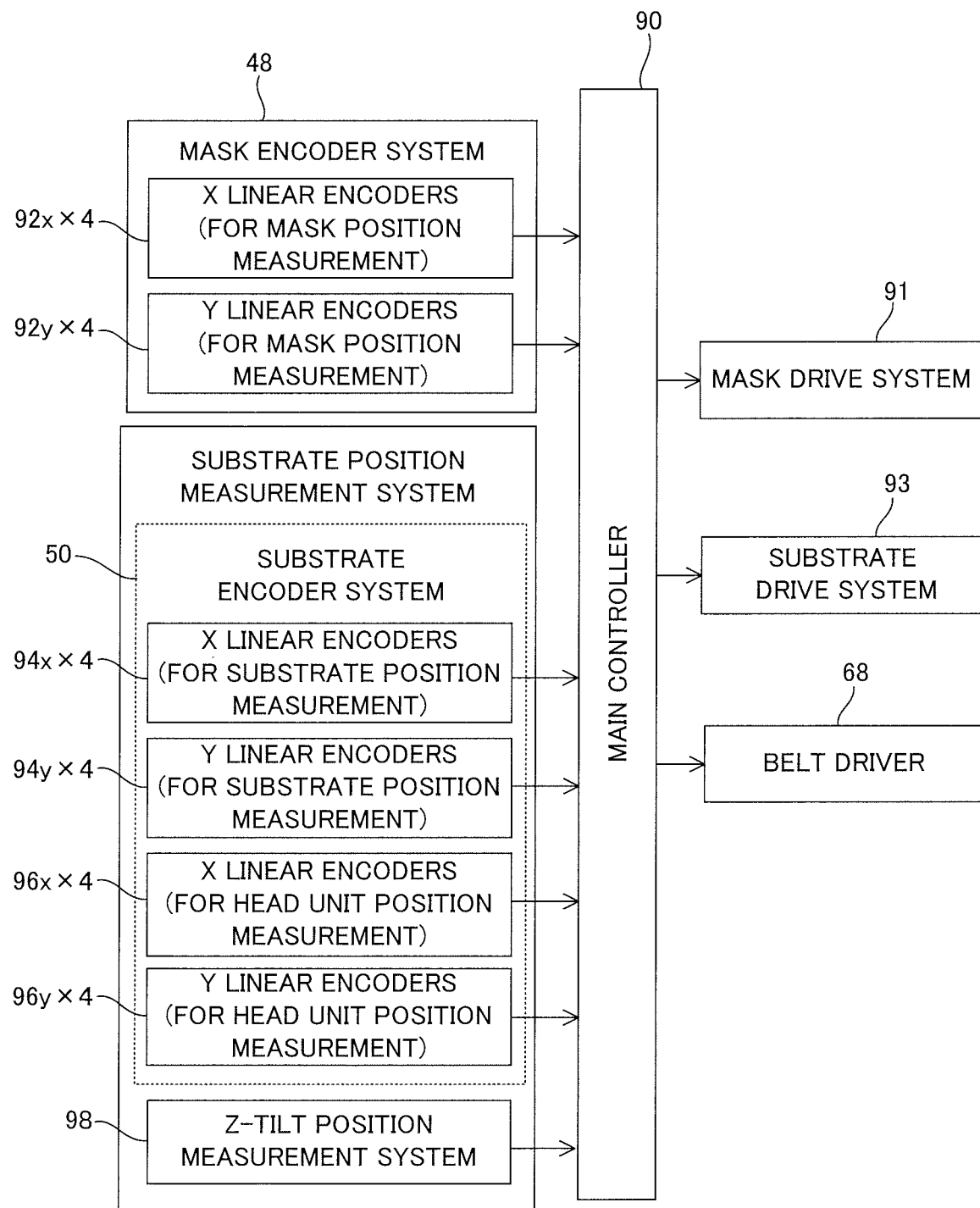
FIG. 8 is a block diagram showing an input/output relation of a main controller that mainly structures the control system of the liquid crystal exposure apparatus.

Also, substrate stage device 20 has a substrate position measurement system to measure position information in directions of six degrees of freedom of fine movement stage 32 (that is, substrate holder 34 and substrate P). The substrate position measurement system, as is shown in FIG. 8, includes a Z-tilt position measurement system 98 to obtain position information of substrate P in the Z-axis, the θx, and the θy directions (hereinafter referred to as a Z-tilt direction) and a substrate encoder system 50 to obtain position information in directions of three degrees of freedom of substrate P within the XY plane. Z-tilt position measurement system 98, as is shown in FIG. 2, is equipped with a plurality of Z sensors 36, with each Z sensor 36 including a probe 36a attached to the lower surface of fine movement stage 32 and a target 36b attached to weight canceling device 28. The plurality of Z sensors 36, e.g. four (at least three), is arranged at a predetermined spacing, for example, around an axis parallel to the Z-axis passing through the center of fine movement stage 32. A main controller 90 (refer to FIG. 8) obtains Z position information and rotation amount information in the θx and θy directions of fine movement stage 32, based on an output of the above plurality of Z sensors 36. The structure of Z-tilt position measurement system 98 including the above z sensors 36 is disclosed in detail in, for example, U.S. Patent Application Publication No. 2010/0018950. The structure of substrate encoder system 50 will be described later on.

Next, a structure of mask encoder system 48 will be described, using FIGS. 3A and 3B. As is shown modeled in FIG. 3A, the plurality of encoder scales 46 (may also be referred to as a grating member, grating section, a grid member or the like, but will be simply referred to hereinafter as scale 46) is arranged in each of an area on the +Y side and the −Y side of mask M (or to be more specific, an opening section not shown to house mask M) of mask holder 40. Note that to facilitate understanding, while the plurality of scales 46 is drawn in solid lines and is illustrated as if the plurality of scales is placed on the upper surface of mask holder 40 in FIG. 3A, the plurality of scales 46 is actually placed on the lower surface side of mask holder 40 so that the Z position of the lower surfaces of each of the plurality of scales 46 coincides with the Z position of the lower surface (pattern surface) of mask M, as is shown in FIG. 1. The plurality of scales 46 each has a grating area (grating section) in which a reflective two-dimensional grating or two reflective one-dimensional gratings with different (e.g. orthogonal) arrangement directions (periodic directions) are formed, and the plurality of scales 46 is provided at the lower surface side of mask holder 40 on both sides of the mounting area (including the opening section described earlier) of mask M in the Y-axis direction so that the grating areas are arranged apart in the X-axis direction. Note that while the grating may be formed to cover the entire area of scales 46 in the X-axis and the Y-axis directions, since it is difficult to form the grating with good precision at the edge of scales 46, in the embodiment, the grating is formed so that the periphery of the grating area in scales 46 is to be a margin part. Therefore, spacing between the grating areas is larger than the spacing between the pair of scales 46 adjacent in the X-axis direction, and the period while an area other than the grating areas is irradiated with the measurement beam is to be a non-measurement period (also called a non-measurement section; however, hereinafter referred to collectively as non-measurement period) in which position measurement cannot be performed.

In mask holder 40 of the embodiment, in the areas on the +Y side and the −Y side of the mounting area of mask M, for example, three scales 46 are arranged in the X-axis direction at a predetermined spacing. That is, mask holder 40 has a total of, for example, six scales 46. Each of the plurality of scales 46 is substantially identical, except for the point that the scales are arranged symmetrically in the vertical direction of the page surface on the +Y side and the −Y side of mask M. Scale 46 consists of a rectangular plate-shaped (strip-shaped) member in a planar view extending in the X-axis direction, made of, for example, quartz glass. Mask holder 40, is formed of, for example, ceramics, and the plurality of scales 46 is fixed to mask holder 40. In the embodiment, instead of the plurality of scales 46 arranged apart in the X-axis direction, one (single) scale may be used as a mask holder scale. In this case, the grating area may also be one, or a plurality of grating areas may be formed on one scale set apart in the X-axis direction.

Figure 3A:
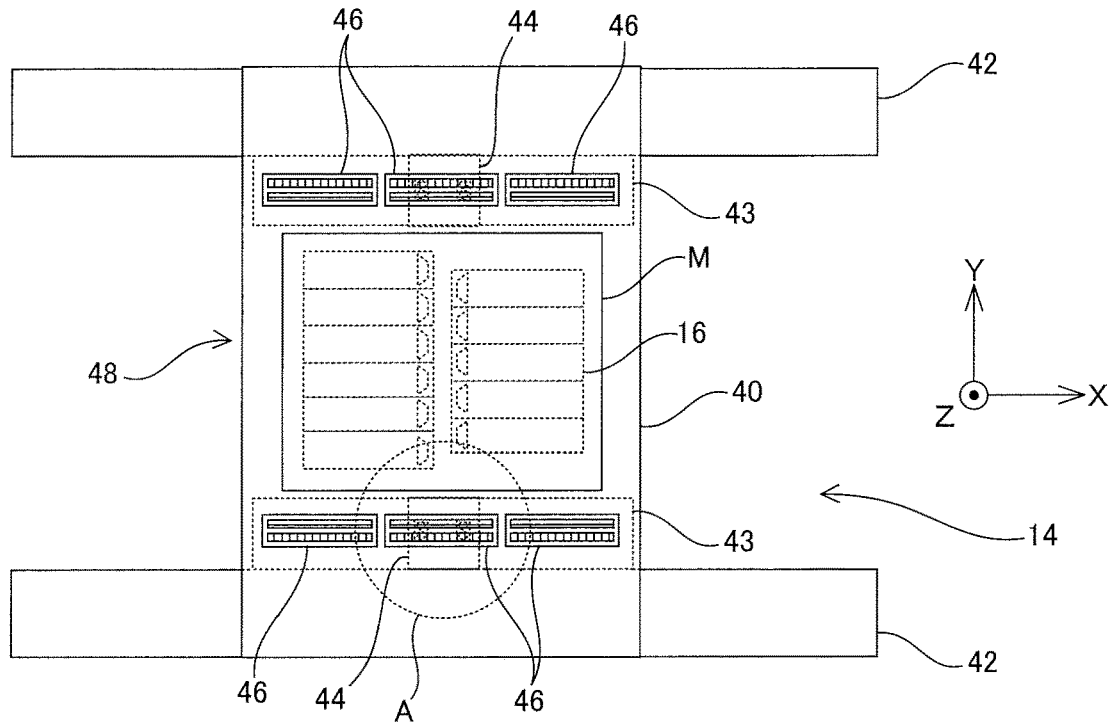
FIG. 3A is a view schematically showing a structure of a mask encoder system.
Figure 3B:
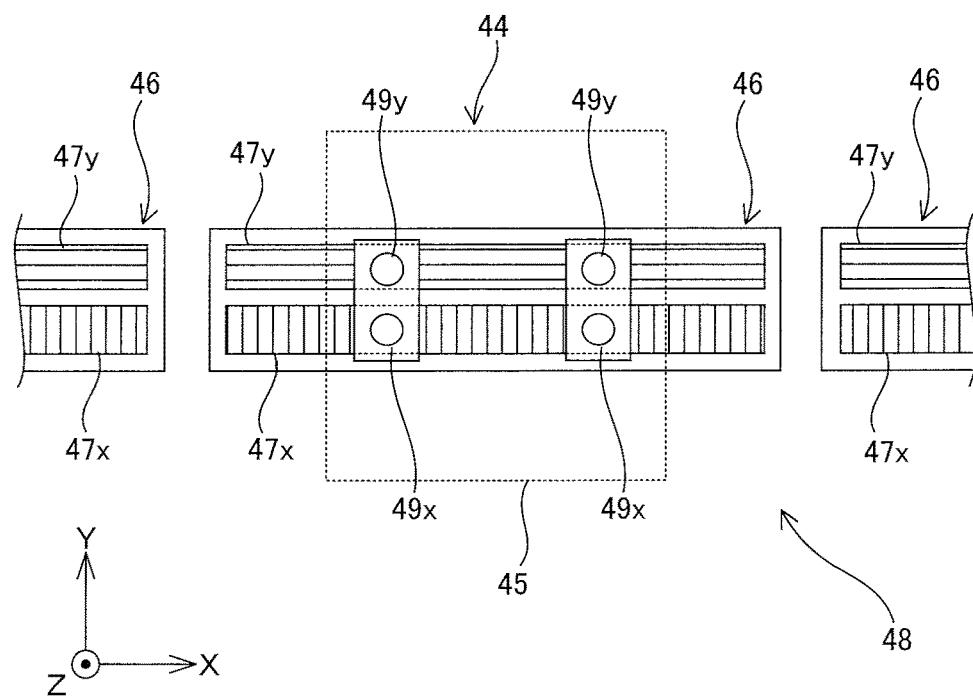
FIG. 3B is an enlarged view of a part of the mask encoder system (part A in FIG. 3A).

As is shown in FIG. 3B, on the lower surface (a surface facing the −Z side in the embodiment) of scale 46 at an area on one side in the width direction (the −Y side in FIG. 3B), an X scale 47x is formed. Also, on the lower surface of scale 46 at an area on the other side in the width direction (the +Y side in FIG. 3B), a Y scale 47y is formed. X scale 47x is structured by a reflective diffraction grating (an X grating) having a plurality of grid lines extending in the Y-axis direction formed at a predetermined pitch in the X-axis direction (the X-axis direction serving as a periodic direction). Similarly, Y scale 47y is structured by a reflective diffraction grating (a Y grating) having a plurality of grid lines extending in the X-axis direction formed at a predetermined pitch in the Y-axis direction (the Y-axis direction serving as a periodic direction). In X scale 47x and Y scale 47y of the embodiment, the plurality of grid lines is formed at a spacing of, for example, 10 nm or less. Note that in FIGS. 3A and 3B, for convenience of illustration, the spacing (pitch) between the grids is shown much wider than the actual spacing. The same applies to other drawings as well.

Also, as is shown in FIG. 1, a pair of encoder bases 43 is fixed on the upper surface of upper mount section 18a. The pair of encoder bases 43 has one encoder base arranged on the −X side of mask guide 42 on the +X side, and the other on the +X side of mask guide 42 on the −X side (that is, in the area between the pair of mask guides 42). Also, a part of projection optical system 16 described above is arranged in between the pair of encoder bases 43. Encoder base 43, as is shown in FIG. 3A, consists of a member extending in the X-axis direction. Encoder head unit 44 (hereinafter simply referred to as head unit 44) is fixed in the center in the longitudinal direction of each of the pair of encoder bases 43. That is, head unit 44 is fixed to apparatus main section 18 (refer to FIG. 1), via encoder base 43. Since the pair of head units 44 is substantially identical, except for the point that the head units are arranged symmetrically in the vertical direction of the page surface on the +Y side and the −Y side of mask M, the description below is on only one of the head units (on the −Y side).

As is shown in FIG. 3B, head unit 44 has a plurality of heads whose position of a measurement beam, irradiated on at least one of the plurality of scales 46 arranged in the X-axis direction, is different in at least one of the X-axis direction and the Y-axis direction, and a unit base 45 consisting of a plate-shaped member having a rectangular shape in a planar view. Fixed to unit base 45 are a pair of X heads 49x arranged separately to each other that irradiates a measurement beam at a spacing larger than the spacing of a pair of X scales 47x adjacent in the X-axis direction (grating area), and a pair of Y heads 49y arranged separately to each other that irradiates a measurement beam at a spacing larger than the spacing of the pair of Y scales 47y adjacent in the X-axis direction (grating area). That is, mask encoder system 48, for example, has a total of four X heads 49x; one pair each on both sides of the mounting area of mask M of mask holder 40 in the Y-axis direction, along with a total of four Y heads 49y; one pair each on both sides of the mounting area of mask M in the Y-axis direction. Note that the pair of X heads 49x or the pair of Y heads 49y does not necessarily have to be arranged separate larger than the spacing of the pair of X scales 49x or the pair of Y scales 49y, and may be arranged at a spacing around the same scale spacing or smaller or may be arranged in contact with each other, as long as a pair of measurement beams is arranged larger than the scale spacing in the X-axis direction. Also, in FIG. 3B, while one of X head 49x and one of Y head 49y are housed together in a housing and the other of X head 49x and the other of Y head 49y are housed together in another housing, the pair of X heads 49x and the pair of Y heads 49y may each be arranged independently. Also, in FIG. 3B, to facilitate understanding, while the pair of X heads 49x and the pair of Y heads 49y are illustrated to be arranged above (the +Z side) scale 46, the pair of X heads 49x is actually arranged below X scale 47y and the pair of Y heads 49y is actually arranged below Y scale 47y (refer to FIG. 1).

The pair of X heads 49x and the pair of Y heads 49y are fixed to unit base 45 so that a position (especially the position in a measurement direction (the X-axis direction)) of at least one of the pair of X heads 49x (measurement beam) or head (measurement beam) spacing, and a position (especially the position in a measurement direction (the Y-axis direction)) of at least one of the pair of Y heads 49y (measurement beam) or head (measurement beam) spacing do not change due to, for example, vibration or the like. Also, unit base 45 itself is also formed of a material whose coefficient of thermal expansion is lower than scale 46 (or is about the same as scale 46), so that the position or spacing of the pair of X heads 49x and the position or spacing of the pair of Y heads 49y do not change due to, for example, temperature change or the like.

X head 49x and Y head 49y are encoder heads of a so-called diffraction interference method as is disclosed in, for example, U.S. Patent Application Publication No. 2008/0094592 that irradiate corresponding scales (X scale 47x, Y scale 47y) with measurement beams, and by receiving the beams from the scales, supply displacement amount information of mask holder 40 (namely mask M, refer to FIG. 3A) to main controller 90 (refer to FIG. 8). That is, in mask encoder system 48, e.g. four X heads 49x and X scale 47x (differs depending on the X position of mask holder 40) facing the X heads 49x structure, e.g. four X linear encoders 92x (not shown in FIG. 3B, refer to FIG. 8) for obtaining position information of mask M in the X-axis direction, and e.g. four Y heads 49y and Y scale 47y (differs depending on the X position of mask holder 40) facing the Y heads 49y structure, e.g. four Y linear encoders 92y (not shown in FIG. 3B, refer to FIG. 8) for obtaining position information of mask M in the Y-axis direction. In the embodiment, while a head is used whose measurement direction is in one of two different directions (coincides with the X-axis direction and the Y-axis direction) within the XY plane, a head may be used whose measurement direction differs from one of the X-axis direction and the Y-axis direction. For example, a head may be used whose measurement direction is in a direction rotated by an angle of 45 degrees with respect to the X-axis direction or the Y-axis direction within the XY plane. Also, instead of a one-dimensional head (an X head or a Y head) whose measurement direction is in one of the two different directions within the XY plane, for example, a two-dimensional head (an XZ head or a YZ head) whose measurement direction is in two directions such as; one of the X-axis direction and the Y-axis direction, and the Z-axis direction, may be used. In this case, it also becomes possible to measure position information of mask holder 40 in directions of three degrees of freedom (including the Z-axis direction, the θx direction, and the θy direction, and θx direction is rolling information, θy direction is pitching information) different from the directions of three degrees of freedom described above (the X-axis direction, the Y-axis direction, and the θz direction).

Main controller 90, as is shown in FIG. 8, obtains position information of mask holder 40 (refer to FIG. 3A) in the X-axis direction and the Y-axis direction, based on an output of, e.g. four X linear encoders 92$x$, and e.g. four Y linear encoders 92$y$, at a resolution of, for example, 10 nm or less. Also, main controller 90 obtains θz position information (rotation amount information) of mask holder 40, for example, based on an output of at least two of the four X linear encoders 92$x$ (or e.g. four Y linear encoders 92$y$). Main controller 90 controls the position in the XY plane of mask holder 40 using mask drive system 91, based on position information in directions of three degrees of freedom within the XY plane of mask holder 40 obtained from measurement values of mask encoder system 48 described above.

Here, as is shown in FIG. 3A, in mask holder 40 as is described above, in each of the areas on the +Y side and the −Y side of mask M, for example, three scales 46 are arranged in the X-axis direction at a predetermined spacing. Also, at least in scanning exposure of substrate P, of the e.g. three scales 46 arranged in the X-axis direction at a predetermined spacing described above, mask holder 40 is moved in the X-axis direction between a position where head unit 44 (all the pair of X heads 49$x$ and the pair of Y heads 49$y$ (each refer to FIG. 3B)) faces scale 46 furthest to the +X side and a position where head unit 44 faces scale 46 furthest to the −X side. Note that in at least one of an exchange operation and a pre-alignment operation of mask M, in the case mask holder 40 is moved away from the illumination area illuminated with illumination light IL in the X-axis direction and at least one head of head unit 44 moves off of scale 46, at least one head arranged away from head unit 44 may be provided in the X-axis direction so that position measurement of mask holder 40 by mask encoder system 48 can be continued even in the exchange operation or the pre-alignment operation.

And, in mask stage device 14 of the embodiment, as is shown in FIG. 3B, the spacing between each of the pair of X heads 49$x$ and the pair of Y heads 49$y$ that one head unit 44 has is set larger than a pair of scales 46 adjacent to each other of the plurality of scales 46. This allows at least one head of the pair of X heads 49$x$ to constantly face X scale 47$x$ and at least one head of the pair of Y heads 49$y$ to constantly face Y scale 47$y$ in mask encoder system 48. Accordingly, mask encoder system 48 can supply position information of mask holder 40 (refer to FIG. 3A) to main controller 90 (refer to FIG. 8) without the position information being cut off.

To describe this specifically, for example, in the case mask holder 40 (refer to FIG. 3A) moves to the +X side, mask encoder system 48 goes through; a first state (the state shown in FIG. 3B) in which the pair of heads 49$x$ both face X scale 47$x$ on the +X side of the adjacent pair of X scales 47$x$, a second state in which X head 49$x$ on the −X side faces an area between the above adjacent pair of X scales 47$x$ (facing neither of the X scales 47$x$) and X head 49$x$ on the +X side faces X scale 47$x$ on the +X side, a third state in which X head 49$x$ on the −X side faces X scale 47$x$ on the −X side and X head 49$x$ on the +X side faces X scale 47$x$ on the +X side, a fourth state in which X head 49$x$ on the −X side faces X scale 47$x$ on the −X side and X head 49$x$ on the +X side faces an area between a pair of X scales 47$x$ (facing neither of the X scales 47$x$), and a fifth state in which the pair of heads 49$x$ both face X scale 47$x$ on the −X side, in the order described above. Accordingly, at least one of the X heads 49$x$ constantly faces X scale 47$x$.

Main controller 90 (refer to FIG. 8), in the first state, the third state, and the fifth state described above, obtains X position information of mask holder 40, based on an average value of the output of the pair of X heads 49$x$. Also, main controller 90, in the second state described above, obtains X position information of mask holder 40, based on only the output of X head 49$x$ on the +X side, and in the fourth state described above, obtains X position information of mask holder 40, based on only the output of X head 49 on the −X side. Accordingly, measurement values of mask encoder system 48 are not cut off. Note that the X position information may also be obtained using the output of only one of the pair of X heads 49$x$ also in the first state, the third state, and the fifth state. However, in the second state and the fourth state, in both the pair of head units 44 one of the pair of X heads 49$x$ and one of the Y heads 49$y$ move off of scale 46 so that position information in the θz direction (rotation information) of mask holder 40 can no longer be acquired. Therefore, it is preferable to arrange the three scales 46 arranged on the +Y side and the three scales 46 arranged on the −Y side with respect to the mounting area of mask M shifted from one another so that the spacing between adjacent pair of scales 46 do not overlap in the X-axis direction, and that even when X head 49$x$ and Y head 49$y$ move off of scale 46 in one of the three scales 46 arranged on the +Y side and the three scales 46 arranged on the −Y side, X head 49$x$ and Y head 49$y$ do not move off in the other of the scales 46. Or, the pair of head units 44 may be arranged shifted in the X-axis direction only by a distance larger than the spacing of an adjacent pair of scales 46 (width in a non-grating area). This avoids the non-measurement period when measurement beams move off (cannot measure) the grating area of scale 46 in the X-axis direction from overlapping in a total of four heads; the pair of X heads 49$x$ arranged on the +Y side and the pair of X heads 49$x$ arranged on the −Y side, and makes it possible to constantly measure position information in the θz direction of mask holder 40 at least during scanning exposure. Note that in at least one of the pair of head units 44, at least one head may be arranged which is arranged apart in the X-axis direction with respect to at least one of the pair of X heads 49$x$ and the pair of Y heads 49$y$, so that two heads face scale 46 in at least one of X head 49$x$ and Y head 49$y$, also in the second state and in the fourth state.

Next, the structure of substrate encoder system 50 will be described. Substrate encoder system 50, as is shown in FIG. 1, is equipped with a plurality of encoder scales 52 (overlapping in the depth of the page surface in FIG. 1, refer to FIG. 4A) arranged at substrate stage device 20, an encoder base 54 fixed to the lower surface of upper mount section 18$a$, a plurality of encoder scales 56 fixed to the lower surface of encoder base 54, and a pair of encoder head units 60.

As is shown modeled in FIG. 4A, in substrate stage device 20 of the embodiment, in an area on the +Y side and on the −Y side of substrate P (substrate mounting area), for example, five encoder scales 52 (hereinafter simply referred to as scales 52) are arranged at a predetermined spacing in the X-axis direction. That is, substrate stage device 20 has a total of, for example, 10 scales 52. Each of the plurality of scales 52 is substantially identical, except for the point that the scales are arranged symmetrically in the vertical direction of the page surface on the +Y side and the −Y side of substrate P. Scale 52, similarly to scale 46 (each refer to FIG. 3A) of mask encoder system 48 described above, consists of a rectangular plate-shaped (strip-shaped) member in a planar view extending in the X-axis direction, made of, for example, quartz glass. Also, the plurality of scales 52 each has a grating area (grating section) in which a reflective two-dimensional grating or two reflective one-dimensional gratings with different (e.g. orthogonal) arrangement directions (periodic directions) are formed, and five scales 52 are provided on both sides of the substrate mounting area in the Y-axis direction so that the grating areas are arranged apart in the X-axis direction.

Figure 4B:
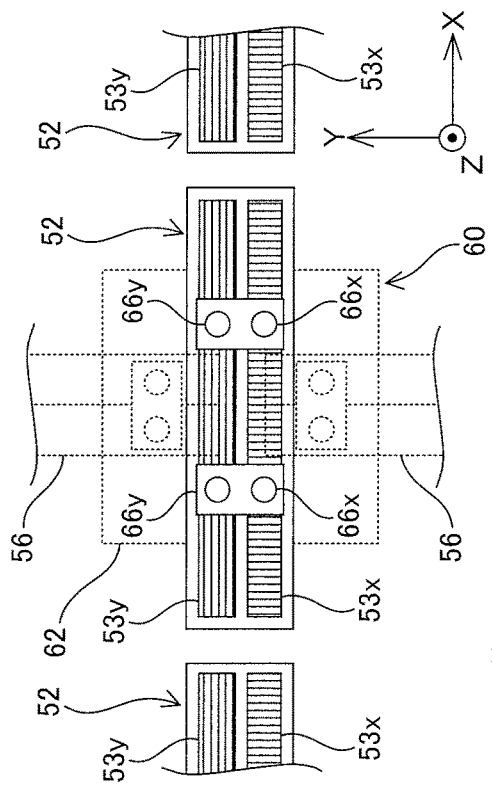
FIGS. 4B and 4C are enlarged views of a part of the substrate encoder system (B in FIG. 4A).
Figure 4C:
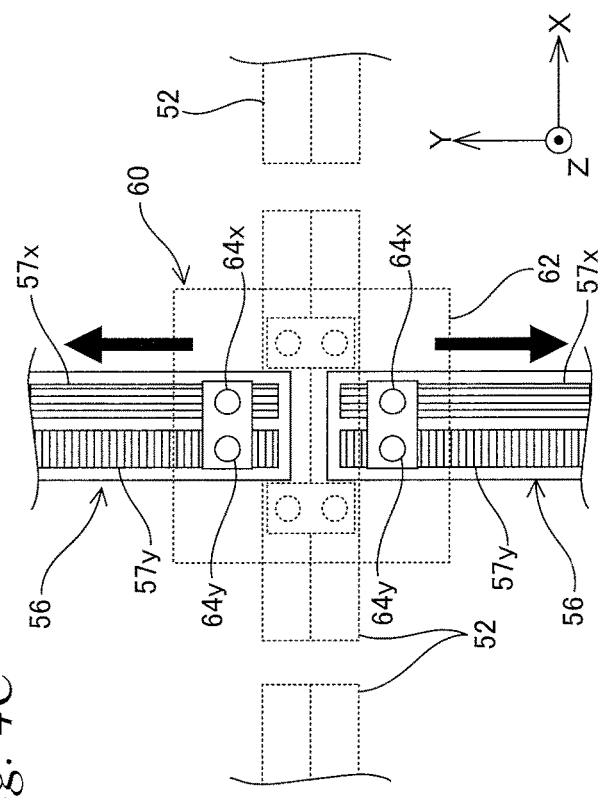
Figure 4A:
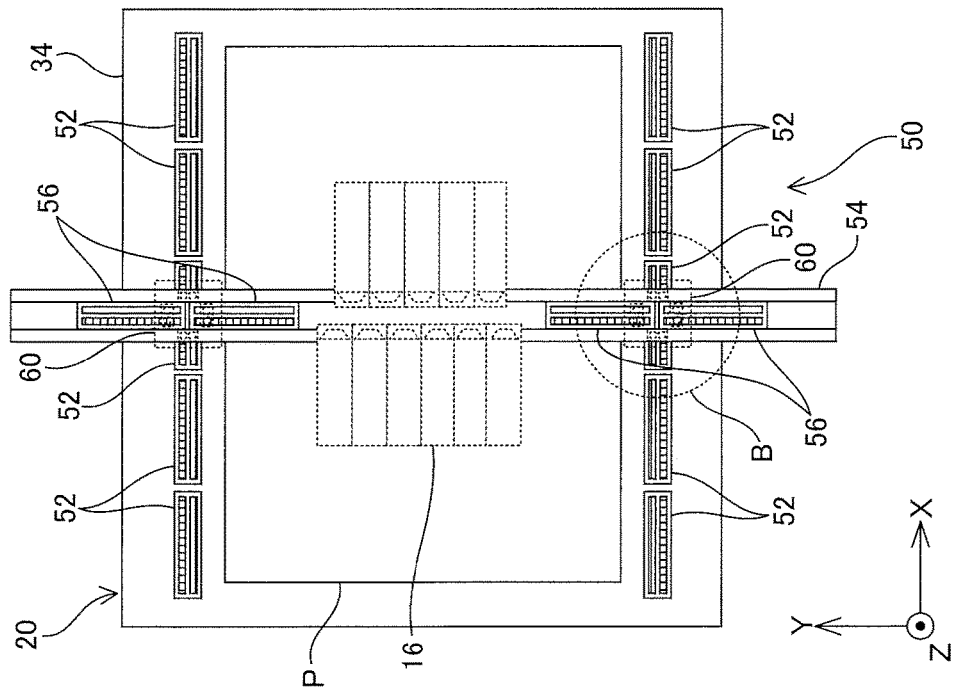
FIG. 4A is a view schematically showing a structure of a substrate encoder system.

Note that in FIGS. 1 and 4A, to facilitate understanding, while the plurality of scales 52 is illustrated as if the plurality of scales is fixed to the upper surface of substrate holder 34, the plurality of scales 52 as is shown in FIG. 2 is actually fixed (note that in FIG. 2, a case is illustrated in which the plurality of scales 52 is arranged on the +X side and the −X side of substrate P) to fine movement stage 32 via scale base 51 in a state set apart from substrate holder 34. However, depending on the case, the plurality of scales 52 may actually be fixed to substrate holder 34. In the description below, the plurality of scales 52 will be described as being arranged on substrate holder 34. Note that the plurality of scales 52 may be arranged on an upper surface of a substrate table that has substrate holder 34 and can be finely drive in at least the Z-axis direction, the θx direction, and the θy direction, or on an upper surface of a substrate stage that supports the substrate table in a finely movable manner.

As is shown in FIG. 4B, in an area on one side of the width direction (−Y side in FIG. 4B) on the upper surface of scale 52, an X scale 53x is formed. Also, in an area on the other side of the width direction (+Y side in FIG. 4B) on the upper surface of scale 52, a Y scale 53y is formed. Since the structure of X scale 53x and Y scale 53y is similar to X scale 47x and Y scale 47y (each refer to FIG. 3B) formed on scale 46 (each refer to FIG. 3A) of mask encoder system 48 described above, the description thereabout will be omitted.

Figure 5:
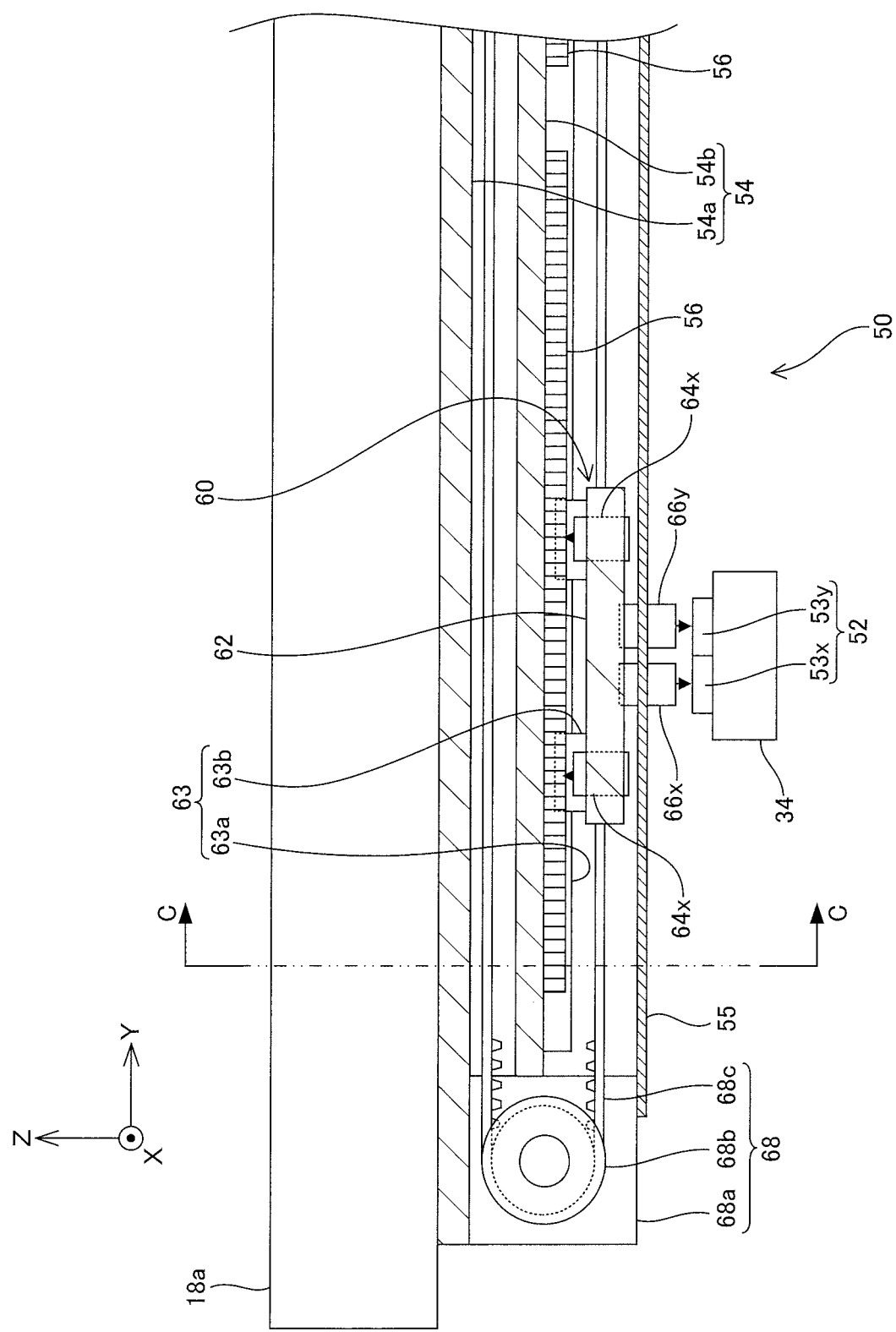
FIG. 5 is a side view of a head unit that the substrate encoder system has.
Figure 6:
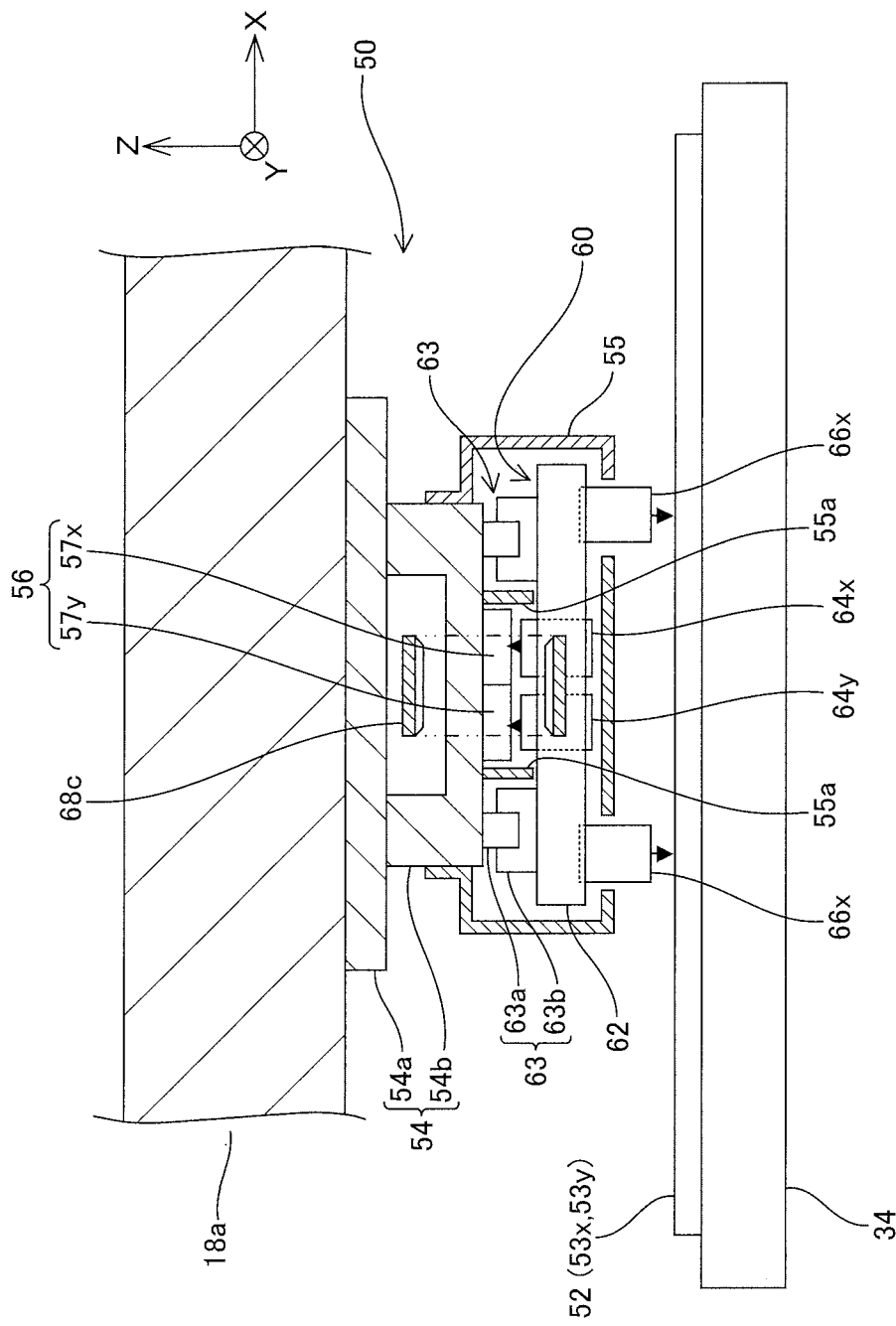
FIG. 6 is a cross sectional view of line C-C in FIG. 5.

Encoder base 54, as it can be seen from FIGS. 5 and 6, is equipped with a first part 54a consisting of a plate-shaped member extending in the Y-axis direction fixed to the lower surface of upper mount section 18a, and a second part 54b consisting of a member having a U-shaped XZ cross sectional surface extending in the Y-axis direction fixed to the lower surface of the first part 54a, and is formed in a cylindrical shape extending in the Y-axis direction as a whole. As is shown in FIG. 4A, while the X position of encoder base 54 substantially coincides with the X position of the center of projection optical system 16, encoder base 54 and projection optical system 16 are arranged so as not to be in contact with each other. Note that encoder base 54 may be arranged separately from projection optical system 16, on the +Y side and the −Y side. To the lower surface of encoder base 54, a pair of Y linear guides 63a is fixed, as is shown in FIG. 6. The pair of Y linear guides 63a each consists of a member extending in the Y-axis direction, and is arranged parallel to each other in the X-axis direction at a predetermined spacing.

To the lower surface of encoder base 54, the plurality of encoder scales 56 (hereinafter simply referred to as scale 56) is fixed. In the embodiment, as is shown in FIG. 1, scales 56 are arranged each spaced apart in the Y-axis direction; e.g. two in an area further to the +Y side of projection optical system 16, and e.g. two in an area further to the −Y side of projection optical system 16. That is, to encoder base 54, a total of, e.g. four scales 56 are fixed. The plurality of scales 56 is each substantially identical. Scale 56 consists of a rectangular plate-shaped (strip-shaped) member in a planar view extending in the Y-axis direction, and is made of, for example, quartz glass, similarly to scale 52 arranged at substrate stage device 20. The plurality of scales 56 each has a grating area (grating section) in which a reflective two-dimensional grating or two reflective one-dimensional gratings with different (e.g. orthogonal) arrangement directions (periodic directions) are formed, and in the embodiment, similarly to scales 46 and scales 52, two scales 56, each having an X scale with a one-dimensional grating whose arrangement direction (periodic direction) is in the X-axis direction and a Y scale with a one-dimensional grating whose arrangement direction (periodic direction) is in the Y-axis direction, are provided on both sides of projection optical system 16 in the Y-axis direction so that the grating areas are arranged apart in the Y-axis direction. Note that to facilitate understanding, while the plurality of scales 56 is drawn in solid lines and is illustrated as if the plurality of scales is placed on the upper surface of encoder base 54 in FIG. 4A, the plurality of scales 56 is actually placed on the lower surface side of encoder base 54, as is shown in FIG. 1. Note that while two scales 56 are provided on each of the +Y side and the −Y side of projection optical system 16 in the embodiment, the number of scales 56 provided may be not two, but one or three, or more than three. Also, while scales 56 are provided so that the grating surface faces downward (the grating area becomes parallel to the XY plane) in the embodiment, for example, scales 56 may be provided so that the grating area becomes parallel to the YZ plane.

As is shown in FIG. 4C, in an area on one side of the width direction (+X side in FIG. 4C) on the lower surface of scale 56, an X scale 57x is formed. Also, at the lower surface of scale 56 at an area on the other side in the width direction (the −X side in FIG. 4C), a Y scale 57y is formed. Since the structure of X scale 57x and Y scale 57y is similar to X scale 47x and Y scale 47y (each refer to FIG. 3B) formed on scale 46 (each refer to FIG. 3A) of mask encoder system 48 described above, the description thereabout will be omitted.

Referring back to FIG. 1, the pair of encoder head units 60 (hereinafter simply referred to as a head unit 60) is arranged below encoder base 54 spaced apart in the Y-axis direction. Since the pair of head units 60 is each substantially identical, except for the point that the head units are arranged symmetrically in the horizontal direction of the page surface in FIG. 1, the description below is on only one of the head units (on the −Y side). Head unit 60, as is shown in FIG. 5, is equipped with a Y slide table 62, a pair of X heads 64x, a pair of Y heads 64y (not shown in FIG. 5 because of being hidden behind the pair of X heads 64x in the depth of the page surface, refer to FIG. 4C), a pair of X heads 66x (one of the X heads 66x not shown in FIG. 5, refer to FIG. 4B), a pair of Y heads 66y (one of the Y heads 66y not shown in FIG. 5, refer to FIG. 4B), and a belt driver 68 that moves Y slide table 62 in the Y-axis direction. Note that the pair of head units 60 in the embodiment has the same structure as the pair of head units 44 of mask encoder system 48, except for the point that the pair of head units 60 is rotated by an angle of 90 degrees.

Y slide table 62 consists of a rectangular plate-shaped member in a planar view, and is arranged below encoder base 54 via a predetermined clearance with respect to encoder base 54. Also, the Z position of Y slide table 62 is to be set further to the +Z side than substrate holder 34, regardless of the Z-tilt position of substrate holder 34 that substrate stage device 20 has (each refer to FIG. 1).

To the upper surface of Y slide table 62, as is shown in FIG. 6, a plurality of Y slide members 63b is fixed that engages freely slidable in the Y-axis direction with respect to Y linear guides 63a described above (e.g. two (refer to FIG. 5) with respect to one Y linear guide 63a), via a rolling body (e.g. a plurality of balls) (not shown). Y linear guide 63a and Y slide member 63b corresponding to Y linear guide 63a structure a mechanical Y linear guide device 63 as is disclosed in, for example, U.S. Pat. No. 6,761,482, and Y slide table 62 is straightly guided in the Y-axis direction with respect to encoder base 54 via the pair of Y linear guide devices 63.

Belt driver 68, as is shown in FIG. 5, is equipped with a rotary driver 68a, a pulley 68b, and a belt 68c. Note that belt driver 68 may be arranged independently for driving Y slide table 62 on the −Y side and for driving Y slide table 62 on the +Y side (not shown in FIG. 5, refer to FIG. 4A), or the pair of Y slide table 62 may be moved integrally by one belt driver 68.

Rotary driver 68a is fixed to encoder base 54, and is equipped with a rotary motor (not shown). The number of rotation and the rotation direction of the rotary motor are controlled by main controller 90 (refer to FIG. 8). Pulley 68b is rotationally moved around an axis parallel to the X-axis by rotary driver 68a. Also, although it is not shown, belt driver 68 has another pulley attached to encoder base 54, arranged separate in the Y-axis direction with respect to pulley 68b described above, in a state freely rotatable around the axis parallel to the X-axis. Belt 68c has one end and the other end connected to Y slide table 62, and two places in the middle part of the longitudinal direction are wound around pulley 68b and the another pulley (not shown) described above in a state where a predetermined tension is applied. A part of belt 68c is inserted into encoder base 54, and for example, dust from belt 68c is kept from adhering on scales 52 and 56. Y slide table 62 moves back and forth in predetermined strokes in the Y-axis direction by being pulled by belt 68c, by pulley 68b being rotationally moved.

Main controller 90 (refer to FIG. 8) synchronously moves one of the head units 60 (on the +Y side) below, e.g. two scales 56 arranged further to the +Y side than projection optical system 16 and the other of the head units 60 (on the −Y side) below, e.g. two scales 56 arranged further to the −Y side of projection optical system 16 in predetermined strokes in the Y-axis direction, as appropriate. Here, while the pair of head units 60 can each be moved synchronously with the movement of substrate stage device 20 in the Y-axis direction, in the embodiment, the pair of head units 60 is to be moved so that with each of the pair of head units 60, measurement beams of the pair of X heads 66x and the pair of Y heads 66y all do not move off of the grating area of scale 52 (irradiation of a grating area with at least one measurement beam is maintained) in the Y-axis direction. Note that in the embodiment, while belt driver 68 including pulley 68b with teeth and belt 68c with teeth is used as the actuator for moving Y slide table 62, the embodiment is not limited to this, and a friction wheel device including a pulley and a belt without teeth may also be used. Also, the flexible member pulling Y slide table 62 is not limited to a belt, and may also be a rope, a wire, or a chain. Also, the type of actuator moving Y slide table 62 is not limited to belt driver 68, and may also be other drivers such as a linear motor, or a feed screw device.

X head 64x, Y head 64y (not shown in FIG. 5, refer to FIG. 6), X head 66x, and Y head 66y are each an encoder head of a so-called diffraction interference method similar to X head 49x and Y head 49y that mask encoder system 48 described above has, and are fixed to Y slide table 62. Here, in head unit 60, the pair of Y heads 64y, the pair of X heads 64x, the pair of Y heads 66y and the pair of X heads 66x are fixed to Y slide table 62 so that the distance between each of the heads do not change due to, for example, vibration or the like. Also, Y slide table 62 itself is formed of a material whose coefficient of thermal expansion is lower than scales 52 and 56 (or is about the same as scales 52 and 56), so that the distance between each of the pair of Y heads 64y, the pair of X heads 64x, the pair of Y heads 66y and the pair of X heads 66x do not change due to, for example, temperature change or the like.

Figure 7:
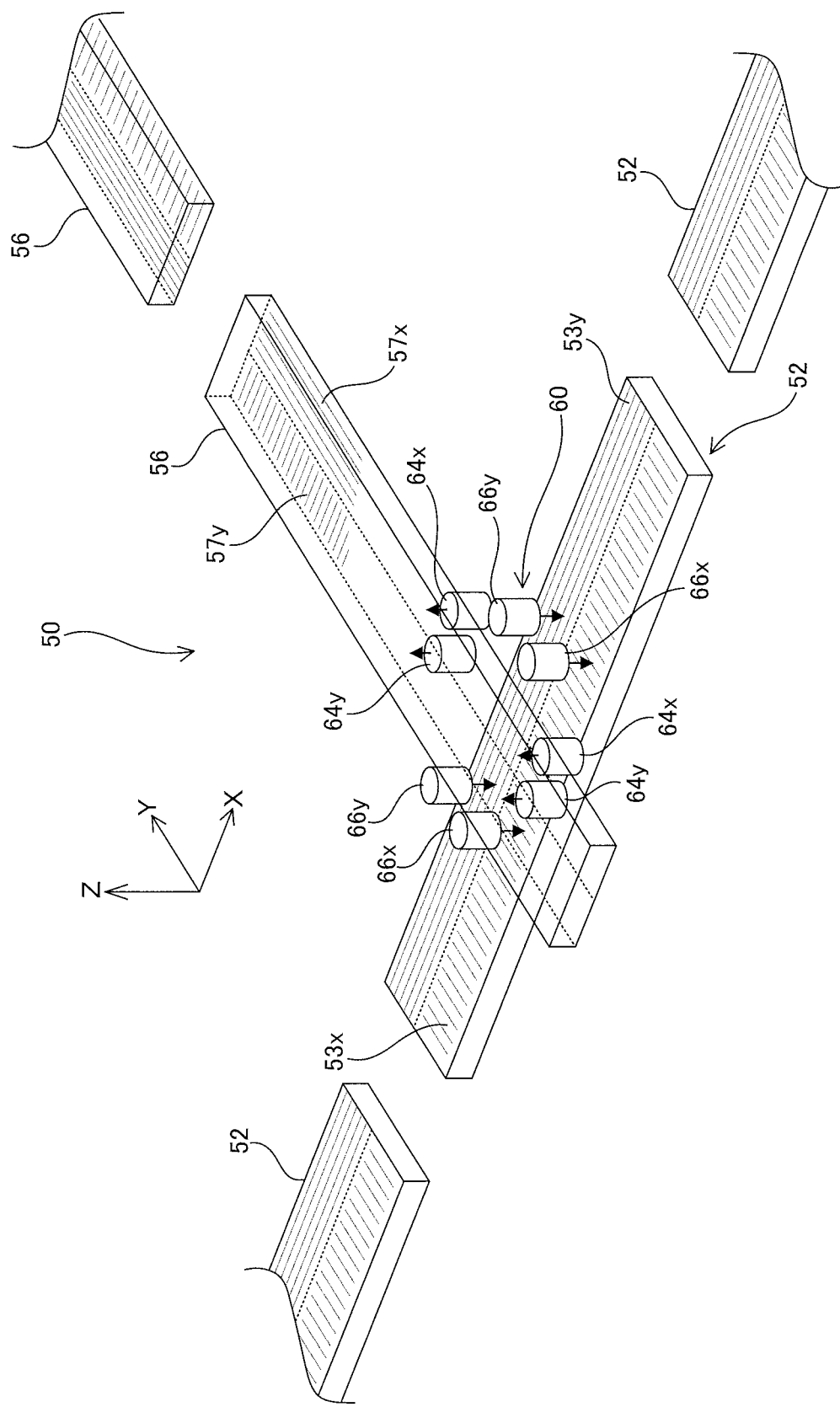
FIG. 7 is a schematic view of the substrate encoder system.

As is shown in FIG. 7, the pair of X heads 64x each irradiate two places (two points) separate in the Y-axis direction on X scale 57x with a measurement beam, and the pair of Y heads 64y each irradiate two places (two points) separate in the Y-axis direction on Y scale 57y with a measurement beam. Substrate encoder system 50, by receiving the beams from the scales to which X heads 64x and Y heads 64y described above correspond, supplies displacement amount information of Y slide table 62 (not shown in FIG. 7, refer to FIGS. 5 and 6) to main controller 90 (refer to FIG. 8). That is, in substrate encoder system 50, e.g. four X heads 64x and X scale 57x (differs depending on the Y position of Y slide table 62) facing the X heads 64x structure, e.g. four X linear encoders 96x (not shown in FIG. 7, refer to FIG. 8) for obtaining position information of each of the pair of Y slide tables 62 (that is, the pair of head units 60 (refer to FIG. 1)) in the Y-axis direction, and e.g. four Y heads 64y and Y scale 57y (differs depending on the Y position of Y slide table 62) facing the Y heads 64y structure, e.g. four Y linear encoders 96y (not shown in FIG. 7, refer to FIG. 8) for obtaining position information of each of the pair of Y slide tables 62 in the Y-axis direction.

Main controller 90, as is shown in FIG. 8, obtains position information of the pair of head units 60 (refer to FIG. 1) in the X-axis direction and the Y-axis direction, based on an output of, e.g. four X linear encoders 96x, and e.g. four Y linear encoders 96y, at a resolution of, for example, 10 nm or less. Also, main controller 90 obtains θz position information (rotation amount information) of one of the head units 60, based on an output of, for example, two X linear encoders 96x (or for example, two Y linear encoders 96y) corresponding to the one head unit 60, and obtains θz position information (rotation amount information) of the other of the head units 60, based on an output of, for example, two X linear encoders 96x (or for example, two Y linear encoders 96y) corresponding to the other of the head units 60, respectively. Main controller 90, based on position information of each of the pair of head units 60 in the XY plane, controls the position in the Y-axis direction of head unit 60, using belt driver 68.

Here, as is shown in FIG. 4A, in encoder base 54, scale 56, as is described above, in each of the areas on the +Y side and the −Y side of projection optical system 16, for example, two scales 56 are arranged in the Y-axis direction at a predetermined spacing. Also, of the e.g. two scales 56 arranged in the Y-axis direction at a predetermined spacing described above, Y slide table 62 is moved in the Y-axis direction in between a position where head unit 60 (all the pair of X heads 64x and the pair of Y heads 64y (each refer to FIG. 4C)) faces scale 56 on the +Y side and a position where head unit 60 faces scale 56 on the −Y side.

And, similarly to mask encoder system 48 described above, also in substrate encoder system 50, as is shown in FIG. 4C, the spacing between each of the pair of X heads 64x and the pair of Y heads 64y that one head unit 60 has is set larger than scales 56 adjacent to each other. This allows at least one head of the pair of X heads 64x to constantly face X scale 57x and at least one head of the pair of Y heads 64y to constantly face Y scale 57y in substrate encoder system

50. Accordingly, substrate encoder system 50 can obtain position information of Y slide table 62 (head unit 60) without the measurement values being cut off.

Also, as is shown in FIG. 7, the pair of X heads 66x each irradiates two places (two points) separate in the X-axis direction on X scale 53x with a measurement beam, and the pair of Y heads 66y each irradiates two places (two points) separate in the X-axis direction on Y scale 53y with a measurement beam. Substrate encoder system 50, by receiving the beams from the scales to which X heads 66x and Y heads 66y described above correspond, supplies displacement amount information of substrate holder 34 (not shown in FIG. 7, refer to FIG. 2) to main controller 90 (refer to FIG. 8). That is, in substrate encoder system 50, e.g. four X heads 66x and X scale 53x (differs depending on the X position of substrate holder 34) facing the X heads 66x structure, e.g. four X linear encoders 94x (not shown in FIG. 7, refer to FIG. 8) for obtaining position information of substrate P in the X-axis direction, and e.g. four Y heads 66y and Y scale 53y (differs depending on the X position of substrate holder 34) facing the Y heads 66y structure, e.g. four Y linear encoders 94y (not shown in FIG. 7, refer to FIG. 8) for obtaining position information of substrate P in the Y-axis direction.

Main controller 90, as is shown in FIG. 8, obtains position information of substrate holder 34 (refer to FIG. 2) in the X-axis direction and the Y-axis direction, based on an output of, e.g. four X linear encoders 94x, and e.g. four Y linear encoders 94y, and an output of, e.g. four X linear encoders 96x, and e.g. four Y linear encoders 96y described above (that is, position information of each of the pair of head units 60 in the XY plane), at a resolution of, for example, 10 nm or less. Also, main controller 90 obtains θz position information (rotation amount information) of substrate holder 34, for example, based on an output of at least two of the four X linear encoders 94x (or e.g. four Y linear encoders 94y). Main controller 90 controls the position in the XY plane of substrate holder 34 using substrate drive system 93, based on position information in the XY plane obtained from measurement values of substrate encoder system 50 described above.

Also, as is shown in FIG. 4A, in substrate holder 34, as is described above, in each of the areas on the +Y side and the −Y side of substrate P, for example, five scales 52 are arranged in the X-axis direction at a predetermined spacing. Also, of the e.g. five scales 52 arranged in the X-axis direction at a predetermined spacing described above, substrate holder 34 is moved in the X-axis direction between a position where head unit 60 (all the pair of X heads 66x and the pair of Y heads 66y (each refer to FIG. 4B)) faces scale 52 furthest to the +X side and a position where head unit 60 faces scale 52 furthest to the −X side.

And, similarly to mask encoder system 48 described above, as is shown in FIG. 4B, the spacing between each of the pair of X heads 66x and the pair of Y heads 66y that one head unit 60 has is set larger than scales 52 adjacent to each other. This allows at least one head of the pair of X heads 66x to constantly face X scale 53x and at least one head of the pair of Y heads 66y to constantly face Y scale 53y in substrate encoder system 50. Accordingly, substrate encoder system 50 can obtain position information of substrate holder 34 (refer to FIG. 4A) without the measurement values being cut off.

Note that as for the pair of Y heads 64y, the pair of X heads 64x, the pair of Y heads 66y, and the pair of X heads 66x that the pair of head units 60 of substrate encoder system 50 each has and scales 56 and 52 irradiated with the measurement beam from these heads, the structure explained in the whole description (including the explanatory notes) regarding the heads and the scales that structure mask encoder system 48 described earlier can be similarly applied.

Referring back to FIG. 6, a dust cover 55 consists of a member extending in the Y-axis direction that has a U shape formed in the XZ section, and between a pair of opposing surfaces, the second part 54b of encoder base 54 and Y slide table 62 described above are inserted via a predetermined clearance. In the lower surface of dust cover 55, an opening section is formed through which X head 66x and Y head 66y can pass. This keeps dust generated from Y linear guide device 63, belt 68c and the like from adhering on scale 52. Also, to the lower surface of encoder base 54, a pair of dust-proof plates 55a (not shown in FIG. 5) is fixed. Scale 56 is arranged in between the pair of dust-proof plates 55a, which keeps dust generated from Y linear guide device 63 and the like from adhering on scale 56.

FIG. 8 shows a block diagram of an input/output relation of main controller 90 that mainly structures the control system of liquid crystal exposure apparatus 10 (refer to FIG. 1) having overall control over each section. Main controller 90 includes a workstation (or a microcomputer) and the like, and has overall control over each section that structures liquid crystal exposure apparatus 10.

In liquid crystal exposure apparatus 10 (refer to FIG. 1) structured in the manner described above, substrate P is loaded onto substrate stage device 20 (substrate holder 34) by a substrate loader (not shown), along with mask M being loaded onto mask stage device 14 by a mask loader (not shown), under the control of main controller 90 (refer to FIG. 8). Then, main controller 90 executes alignment measurement (detection of a plurality of alignment marks on substrate P) using an alignment detection system (not shown), and after the alignment measurement has been completed, exposure operation by the step-and-scan method is performed sequentially on the plurality of shot areas set on substrate P. Note that position information of substrate holder 34 is measured by substrate encoder system 50 also in the alignment measurement operation.

Next, an example of an operation of mask stage device 14 and substrate stage device 20 during the exposure operation will be described, using FIGS. 9A to 16B. Note that in the description below, while the case of setting four shot areas on one substrate P (a so-called four-piece setting) is to be described, the number and arrangement of shot areas set on one substrate P can be appropriately changed.

Figure 9A:
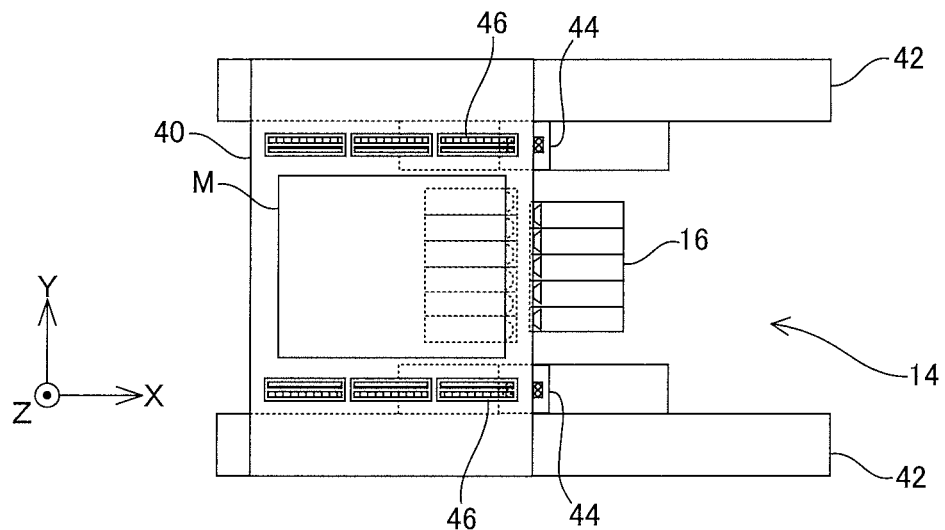
FIG. 9A is a view (No. 1) showing an operation of the mask encoder system at the time of exposure operation.
Figure 9B:
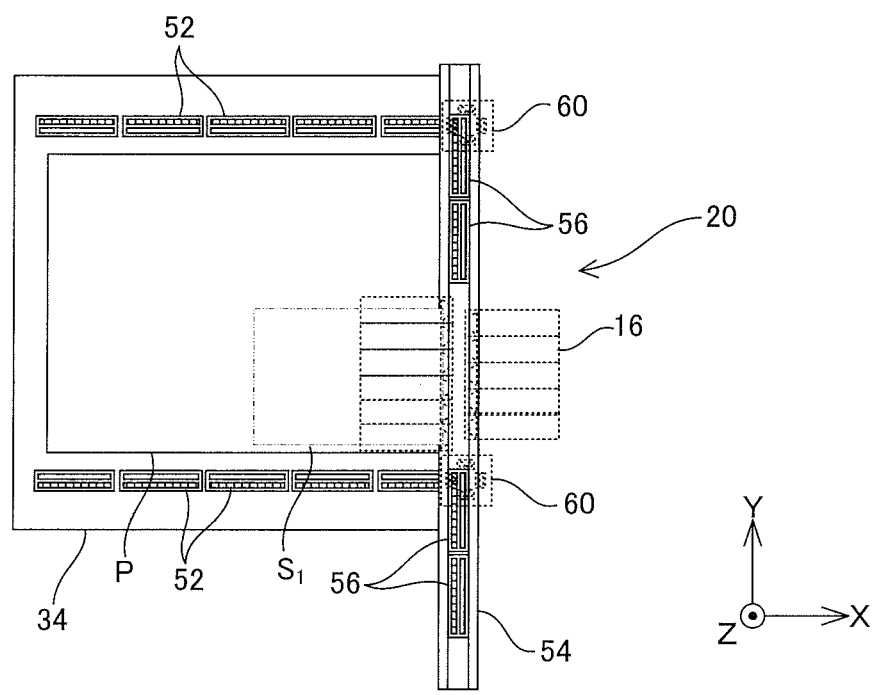
FIG. 9B is a view (No. 1) showing an operation of the substrate encoder system at the time of exposure operation.

FIG. 9A shows mask stage device 14 after completing the alignment operation, and FIG. 9B shows substrate stage device 20 after completing the alignment operation (however, members other than substrate holder 34 is not shown, the same hereinafter). The exposure processing, as an example, is performed from a first shot area $S_1$ set on the −Y side and also on the +X side of substrate P, as is shown in FIG. 9B. With mask stage device 14, as is shown in FIG. 9A, mask M is positioned based on the output of mask encoder system 48 (refer to FIG. 8), so that the edge on the +X side of mask M is positioned slightly to the −X side than an illumination area (however, in the state shown in FIG. 9A, mask M is not yet irradiated with illumination light IL) irradiated with illumination light IL (each refer to FIG. 1) from illumination system 12. Specifically, for example, scale 46 is provided so that the edge on the +X side of the pattern area of mask M is arranged to be positioned to the −X side only by an entrance length (that is, an acceleration distance required to reach a predetermined speed) required to perform scanning exposure at a predetermined speed with respect to the illumination area, and that the position of mask M can be measured by mask encoder system 48 at this position. Also, in substrate stage device 20, as is shown in FIG. 9B, substrate P is positioned based on the output of substrate encoder system 50 (refer to FIG. 8), so that the edge on the +X side of the first shot area S1 is positioned slightly to the −X side than an exposure area (however, in the state shown in FIG. 9B, substrate P is not yet irradiated with illumination light IL) irradiated with illumination light IL (refer to FIG. 1) from projection optical system 16. Specifically, for example, scale 52 is provided so that the edge on the +X side of the first shot area S1 of substrate P is arranged to be positioned to the −X side only by an entrance length (that is, an acceleration distance required to reach a predetermined speed) required to perform scanning exposure at a predetermined speed with respect to the exposure area, and that the position of substrate P can be measured by substrate encoder system 50 at this position. Note that also when mask M and substrate P are each decelerated having completed the scanning exposure of the shot area, scales 46 and 52 are provided similarly so that the position of mask M and substrate P can be measured by mask encoder system 48 and substrate encoder system 50, respectively, until mask M and substrate P are moved further only by a deceleration distance required to decelerate the speed from the speed at the time of scanning exposure to a predetermined speed. Note that also when mask M and substrate P are each decelerated having completed the scanning exposure of the shot area, scales 46 and 52 are provided similarly so that the position of mask M and substrate P can be measured by mask encoder system 48 and substrate encoder system 50, respectively, until mask M and substrate P are moved further only by a deceleration distance required to decelerate the speed from the speed at the time of scanning exposure to a predetermined speed.

Figure 10A:
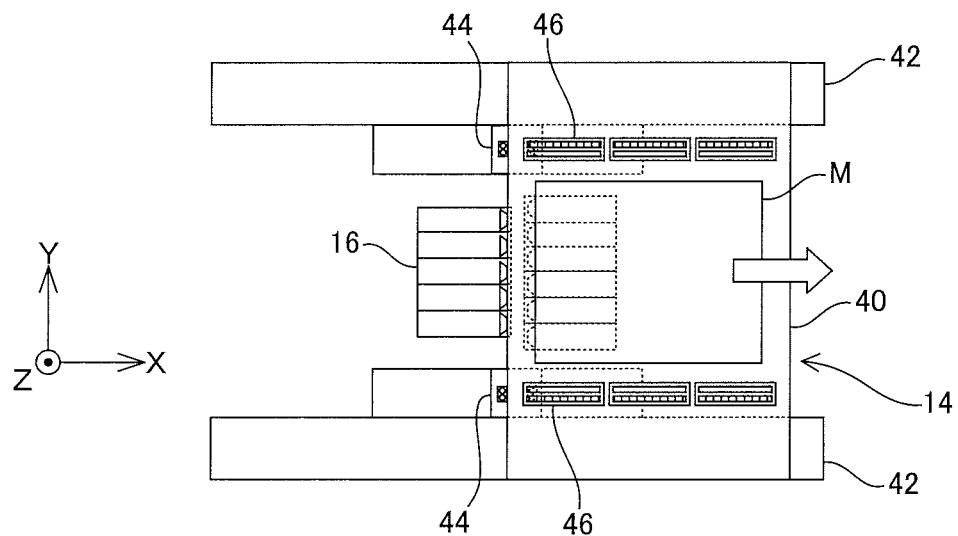
FIG. 10A is a view (No. 2) showing an operation of the mask encoder system at the time of exposure operation.
Figure 10B:
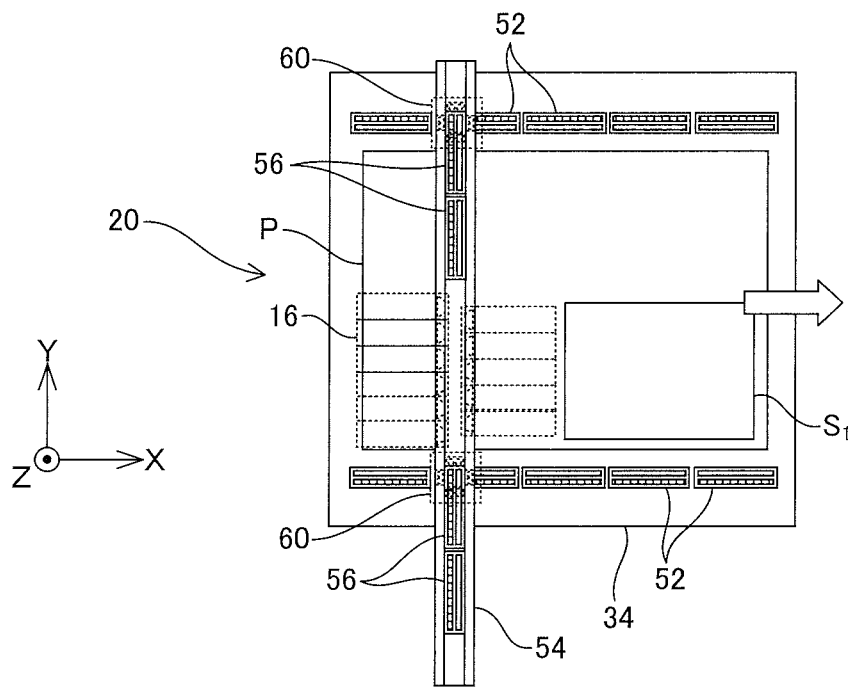
FIG. 10B is a view (No. 2) showing an operation of the substrate encoder system at the time of exposure operation.

Next, as is shown in FIG. 10A, along with mask holder 40 being moved (acceleration, constant speed drive, and deceleration) in the +X direction, substrate holder 34 is moved (acceleration, constant speed drive, and deceleration) in the +X direction synchronously with mask holder 40, as is shown in FIG. 10B. When mask holder 40 is moved, main controller 90 (refer to FIG. 8) performs position control of substrate P based on the output of substrate encoder system 50 (refer to FIG. 8), along with performing position control of mask M based on the output of mask encoder system 48 (refer to FIG. 8). When substrate holder 34 is moved in the X-axis direction, the pair of head units 60 is to be in a stationary state. While mask holder 40 and substrate holder 34 are moved at a constant speed in the X-axis direction, illumination light IL having passed through mask M and projection optical system 16 (each refer to FIG. 1) is irradiated on substrate P, and by this operation, the mask pattern that mask M has is transferred onto shot area $S_1$.

Figure 11A:
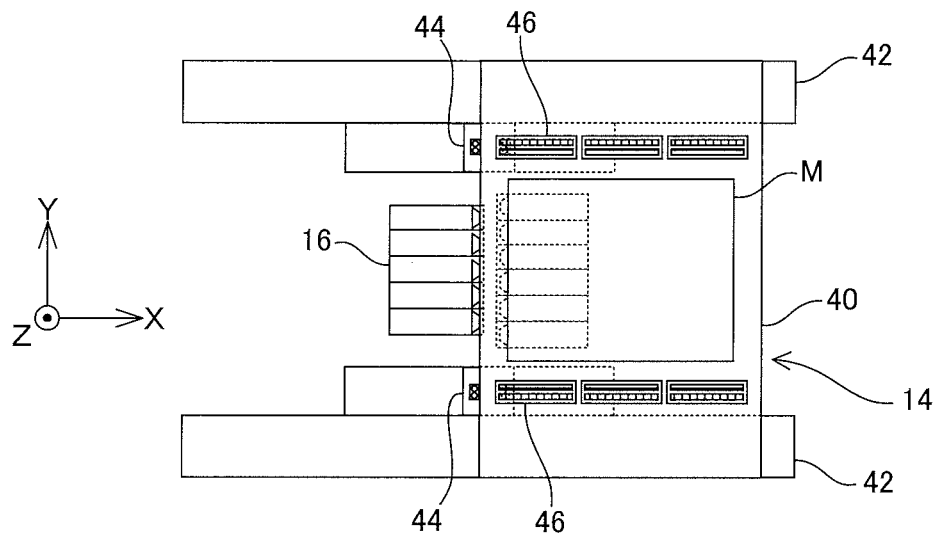
FIG. 11A is a view (No. 3) showing an operation of the mask encoder system at the time of exposure operation.
Figure 11B:
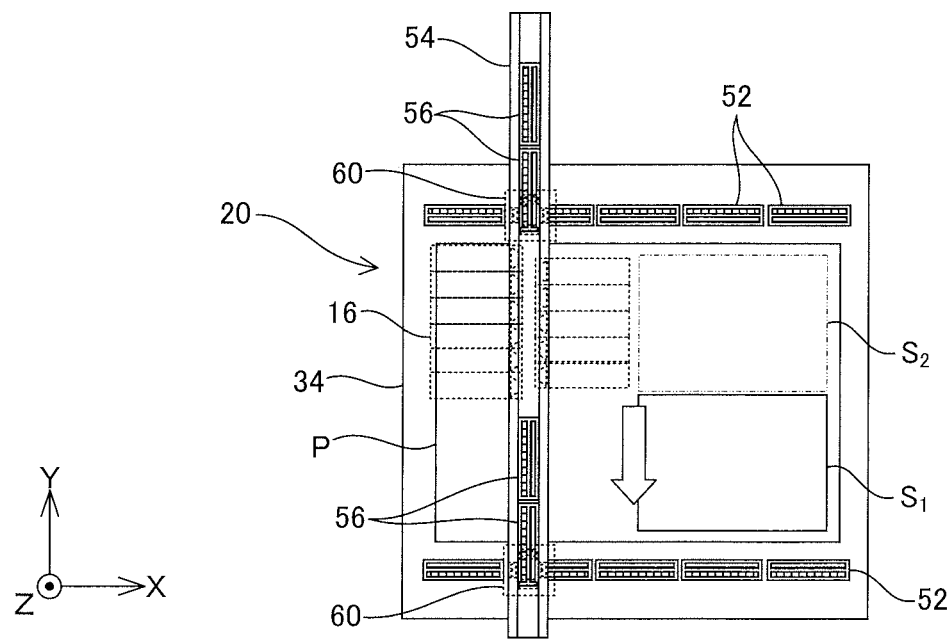
FIG. 11B is a view (No. 3) showing an operation of the substrate encoder system at the time of exposure operation.

When transfer of the mask pattern with respect to the first shot area $S_1$ on substrate P has been completed, in substrate stage device 20, as is shown in FIG. 11B, substrate holder 34 is moved (Y step) in the −Y direction by a predetermined distance (about half the distance of the dimension in the width direction of substrate P) for exposure of a second shot area $S_2$ set on the +Y side of the first shot area $S_1$, based on the output of substrate encoder system 50 (refer to FIG. 8). In the Y stepping operation of substrate holder 34 described above, mask holder 40, as is shown in FIG. 11A, is stationary, in a state where the edge of mask M on the −X side is positioned slightly to the +X side than the position of illumination area (however, mask M is not illuminated in the state shown in FIG. 11A).

Here, as is shown in FIG. 11B, in the Y stepping operation of substrate holder 34 described above, in substrate stage device 20, the pair of head units 60 is moved in the Y-axis direction synchronously with substrate holder 34. That is, of substrate encoder system 50 (refer to FIG. 8), main controller 90 (refer to FIG. 8) moves the pair of head units 60 in the Y-axis direction via the corresponding belt driver 68 (refer to FIG. 8), based on the output of Y linear encoder 96y (refer to FIG. 8), while moving substrate holder 34 to a target position via substrate drive system 93 (refer to FIG. 8), based on the output of Y linear encoder 94y. On this operation, main controller 90 moves the pair of head units 60 synchronously with substrate holder 34 (so that the pair of head units 60 follow substrate holder 34). Accordingly, measurement beams irradiated from X head 66 and Y head 66y (each refer to FIG. 7) do not move off of X scale 53x and Y scale 53y (each refer to FIG. 7), regardless of the Y position of substrate holder 34 (including while substrate 34 is being moved). In other words, the pair of head units 60 and substrate holder 34 should be moved in the Y-axis direction around a level in which each of the measurement beams irradiated from X head 66x and Y head 66y while substrate holder 34 is being moved in the Y-axis direction (during the Y stepping operation) do not move off of X scale 53x and Y scale 53y, that is, around a level in which measurement from X head 66x and Y head 66y using the measurement beams is not cut off (measurement can be continued). That is, the movement of the pair of head units 60 and substrate holder 34 in the Y-axis direction does not have to be synchronous, or a follow-up movement.

Figure 12A:
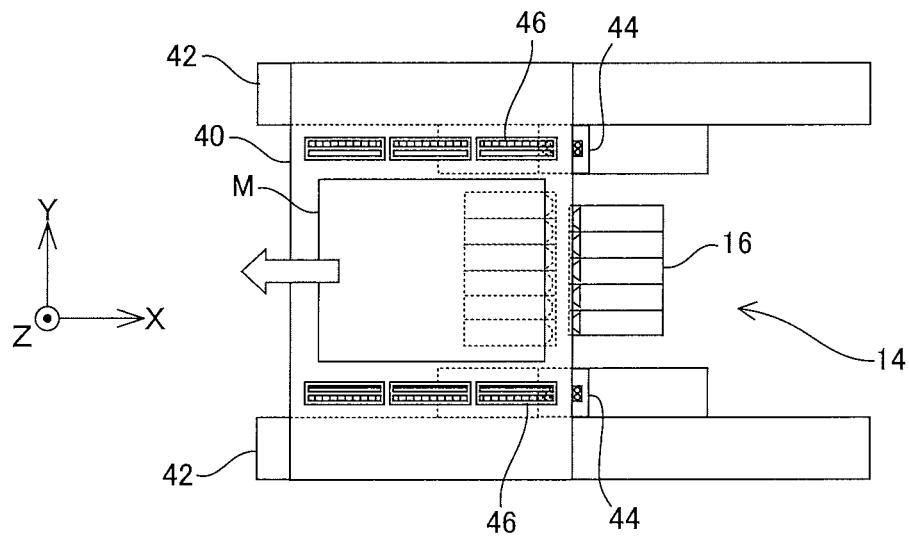
FIG. 12A is a view (No. 4) showing an operation of the mask encoder system at the time of exposure operation.
Figure 12B:
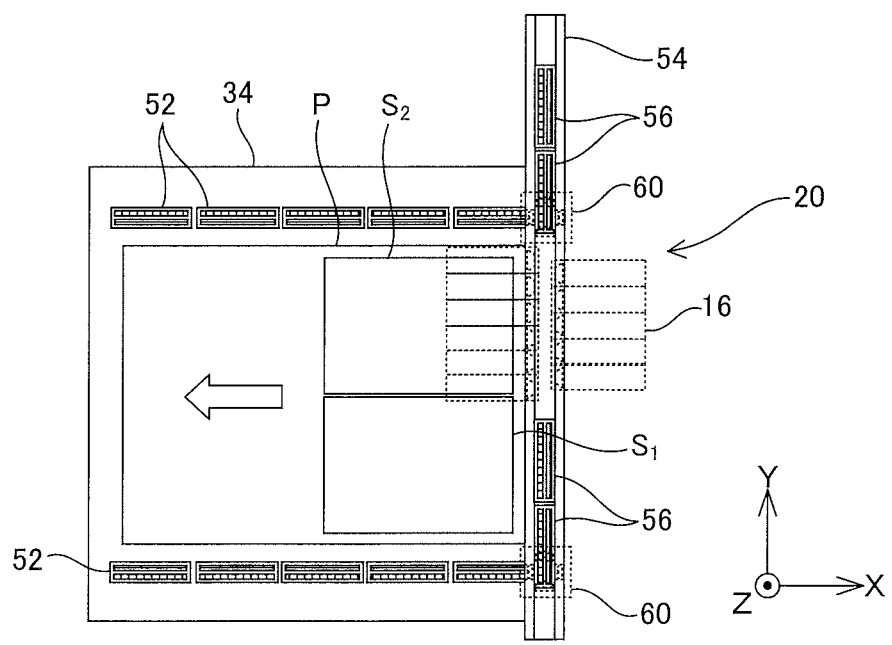
FIG. 12B is a view (No. 4) showing an operation of the substrate encoder system at the time of exposure operation.

When the Y stepping operation of substrate holder 34 is completed, along with mask holder 40 being moved in the −X direction based on the output of mask encoder system 48 (refer to FIG. 8) as is shown in FIG. 12A, substrate holder 34 is moved in the −X direction based on the output of substrate encoder system 50 (refer to FIG. 8) synchronously with mask holder 40 as is shown in FIG. 12B. By this operation, the mask pattern is transferred onto the second shot area $S_2$. The pair of head units 60 is in a stationary state also on this operation.

Figure 13A:
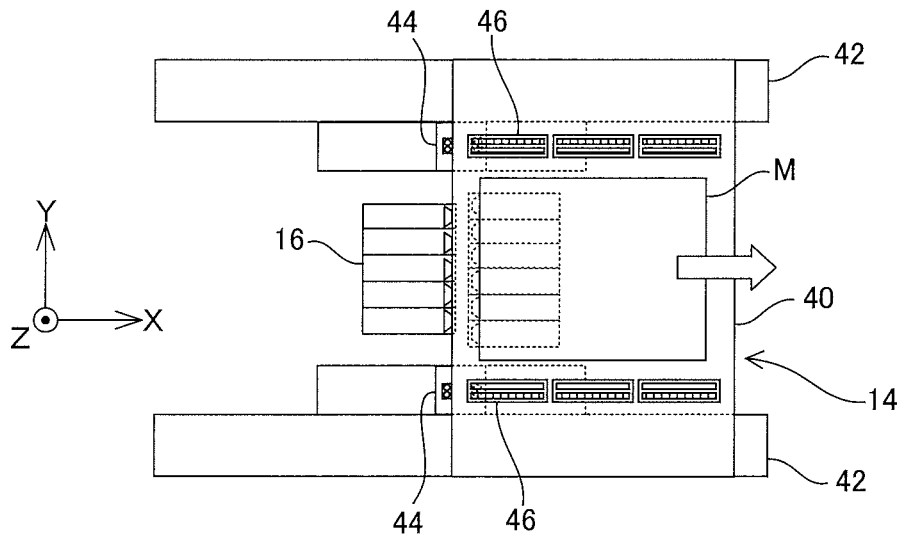
FIG. 13A is a view (No. 5) showing an operation of the mask encoder system at the time of exposure operation.
Figure 13B:
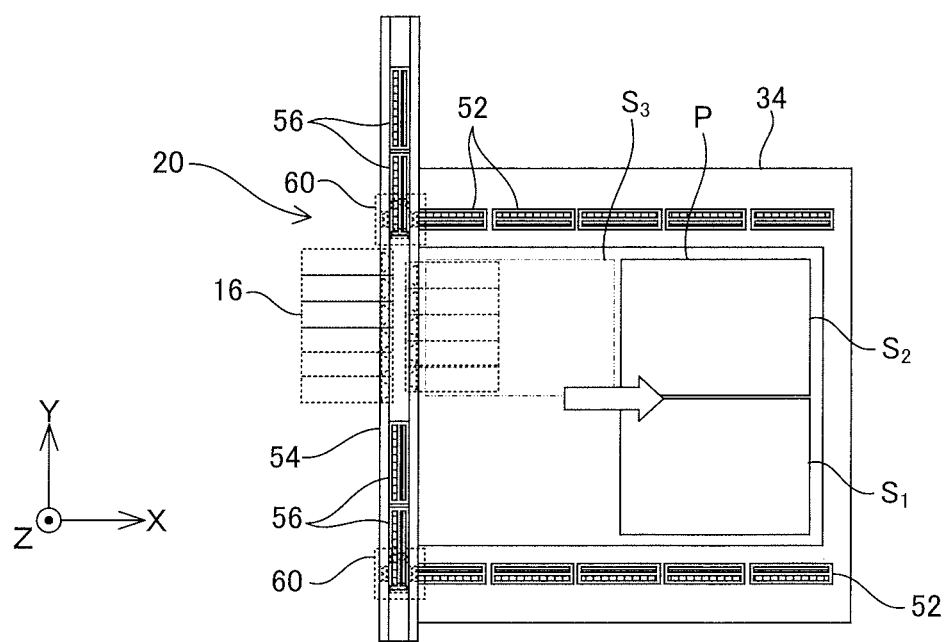
FIG. 13B is a view (No. 5) showing an operation of the substrate encoder system at the time of exposure operation.

When exposure operation of the second shot area $S_2$ has been completed, in mask stage device 14, as is shown in FIG. 13A, mask holder 40 is moved in the +X direction, and the position of mask M is set based on the output of mask encoder system 48 (refer to FIG. 8) so that the edge on the −X side of mask M is set slightly to the +X side of the illumination area. Also, in substrate stage device 20, as is shown in FIG. 13B, substrate holder 34 is moved in the +X direction for exposure of a third shot area $S_3$ set on the −X side of the second shot area $S_2$, and the position of substrate P is set based on the output of substrate encoder system 50 (refer to FIG. 8) so that the edge on the −X side of the third shot area $S_3$ is set slightly to the +X side of the exposure area. At the time of movement operation of mask holder 40 and substrate holder 34 shown in FIGS. 13A and 13B, illumination system 12 (refer to FIG. 1) does not irradiate mask M (refer to FIG. 13A) and substrate P (refer to FIG. 13B) with illumination light IL. That is, the movement operation of mask holder 40 and substrate holder 34 shown in FIGS. 13A and 13B are simply positioning operations (X stepping operations) of mask M and substrate P.

Figure 14A:
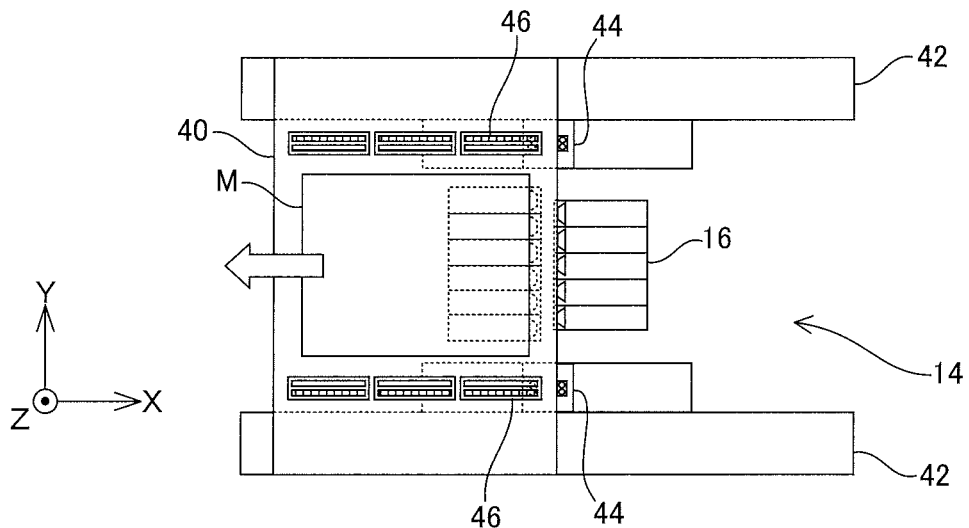
FIG. 14A is a view (No. 6) showing an operation of the mask encoder system at the time of exposure operation.
Figure 14B:
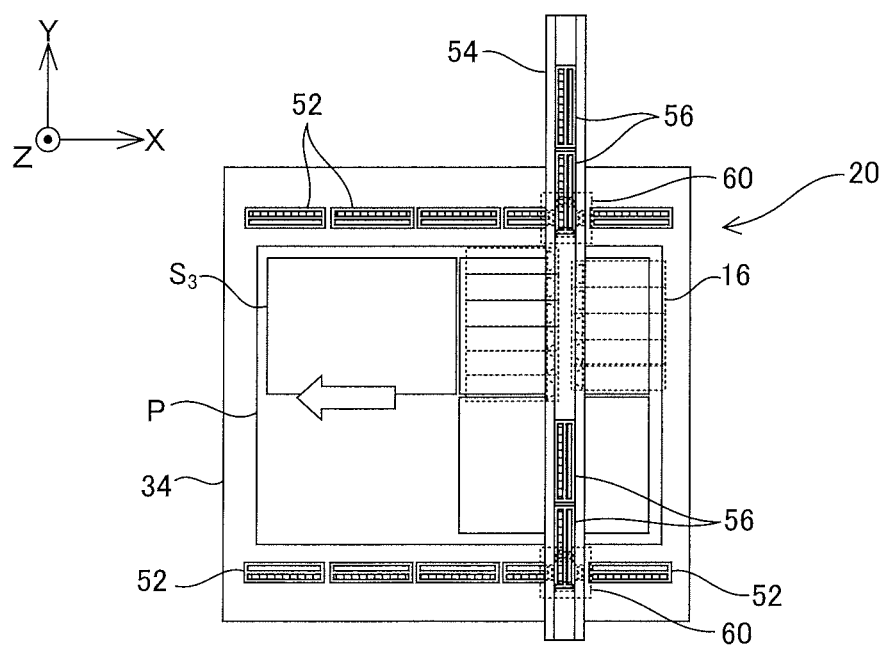
FIG. 14B is a view (No. 6) showing an operation of the substrate encoder system at the time of exposure operation.

When the X stepping operations of mask M and substrate P are completed, in mask stage device 14, along with mask holder 40 being moved in the −X direction based on the output of mask encoder system 48 (refer to FIG. 8) as is shown in FIG. 14A, substrate holder 34 is moved in the −X direction based on the output of substrate encoder system 50 (refer to FIG. 8) synchronously with mask holder 40 as is shown in FIG. 14B. By this operation, the mask pattern is transferred onto the third shot area $S_3$. The pair of head units 60 is in a stationary state also on this operation.

Figure 15A:
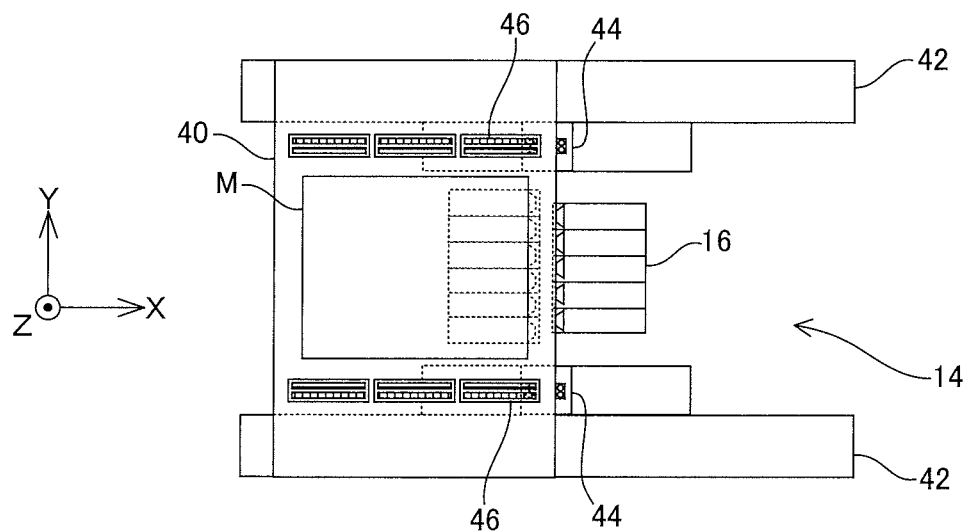
FIG. 15A is a view (No. 7) showing an operation of the mask encoder system at the time of exposure operation.
Figure 15B:
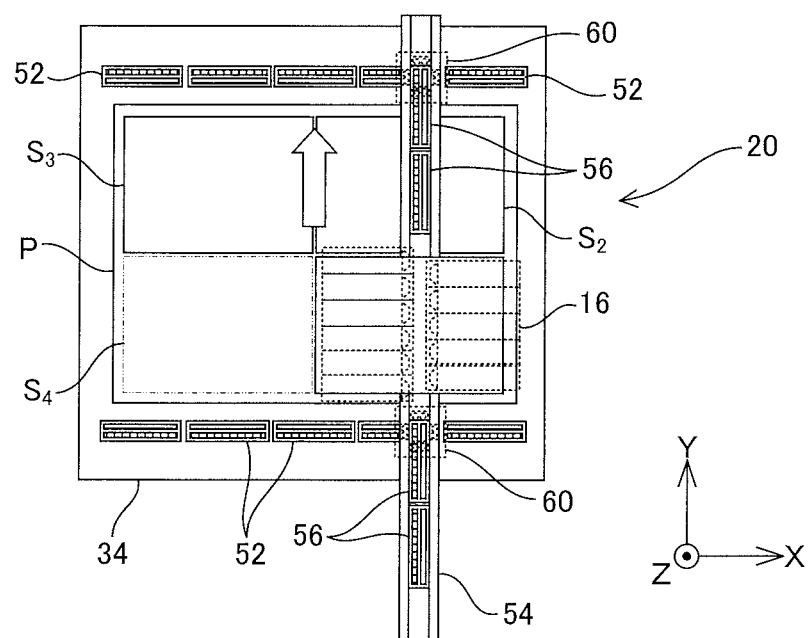
FIG. 15B is a view (No. 7) showing an operation of the substrate encoder system at the time of exposure operation.

When exposure operation of the third shot area $S_3$ has been completed, in substrate stage device 20, as is shown in FIG. 15B, substrate holder 34 is moved (Y stepping operation) in the +Y direction by a predetermined distance, for exposure of a fourth shot area $S_4$ set on the −Y side of the third shot area $S_3$. On this operation, similarly to the time of Y stepping operation of substrate holder 34 shown in FIG. 11B, mask holder 40 is to be in a stationary state (refer to FIG. 15A). Also, the pair of head units 60 is moved in the +Y direction synchronously with substrate holder 34 (so that the pair of head units 60 follow substrate holder 34).

Figure 16A:
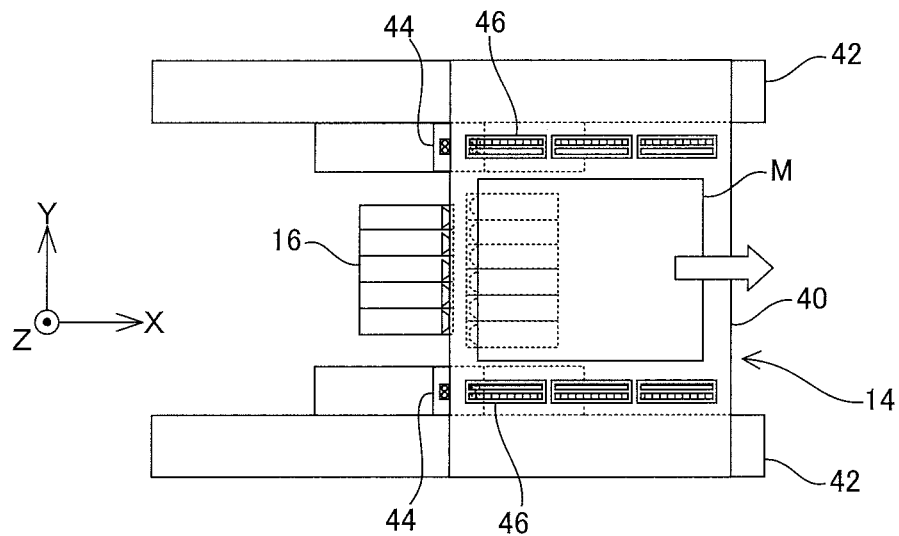
FIG. 16A is a view (No. 8) showing an operation of the mask encoder system at the time of exposure operation.
Figure 16B:
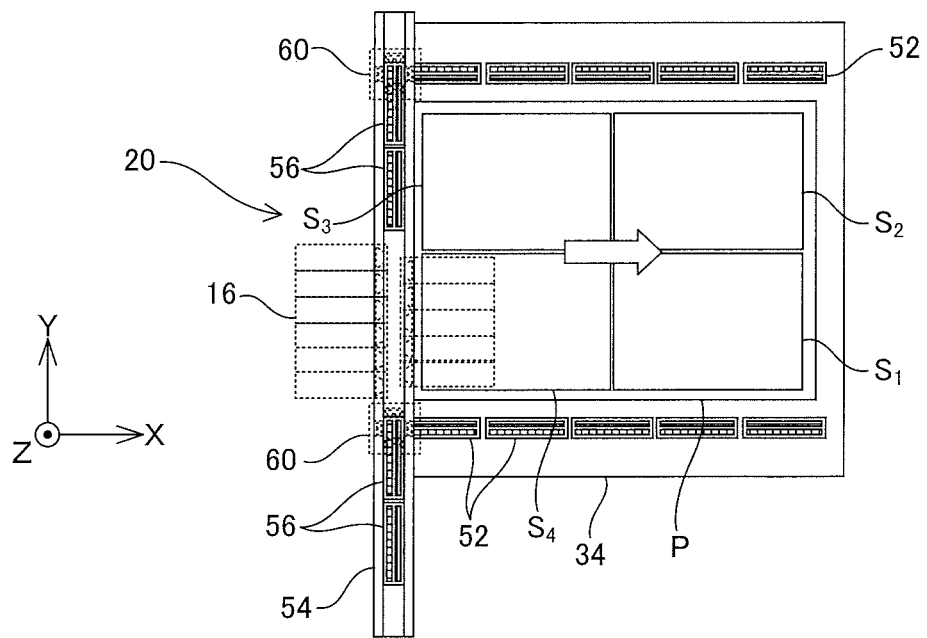
FIG. 16B is a view (No. 8) showing an operation of the substrate encoder system at the time of exposure operation.

When the Y stepping operation of substrate holder 34 is completed, along with mask holder 40 being moved in the +X direction based on the output of mask encoder system 48 (refer to FIG. 8) as is shown in FIG. 16A, substrate holder 34 is moved in the +X direction based on the output of substrate encoder system 50 (refer to FIG. 8) synchronously with mask holder 40 as is shown in FIG. 16B. By this operation, the mask pattern is transferred onto the fourth shot area $S_4$. The pair of head units 60 is in a stationary state also on this operation.

As is described so far, with liquid crystal exposure apparatus 10 according to the embodiment, since mask encoder system 48 for obtaining position information of mask M within the XY plane and substrate encoder system 50 for obtaining position information of substrate P within the XY plane (each refer to FIG. 1) each have a short optical path length of the measurement beams irradiated on the corresponding scales, influence of air fluctuation can be reduced compared to, for example, a conventional interferometer system. Accordingly, positioning accuracy of mask M and substrate P is improved. Also, since the influence of air fluctuation is small, partial air-conditioning equipment that becomes necessary when using a conventional interferometer system can be omitted, which allows cost reduction.

Furthermore, in the case of using an interferometer system, while a large and heavy bar mirror had to be provided at mask stage device 14 and substrate stage device 20, in mask encoder system 48 and substrate encoder system 50 according to the embodiment, the bar mirror referred to above will not be required, which allows systems including mask holder 40 (e.g. mask stage device) and systems including substrate holder 34 (e.g. substrate stage device) to be made smaller and lighter, and to also have a better weight balance, which in turn improves position controllability of mask M and substrate P. Also, places to be adjusted is fewer when compared to the case of using the interferometer system, which allows the cost of mask stage device 14 and substrate stage device 20 to be reduced, and also improves maintainability. Also, adjustment at the time of assembly becomes easier (or will not be required).

Also, since substrate encoder system 50 according to the embodiment has a structure of obtaining the Y position information of substrate P by moving the pair of head units 60 in the Y-axis direction on moving substrate P in the Y-axis direction (e.g. stepping operation), there is no need to arrange a scale extending in the Y-axis direction on the substrate stage device 20 side, or to increase the width in the Y-axis direction of the scale extending in the X-axis direction (or to arrange a plurality of heads in the Y-axis direction on the apparatus main section 18 side). Accordingly, the structure of the substrate position measurement system can be simplified, which allows cost reduction.

Also, since mask encoder system 48 according to the embodiment has a structure of obtaining the position information of mask holder 40 within the XY plane while appropriately switching the output of an adjacent pair of encoder heads (X head 49x, Y head 49y) depending on the X position of mask holder 40, position information of mask holder 40 can be obtained without the information being cut off even if the plurality of scales 46 is arranged in the X-axis direction at a predetermined spacing (arranged separate from one another). Accordingly, there is no need to prepare a scale having a length about the same as the movement strokes of mask holder 40 (a length about three times the length of scale 46 in the embodiment), which allows the cost to be reduced, and is especially suitable for liquid crystal exposure apparatus 10 that uses a large mask M as in the embodiment. Similarly, with substrate encoder system 50 according to the embodiment, since the plurality of scales 52 is arranged in the X-axis direction and the plurality of scales 56 is arranged in the Y-axis direction each by a predetermined spacing, there is no need to prepare a scale having a length about the same as the movement strokes of substrate P, which is suitable for liquid crystal exposure apparatus 10 that uses a large substrate P.

Note that in the first embodiment described above, while the case has been described where the pair of head units 60 each has four heads (a pair of X heads 66x and a pair of Y heads 66y) for measuring the position of substrate holder 34 and a total of eight heads for measuring the position of the substrate holder is provided, the number of heads for measuring the position of the substrate holder may be less than eight. Hereinafter, this kind of embodiment will be described.

Second Embodiment

Next, a second embodiment will be described, based on FIGS. 17 to 20C. Since the structure of the liquid crystal exposure apparatus according to the second embodiment is the same as the first embodiment previously described except for the structure of a part of substrate encoder system 50, only the different points will be described below, and for elements having the same structure and function as the first embodiment will have the same reference code as the first embodiment and the description thereabout will be omitted.

Figure 17:
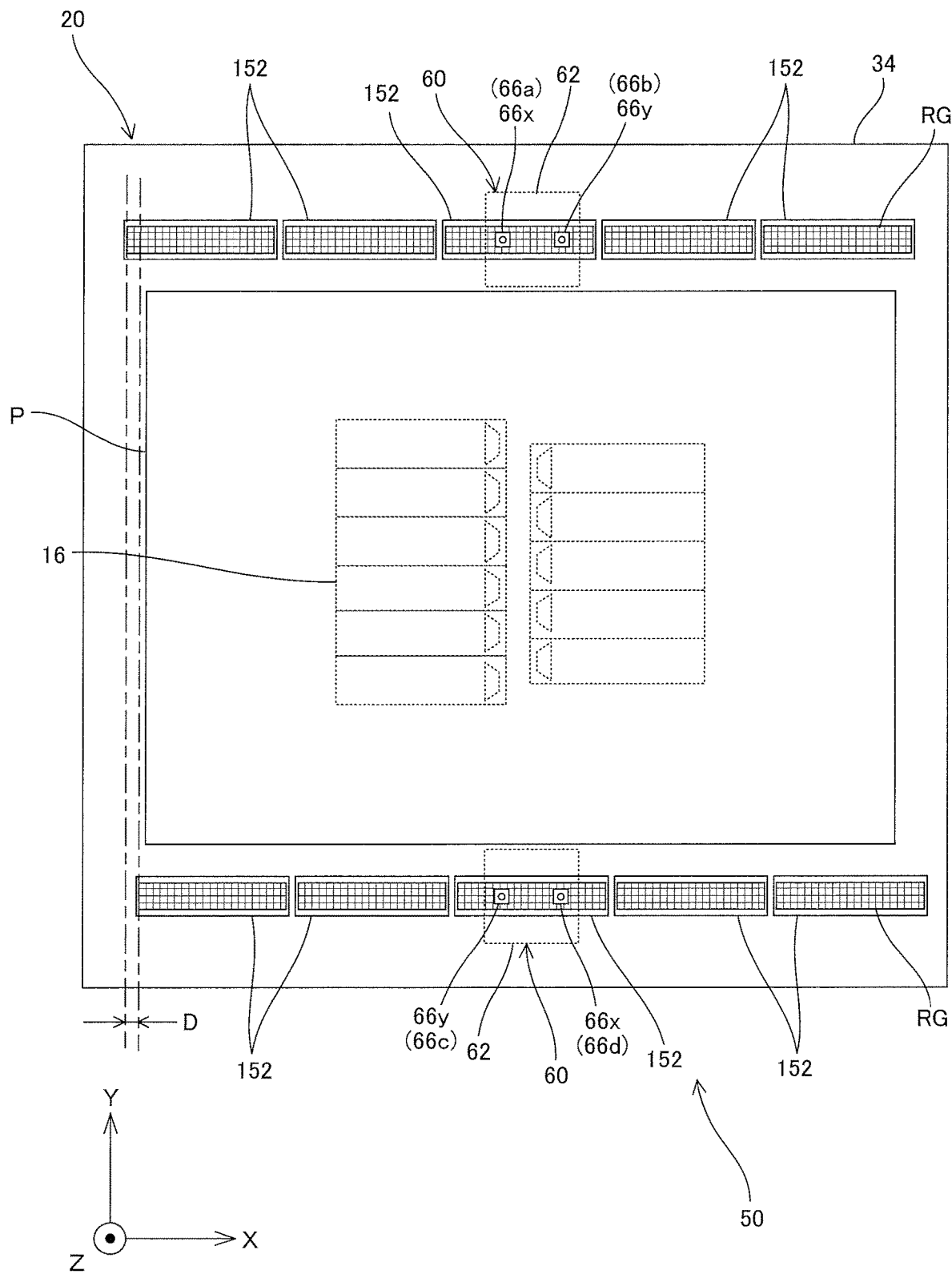
FIG. 17 is a planar view showing a substrate holder and a pair of head units of a substrate encoder system that a liquid crystal exposure apparatus according to a second embodiment has, along with a projection optical system.

FIG. 17 shows substrate holder 34 and the pair of head units 60 of substrate encoder system 50 according to the second embodiment in a planar view, along with projection optical system 16. In FIG. 17, to make the description comprehensive, illustration of encoder base 54 and the like is omitted. Also, in FIG. 17, along with head unit 60 (Y slide table 62) illustrated in a dotted line, illustration of X head 64x and Y head 64y provided on the upper surface of Y slide table 62 is also omitted.

With the liquid crystal exposure apparatus according to the second embodiment, as is shown in FIG. 17, in each of the areas on both the +Y side and the −Y side of the substrate mounting area of substrate holder 34, for example, five encoder scales 152 (hereinafter simply referred to as scales 152) are arranged at a predetermined spacing in the X-axis direction so that the grating areas are arranged separately in the X-axis direction. With the five scales 152 arranged on the +Y side of the substrate mounting area and the five scales 152 arranged on the −Y side, while the spacing between adjacent scales 152 (grating area) is the same, the arrangement position of the five scales 152 on the −Y side is, as a whole, arranged shifted to the +X side by a predetermined distance D (a distance slightly larger than the spacing between adjacent scales 152 (grating area)) with respect to the five scales 152 on the +Y side. This is to prevent a state from occurring in which two or more heads of the total of four heads; two X heads 66x and two Y heads 66y to be described later on that measure position information of substrate holder 34, do not face any of the scales (that is, to avoid a non-measurement period in which the measurement beam moves off of the scale from overlapping among the four heads).

Each scale 152 consists of a rectangular plate-shaped (strip-shaped) member in a planar view extending in the X-axis direction, made of, for example, quartz glass. On the upper surface of each scale 152, a reflective two-dimensional diffraction grating (two-dimensional grating) RG is formed, having a predetermined pitch (e.g. 1 μm) whose periodic direction is in the X-axis direction and the Y-axis direction. In the description below, the grating area described earlier will also be simply called two-dimensional grating RG. Note that in FIG. 17, for convenience of illustration, the spacing (pitch) between the grid lines of the two-dimensional grating RG is shown much wider than the actual spacing. The same also applies to other drawings that will be described below. In the description below, the five scales arranged in the area on the +Y side of substrate holder 34 is to be referred to as a first grating group, and the five scales arranged in the area on the −Y side of substrate holder 34 is to be referred to as a second grating group.

To the lower surface (surface on the −Z side) of Y slide table 62 of one of the head units 60 positioned on the +Y side, X head 66x and Y head 66y are fixed apart by a predetermined spacing (a distance larger than the spacing between adjacent scales 152) in the X-axis direction, in a state each facing scale 152. Similarly, to the lower surface (surface on the −Z side) of Y slide table 62 of the other head unit 60 positioned on the −Y side, Y head 66y and X head 66x are fixed apart by a predetermined spacing in the X-axis direction, in a state each facing scale 152. That is, X head 66x and Y head 66y facing the first grating group and X head 66x and Y head 66y facing the second grating group each irradiates scale 152 with a measurement beam at a spacing larger than the spacing between adjacent grating areas of scale 152. In the description below, for convenience of explanation, X head 66x and Y head 66y that one of the head units 60 has will be referred to as head 66a and head 66b, and Y head 66y and X head 66x that the other head unit 60 has will be referred to as head 66c and head 66d, respectively.

In this case, head 66a and head 66c are arranged at the same X position (on the same straight line parallel to the Y-axis direction), and head 66b and head 66d are arranged at the same X position (on the same straight line parallel to the Y-axis direction) different from the X position of head 66a and head 66c. Heads 66a, 66d and the two-dimensional gratings RG that face each head structure a pair of X linear encoders, and heads 66b, 66c and the two-dimensional gratings RG that face each head structure a pair of Y linear encoders.

With the liquid crystal exposure apparatus according to the second embodiment, the structure of other parts including the remaining part of head unit 60 is similar to liquid crystal exposure apparatus 10 according to the first embodiment described earlier, except for the drive control (position control) of substrate holder 34 using the substrate encoder system by main controller 90.

Figure 18A:
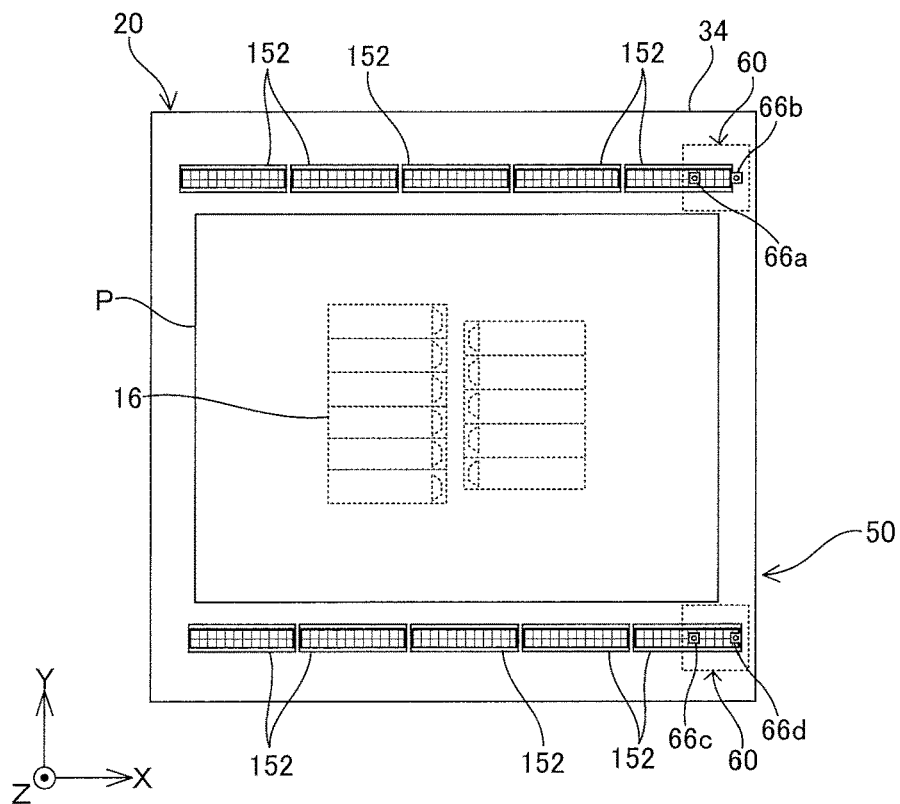
FIGS. 18A and 18B are views used to explain a movement range in an X-axis direction of the substrate holder when position measurement of the substrate holder is performed.
Figure 18B:
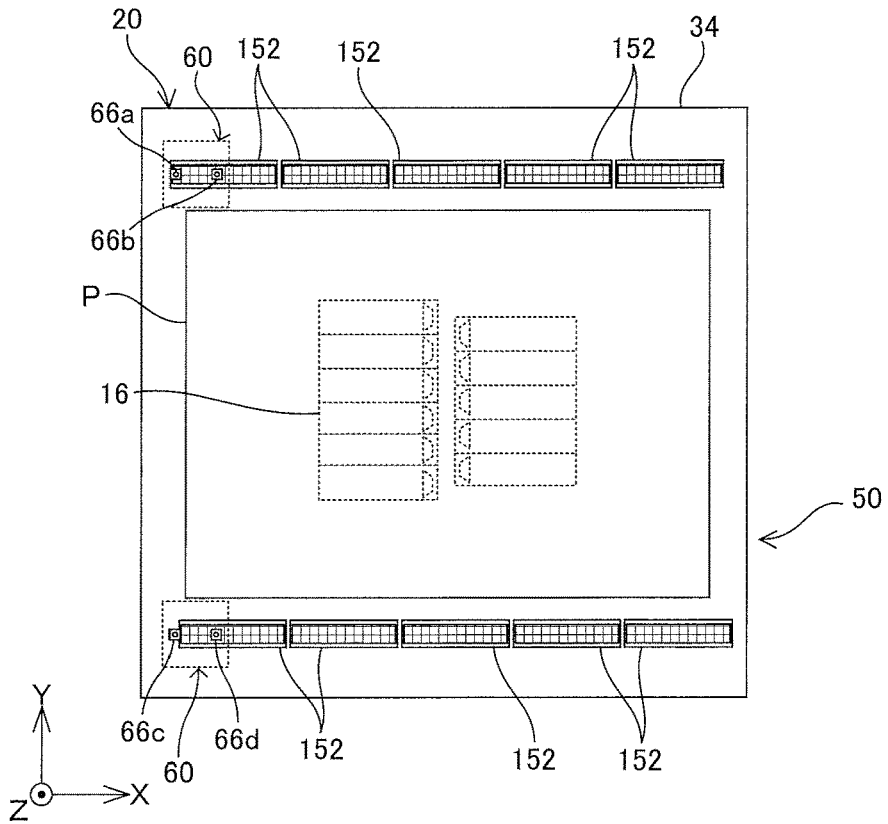

With the liquid crystal exposure apparatus according to the second embodiment, position measurement of substrate holder 34 can be performed by heads 66a to 66d of the pair of head units 60, that is, by the pair of X linear encoders and the pair of Y linear encoders, between a first position where the pair of head units 60 face the +X edge of substrate holder 34 as is shown in FIG. 18A, and a second position where the pair of head units 60 face the −X edge of substrate holder 34 as is shown in FIG. 18B, within a range where substrate holder 34 moves in the X-axis direction. FIG. 18A shows a state in which only head 66b faces none of the scales 152, and FIG. 18B shows a state in which only head 66c faces none of the scales 152.

In the process of substrate holder 34 moving in the X-axis direction between the first position shown in FIG. 18A and the second position shown in FIG. 18B, positional relation between the pair of head units 60 and scales changes between five states; a first to fourth state shown respectively in FIGS. 19A to 19D and a fifth state in which four heads 66a to 66d all face the two-dimensional grating RG of either one of the scales 152 (that is, all four heads 66a to 66d irradiate two-dimensional grating RG with the measurement beams). In the description below, instead of saying that the head faces two-dimensional grating RG of scale 152, or two-dimensional grating RG of scale 152 is irradiated with the measurement beam, the expression, the head faces the scale, will simply be used.

Here, for convenience of explanation, six scales 152 will be picked, and to identify each scale, reference codes a to f will be used and the scales will be described as scales 152a to 152f (refer to FIG. 19A).

Figure 19A:
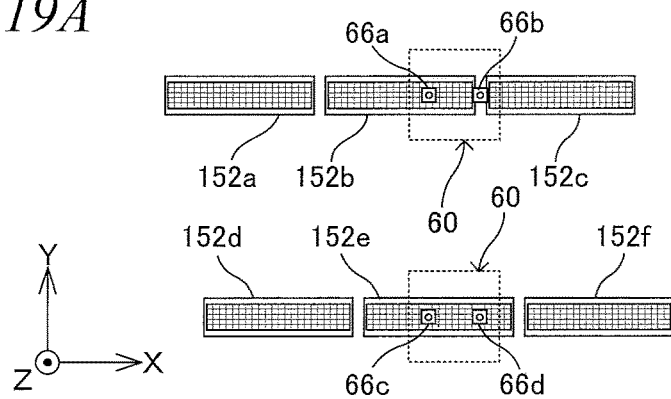
FIGS. 19A to 19D are views used to explain a first state to a fourth state in a state change of positional relation between a pair of head units and a scale in the process when the substrate holder moves in the X-axis direction in the second embodiment.
Figure 19B:
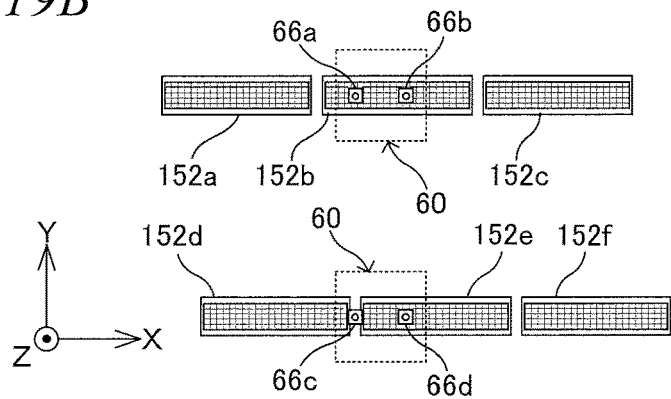

The first state in FIG. 19A shows a state in which head 66a faces scale 152b, heads 66c and 66d face scale 152c, and only head 66b faces neither of the scales, and the second state in FIG. 19B shows a state in which substrate holder 34 moves by a predetermined distance in the +X direction from the state shown in FIG. 19A so that heads 66a and 66b face scale 152b, head 66d faces scale 152e, and head 66c no longer faces any of the scales. In the process of the state changing from the state shown in FIG. 19A to the state shown in FIG. 19B, the process goes through the fifth state in which heads 66a and 66b face scale 152b and heads 66c and 66d face scales 152e.

Figure 19C:
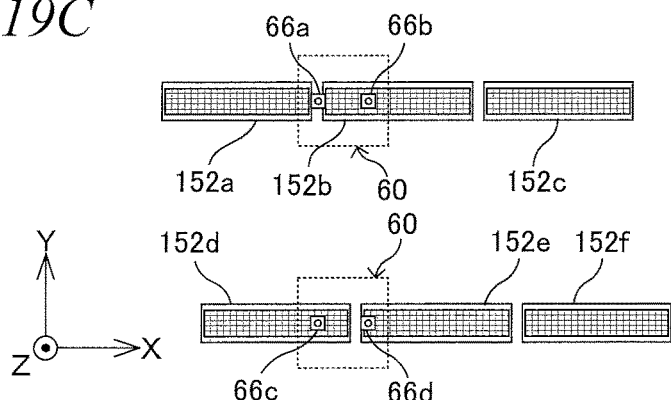

The third state in FIG. 19C shows a state in which substrate holder 34 moves by a predetermined distance in the +X direction from the state shown in FIG. 19B so that only head 66a no longer faces any of the scales. In the process of the state changing from the state shown in FIG. 19B to the state shown in FIG. 19C, the process goes through the fifth state in which heads 66a and 66b face scale 152b, head 66c faces scale 152d, and head 66d faces scales 152e.

Figure 19D:
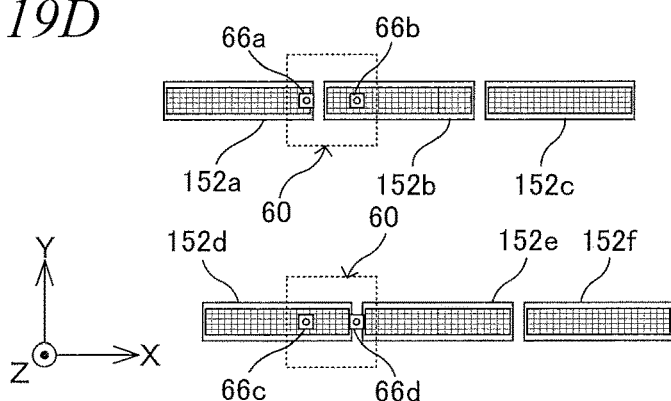

The fourth state in FIG. 19D shows a state in which substrate holder 34 moves by a predetermined distance in the +X direction from the state shown in FIG. 19C so that only head 66d no longer faces any of the scales. In the process of the state changing from the state shown in FIG. 19C to the state shown in FIG. 19D, the process goes through the fifth state in which head 66a faces scale 152a, head 66b faces scale 152b, head 66c faces scale 152d, and head 66d faces scales 152e.

When substrate holder 34 moves by a predetermined distance in the +X direction from the state shown in FIG. 19D, after the process goes through the fifth state in which head 66a faces scale 152a, head 66b faces scale 152b, and heads 66c and 66d face scale 152d, then, the state moves into the first state in which head 66*a* faces scale 152*a*, heads 66*c* and 66*d* face scale 152*d*, and only head 66*b* faces neither of the scales.

While the description so far is about the change of state (positional relation) between each of the three scales 152 of the five scales 152 arranged on both the +Y side and the −Y side of substrate holder 34 and the pair of head units 60, also between 10 scales 152 and the pair of head units 60, regarding each of the adjacent three scales 152 of the five scales 152 arranged on both the +Y side and the −Y side of substrate holder 34, the positional relation with the pair of head units 60 changes in a similar order as is described above.

As is described so far, in the second embodiment, even if substrate holder 34 is moved in the X-axis direction, at least three out of the total of four heads; the two X heads 66*x*, namely heads 66*a* and 66*d*, and two Y heads 66*y*, namely heads 66*b* and 66*c*, constantly face any one of scales 152 (two-dimensional grating RG). Moreover, even if substrate holder 34 is moved in the Y-axis direction, since the pair of Y slide tables 62 is moved so that for all four heads, the measurement beams in the Y-axis direction do not move off of scales 152 (two-dimensional grating RG), at least three of the four heads constantly face any one of scales 152. Accordingly, main controller 90 can control position information of substrate holder 34 in the X-axis direction, the Y-axis direction, and the θz direction, constantly, using three heads of heads 66*a* to 66*d*. This point will be described further below.

When measurement values of X head 66*x* and Y head 66*y* are to be CX and CY, measurement values $C_X$ and $C_Y$ can each be expressed by the following formulas, (1a) and (1b).

$$C_X = (p_i - X)\cos\theta z + (q_i - Y)\sin\theta z \tag{1a}$$

$$C_Y = -(p_i - X)\sin\theta z + (q_i - Y)\cos\theta z \tag{1b}$$

Here, X, Y, and θx show the position of substrate holder 34 in the X-axis direction, the Y-axis direction, and the θz direction, respectively. Also, $p_i$ and $q_i$ are the X position (X coordinate value) and the Y position (Y coordinate value) of each of the heads 66*a* to 66*d*. In the embodiment, the X coordinate values $p_i$ and the Y coordinate values $q_i$ (i=1, 2, 3, 4) of each of the heads 66*a*, 66*b*, 66*c*, and 66*d* can be calculated easily from the position information in the X-axis direction and the Y-axis direction (position of the center of Y slide table 62 in the X-axis direction and the Y-axis direction) of each of the pair of head units 60 (refer to FIG. 1) calculated from the output of the four X linear encoders 96*x* and the four Y linear encoders 96*y*, based on a known relation of each head with respect to the center of Y slide table 62.

Accordingly, when substrate holder 34 and the pair of head units 60 have a positional relation as is shown in FIG. 18A and the position of substrate holder 34 within the XY plane in directions of three degrees of freedom is (X, Y, θz), then measurement values of the three heads 66*a*, 66*c*, and 66*d* can theoretically be expressed by the following formulas, (2a) to (2c) (also called an affine transformation relation).

$$C_1 = (p_1 - X)\cos\theta z + (q_1 - Y)\sin\theta z \tag{2a}$$

$$C_3 = -(p_3 - X)\sin\theta z + (q_3 - Y)\cos\theta z \tag{2b}$$

$$C_4 = (p_4 - X)\cos\theta z + (q_4 - Y)\sin\theta z \tag{2c}$$

In a reference state where substrate holder 34 is at a coordinate origin (X, Y, θz)=(0, 0, 0), by simultaneous equations (2a) to (2c), $C_1 = p_1$, $C_3 = q_3$, and $C_4 = p_4$. The reference state, for example, is a state in which the center of substrate holder 34 (almost coincides with the center of substrate P) coincides with the center of the projection area by projection optical system 16 and the θz rotation is zero. Accordingly, in the reference state, the Y position of substrate holder 34 can also be measured by head 66*b*, and measurement value $C_2$ by head 66*b*, according to formula (1b), is $C_2 = q_2$.

Accordingly, when the measurement values of the three heads 66*a*, 66*c*, and 66*d* are to be initially set to $p_1$, $q_3$, and $p_4$ in the reference state, hereinafter, the three heads 66*a*, 66*c*, and 66*d* are to present theoretical values given by the formulas (2a) to (2c) with respect to displacements (X, Y, θz) of substrate holder 34.

Note that in the reference state, instead of one of the heads 66*a*, 66*c*, and 66*d*, such as for example, 66*c*, measurement value $C_2$ of head 66*b* may be initially set as $q_2$.

In this case, hereinafter, the three heads 66*a*, 66*b*, and 66*d* are to present theoretical values given by the formulas (2a), (2c), and (2d) with respect to displacements (X, Y, θz) of substrate holder 34.

$$C_1 = (p_1 - X)\cos\theta z + (q_1 - Y)\sin\theta z \tag{2a}$$

$$C_4 = (p_4 - X)\cos\theta z + (q_4 - Y)\sin\theta z \tag{2c}$$

$$C_2 = -(p_2 - X)\sin\theta z + (q_2 - Y)\cos\theta z \tag{2d}$$

In simultaneous equations (2a) to (2c) and simultaneous equations (2a), (2c), and (2d), three formulas are given with respect to three variables (X, Y, θz). Therefore, conversely, if dependent variables $C_1$, $C_3$, and $C_4$ in simultaneous equations (2a) to (2c), or dependent variables $C_1$, $C_4$, and $C_2$ in simultaneous equations (2a), (2c), and (2d) are given, variables X, Y, and θz can be obtained. Here, the equations can be solved easily when an approximate $\sin\theta z \approx \theta z$ is applied, or when a higher approximate is applied. Accordingly, positions (X, Y, θz) of wafer stage WST can be calculated from measurement values $C_1$, $C_3$, and $C_4$ (or $C_1$, $C_2$, and $C_4$) of heads 66*a*, 66*c*, and 66*d* (or heads 66*a*, 66*b*, and 66*d*).

Next, a linkage process, namely, initial setting of measurement values, at the time when switching heads of the substrate encoder system that measures position information of substrate holder 34 performed in the liquid crystal exposure apparatus according to the second embodiment, will be described centering on the operation of main controller 90.

Figure 20A:
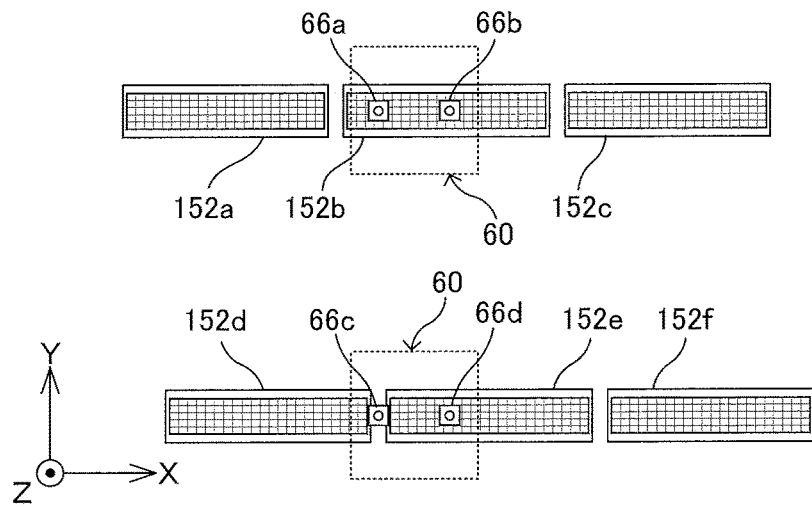
FIGS. 20A to 20C are views used to explain a linkage process at the time of switching heads of the encoder system that measures position information of the substrate holder performed in the liquid crystal exposure apparatus according to the second embodiment.
Figure 20B:
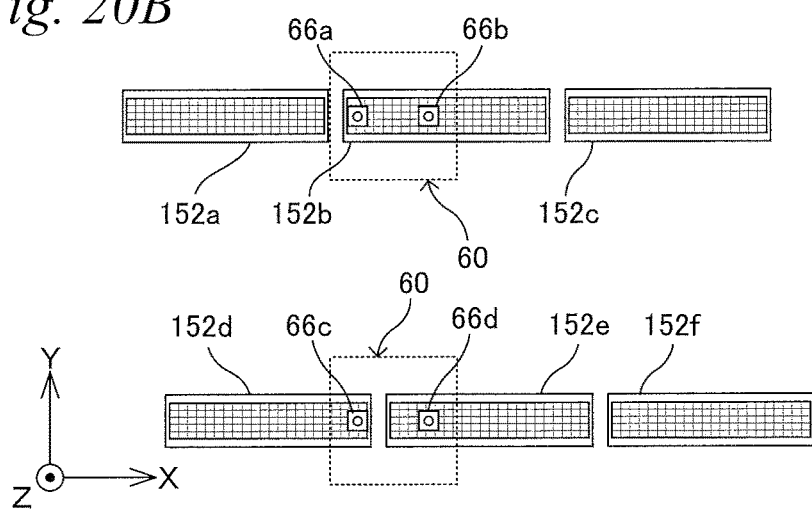
Figure 20C:
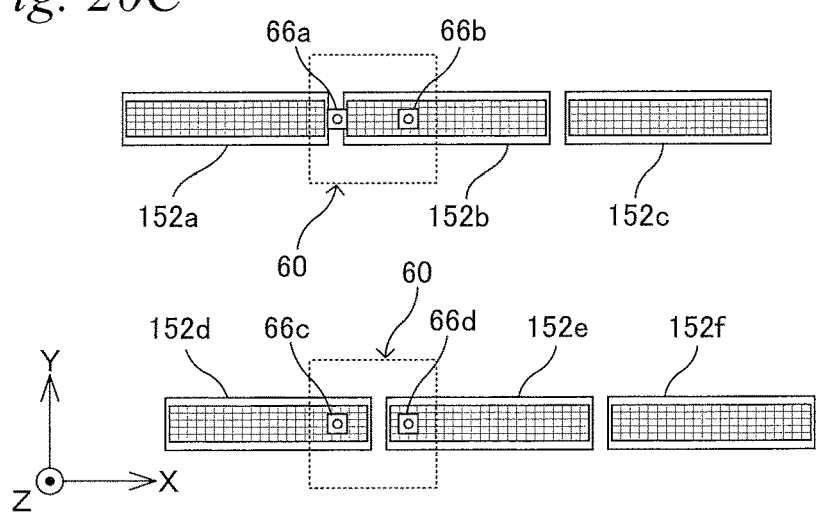

In the second embodiment, three encoders (X heads and Y heads) are constantly measuring the position information of substrate holder 34 as is previously described in an effective stroke range of substrate holder 34, and on performing the switching process of the encoders (X head or Y head), for example, as is shown in FIG. 20B, each of the four heads 66*a* to 66*d* face any of the scales 152 and moves into a state (the fifth state described earlier) so that the position of substrate holder 34 can be measured. FIG. 20B shows an example of the fifth state that appears during the change of state from the state shown in FIG. 20A in which the position of substrate holder 34 is measured with heads 66*a*, 66*b*, and 66*d* and then substrate holder 34 is moved in the +X direction to the state shown in FIG. 20C in which the position of substrate holder 34 is measured with heads 66*b*, 66*c*, and 66*d*. That is, FIG. 20B shows a state in which the three heads used for measuring position information of substrate holder 34 are being switched, from heads 66*a*, 66*b*, and 66*d* to heads 66*b*, 66*c*, and 66*d*.

At the moment when the switching process (linkage) of heads (encoders) used for position control (measurement of position information) of substrate holder 34 within the XY plane, heads 66a, 66b, 66c, and 66d are facing scales 152b, 152b, 152d, and 152e, respectively, as is shown in FIG. 20B. When taking a look at FIGS. 20A to 20C, it may appear that head 66a is about to be switched to head 66c in FIG. 20B, however, as it is obvious from the point that the measurement direction is different in head 66a and head 66c, it is meaningless to give the measurement value (count value) of head 66a without any changes to head 66c as an initial value of the measurement value at the timing when linkage is performed.

Therefore, in the embodiment, main controller 90 is to perform switching from the measurement of position information (and position control) of substrate holder 34 using the three heads 66a, 66b, and 66d to the measurement of position information (and position control) of substrate holder 34 using the three heads 66b, 66c, and 66d. That is, this method is different from the concept of a normal encoder linkage and does not link one head to another head, but is a method of linking a combination of three heads (encoders) to another combination of three heads (encoders).

Main controller 90, first of all, solves simultaneous equations (2a), (2c), and (2d) based on measurement values $C_1$, $C_4$, and $C_2$ of heads 66a, 66d, and 66b, and calculates position information (X, Y, θz) of the substrate holder within the XY plane.

Next, main controller 90 substitutes X and θz calculated above into the following affine transformation formula (formula (3)), and obtains the initial value (the value that should be measured by head 66c) of the measurement value of head 66c.

$$C_3 = -(p_3-X)\sin \theta z + (q_3-Y)\cos \theta z \quad (3)$$

In formula (3) above, $p_3$ is the X coordinate value and $q_3$ is the Y coordinate value of head 66c. In the embodiment, as is described earlier, for X coordinate value $p_3$ and Y coordinate value $q_3$, the values are used that are calculated from the position of the center of Y slide table 62 in the X-axis direction and the Y-axis direction of each of the pair of head units 60 calculated from the output of the four X linear encoders 96x and the four Y linear encoders 96y, based on the known positional relation of head 66c with respect to the center of Y slide table 62.

By giving initial value $C_3$ described above as the initial value of head 66c, linkage is to be completed without contradictions while maintaining the positions (X, Y, θz) of substrate holder 34 in directions of three degrees of freedom. Thereinafter, the positions (X, Y, θz) of wafer stage WST is calculated by solving the following simultaneous equations (2b) to (2d), using the measurement values $C_2$, $C_3$, and $C_4$ of heads 66b, 66c, and 66d which are used after the switching.

$$C_3 = -(p_3-X)\sin \theta z + (q_3-Y)\cos \theta z \quad (2b)$$

$$C_4 = (p_4-X)\cos \theta z + (q_4-Y)\sin \theta z \quad (2c)$$

$$C_2 = -(p_2-X)\sin \theta z + (q_2-Y)\cos \theta z \quad (2d)$$

Note that while the case has been described above when the switching is from three heads to another three heads including one head different from the three heads, it was described in this way because the values to be measured using the another heads after switching is calculated based on the principle of affine transformation, using the positions (X, Y, θz) of substrate holder 34 obtained from the measurement values of the three heads used before switching, and the calculated values are set as initial values of the another heads used after switching. However, when focusing only on the two heads serving as direct targets of switching and linkage process, without referring to the procedure of calculation and the like of the values to be measured using the another heads used after switching, it may also be said that one head of the three heads used before switching is switched to a different head. In any case, the switching of the heads is performed in a state where the head used for measurement of position information and position control of the substrate holder before switching and the head used after switching both simultaneously face any of the scales 152.

Note that while the description above is an example of switching of heads 66a to 66d, in switching from any three heads to another three heads, or switching from one of the heads to another head, switching of heads is performed in a procedure similarly to the procedure described above.

The liquid crystal exposure apparatus according to the second embodiment described so far has a working effect equivalent to the liquid crystal exposure apparatus according to the first embodiment described earlier. Adding to this, with the liquid crystal exposure apparatus according to the second embodiment, while substrate holder 34 is moved, position information (including θz rotation) of substrate holder 34 within the XY plane is measured by three heads (encoders) including at least one each of X head 66x (X linear encoder) and Y head 66y (Y linear encoder) of substrate encoder system 50. Then, by main controller 90, the head (encoder) used for measuring position information of substrate holder 34 within the XY plane is switched from one of the heads (encoders) of the three heads used for position measurement and position control of substrate holder 34 before switching to another head (encoder), so that the position of substrate holder 34 within the XY plane is maintained before and after the switching. Therefore, the position of substrate holder 34 within the XY plane is maintained before and after the switching and an accurate linkage becomes possible, even though switching of the encoders used for controlling the position of substrate holder 34 has been performed. Accordingly, substrate holder 34 (substrate P) can be moved along the XY plane accurately along a predetermined moving route while switching and linkage (linkage process of measurement values) of the heads are performed among a plurality of heads (encoders).

Also, with the liquid crystal exposure apparatus according to the second embodiment, for example, during exposure of the substrate, substrate holder 34 is moved within the XY plane by main controller 90, based on measurement results of position information of substrate holder 34 and position information ((X, Y) coordinate values) within the XY plane of the three heads used for measuring the position information. In this case, main controller 90 moves substrate holder 34 within the XY plane while calculating the position information of substrate holder 34 within the XY plane using the affine transformation relation. This allows the movement of substrate holder 34 (substrate P) to be controlled with good accuracy while switching the heads (encoders) used for control of the movement of substrate holder 34 using the encoder system having each of a plurality of Y heads 66y or a plurality of X heads 66x.

Note that in the second embodiment described above, while the correction information (initial value of the another head previously described) for controlling the movement of the substrate holder using the head (corresponding to the another head described above) whose measurement beam moves off from one of the adjacent pair of scales and moves to irradiate the other scale was acquired, based on the position information measured by the three heads facing at least one scale 152, this correction information should be acquired by the time one of the three heads facing at least one scale 152 moves off of two-dimensional grating RG, after the measurement beam of the another head is moved to irradiate the other scale. Also, in the case of performing position measurement or position control of the substrate holder by switching the three heads facing at least one scale 152 to three different heads including the another head described above, this switching should be performed by the time one of the three heads facing at least one scale 152 moves off of two-dimensional grating RG, after the correction information described above has been acquired. Note that acquiring the correction information and the switching may substantially be performed at the same time.

Note that in the second embodiment described above, each of the five scales 152 of the first grating group and the second grating group is arranged on substrate holder 34 so that the area that has no two-dimensional grating RG of the first grating group (non-grating area) does not overlap the area that has no two-dimensional grating RG of the second grating group (non-grating area) in the X-axis direction (first direction), or in other words, so that the non-measurement period in which the measurement beam moves off of two-dimensional grating RG does not overlap in the four heads. In this case, heads 66a and 66b that head unit 60 on the +Y side has, are arranged at a spacing wider than the width of the area that has no two-dimensional grating RG of the first group in the X-axis direction, and heads 66c and 66d that head unit 60 on the −Y side has, are arranged at a spacing wider than the width of the area that has no two-dimensional grating RG of the second group in the X-axis direction. However, the combination of the grating section including the plurality of two-dimensional gratings and the plurality of heads that can face the grating section is not limited to this. The point is, spacing between heads 66a and 66b and spacing between heads 66c and 66d, position, position and length of the grating section of the first and second grating groups, spacing between the grating sections, and their position should be set, so that the (non-measurable) non-measurement period in which the measurement beam moves off of two-dimensional grating RG does not overlap in the four heads 66a, 66b, 66c, and 66d during the movement of the movable body in the X-axis direction. For example, even if the position and the width of the non-grating area in the X-axis direction is the same in the first grating group and the second grating group, two heads facing at least one scale 152 (two-dimensional grating RG) of the first grating group and two heads facing at least one scale 152 (two-dimensional grating RG) of the second grating group may be arranged shifted only by a distance wider than the width of the non-grating area in the X-axis direction. In this case, the spacing between the head arranged on the +X side of the two heads facing the first grating group and the head arranged on the −X side of the two heads facing the second grating group may be set wider than the width of the non-grating area, or the two heads facing the first grating and the two heads facing the second grating may be arranged alternately in the X-axis direction with the spacing between adjacent pair of heads may be set wider than the width of the non-grating area.

Also, in the second embodiment described above, while the case has been described in which the first grating group is arranged in an area on the +Y side of substrate holder 34, and the second grating group is arranged in an area on the −Y side of substrate holder 34, instead of one of the first grating group and the second grating group, such as the first grating group, a single scale member on which a two-dimensional grating extending in the X-axis direction is formed may be used. In this case, one head may be made to constantly face the single scale member. In this case, a structure may be employed in which three heads may be provided to face the second grating group, and by making the spacing (spacing between irradiation positions of the measurement beams) in the X-axis direction of the three heads wider than the spacing between two-dimensional grating RG on adjacent scales 152, at least two of the three heads facing the second grating group can face at least one two-dimensional grating RG of the second grating group regardless of the position of substrate holder 34 in the X-axis direction. Or, a structure may be employed in which at least two heads constantly face the single scale member described above regardless of the position of substrate holder 34 in the X-axis direction, together with at least two heads facing at least one two-dimensional grating RG of the second grating group. In this case, each of the measurement beams of the at least two heads moves off of one of the plurality of scales 152 (two-dimensional grating RG) during the movement of substrate holder 34 in the X-axis direction, and is moved to irradiate another scale 152 (two-dimensional grating RG) adjacent to the one scale 152 (two-dimensional grating RG). However, by making the spacing between the at least two heads in the X-axis direction wider than the spacing of two-dimensional grating RG of adjacent scales 152, the non-measurement period does not overlap in the at least two heads, that is, the measurement beam of at least one head constantly irradiates scale 152. In these structures, at least three heads constantly face at least one scale 152, allowing position information in directions of three degrees of freedom to be measured.

Note that the number of scales, spacing between adjacent scales and the like may be different in the first grating group and the second grating group. In this case, in at least two heads facing the first grating group and at least two heads facing the second grating group, spacing between the heads (measurement beams), position and the like may be different.

Note that in the second embodiment described above, the position of heads 66a to 66d in the X-axis direction and the Y-axis direction are calculated from the position of the center of Y slide table 62 in the X-axis direction and the Y-axis direction of each of the pair of head units 60 calculated from the output of the four X linear encoders 96x and the four Y linear encoders 96y, based on the known positional relation of each head with respect to the center of Y slide table 62. That is, the encoder system was to be used for measuring the position of heads 66a to 66d in the X-axis direction and the Y-axis direction. However, the embodiment is not limited to this, and the encoder system and the like may be used to measure position information only in the Y-axis direction of heads 66a to 66d, since heads 66a to 66d (the pair of head units 60) can be moved only in the Y-axis direction. That is, in the second embodiment described above, the four X linear encoders 96x do not necessarily have to be provided. In this case, for heads 66a to 66d, on applying formulas (2a) to (2d) described earlier, design values (fixed values) are used for $p_1$ to $p_4$ (X position), and for $q_1$ to $q_4$ (Y position), values calculated from the output of the four linear encoders 96y are used. Note that in the case the affine transformation relation is not used, on measuring position information in the Y-axis direction of substrate holder 34 by heads 66b and 66c, measurement information of the four linear encoders 96y is used, and on measuring position information in the X-axis direction of substrate holder 34 by heads 66a and 66d, measurement information of the four Y linear encoders 96y do not have to be used.

Note that in the second embodiment described above, while the plurality of scales 152 having a single two-dimensional grating RG (grating area) formed on each scale was used, the present invention is not limited to this, and at least one of the first grating group or the second grating group may include a scale 152 that has two or more grating areas formed apart in the X-axis direction.

Note that in the second embodiment described above, while the case has been described in which to measure and control the positions (X, Y, θz) of substrate holder 34 constantly by three heads, the first grating group and the second grating group including five scales 152 each having the same structure are arranged shifted by a predetermined distance in the X-axis direction, the embodiment is not limited to this, and one of the head units 60 and the other of the head units 60 may have heads (66x, 66y) used for measurement of substrate holder 34 arranged differently in the X-axis direction, without the first grating group and the second grating group being shifted in the X-axis direction (arranged the line of scales 152 almost completely facing each other). Also in this case, the positions (X, Y, θz) of substrate holder 34 can constantly be measured and controlled by the three heads.

Note that in the second embodiment described above, while the case of using a total of four heads, heads 66a and 66b and heads 66c and 66d has been described, the embodiment is not limited to this, and five or more heads may also be used. That is, to one of the two heads each facing the first grating group and the second grating group, at least one of redundant head may be added. This structure will be described in a third embodiment below.

Third Embodiment

Next, a third embodiment will be described, based on FIG. 21. Since the structure of the liquid crystal exposure apparatus according to the third embodiment is the same as the first and the second embodiments previously described except for the structure of a part of substrate encoder system 50, only the different points will be described below, and for elements having the same structure and function as the first and the second embodiments will have the same reference code as the first and the second embodiments, and the description thereabout will be omitted.

Figure 21:
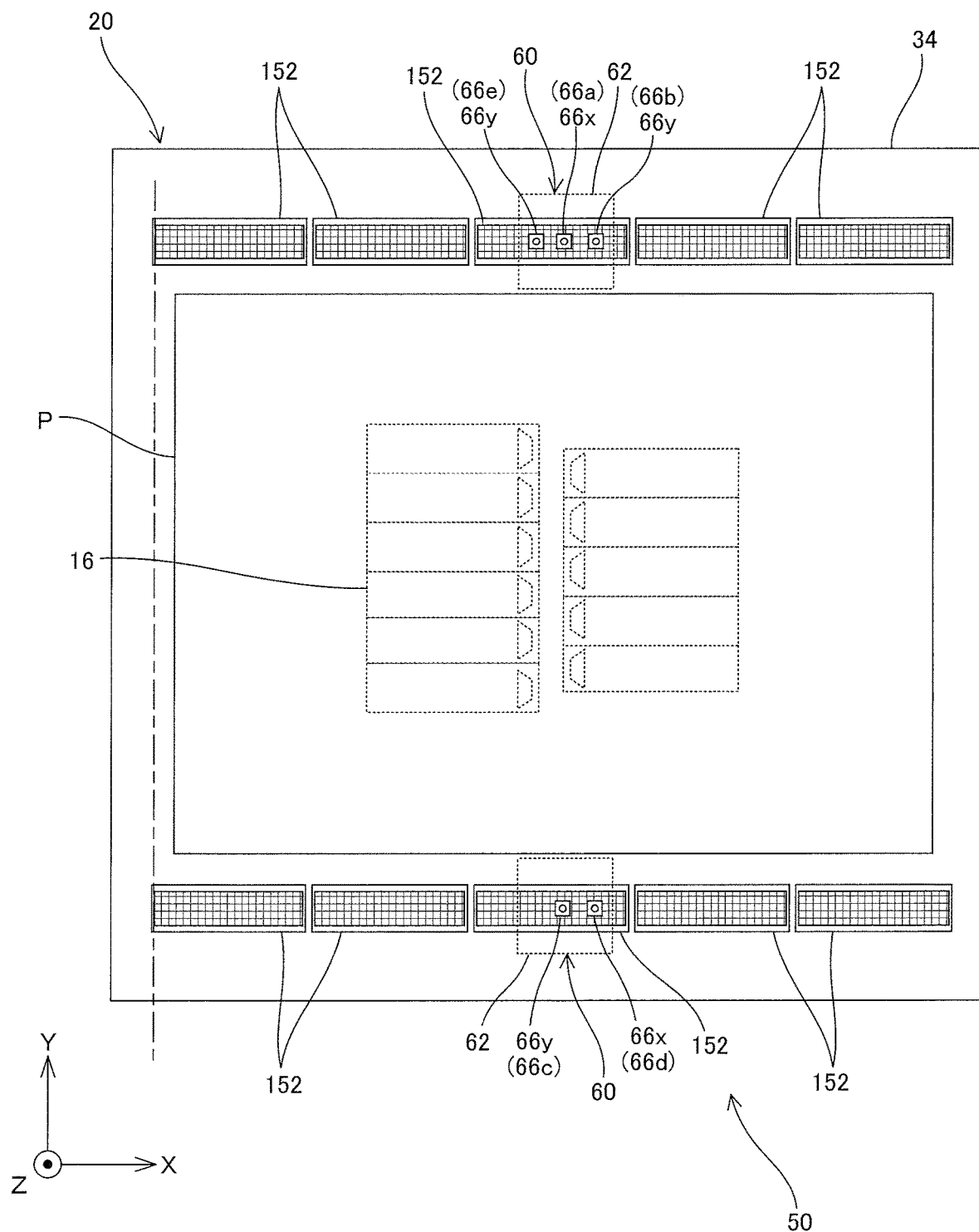
FIG. 21 is a planar view showing a substrate holder and a pair of head units of a substrate encoder system that a liquid crystal exposure apparatus according to a third embodiment has, along with a projection optical system.

FIG. 21 shows substrate holder 34 and the pair of head units 60 of substrate encoder system 50 according to the third embodiment in a planar view, along with projection optical system 16. In FIG. 21, to make the description comprehensive, illustration of encoder base 54 and the like is omitted. Also, in FIG. 21, along with head unit 60 (Y slide table 62) illustrated in a dotted line, illustration of X head 64x and Y head 64y provided on the upper surface of Y slide table 62 is also omitted.

With the liquid crystal exposure apparatus according to the third embodiment, as is shown in FIG. 21, in each of the areas on the +Y side and the −Y side of substrate holder 34 with the substrate mounting area in between, for example, five scales 152 are arranged at a predetermined spacing in the X-axis direction. With the five scales 152 arranged on the +Y side of the substrate mounting area and the five scales 152 arranged on the −Y side, the spacing between adjacent scales 152 is the same, and the five scales 152 on the +Y side of the substrate mounting area and the five scales 152 on the −Y side are arranged at the same X position, facing each other. Accordingly, the position of the spacing between adjacent scales is located on almost the same straight line in the Y-axis direction that has a predetermined width.

To the lower surface (surface on the −Z side) of Y slide table 62 of one of the head units 60 positioned on the +Y side, a total of three heads, Y head 66y, X head 66x, and Y head 66y are fixed apart by a predetermined spacing (a distance larger than the spacing between adjacent scales 152) in the X-axis direction from the −X side, in a state each facing scale 152. To the lower surface (surface on the −Z side) of Y slide table 62 of the other head unit 60 positioned on the −Y side, Y head 66y and X head 66x are fixed apart by a predetermined spacing in the X-axis direction, in a state each facing scale 152. In the description below, for convenience of explanation, three heads that one of the head units 60 has will be referred to as head 66e, head 66a, and head 66b from the −X side, and Y head 66y and X head 66x that the other head unit 60 has will be referred to as head 66c and head 66d, respectively.

In this case, head 66a and head 66c are arranged at the same X position (on the same straight line in the Y-axis direction), and head 66b and head 66d are arranged at the same X position (on the same straight line in the Y-axis direction). Heads 66a, 66d and the two-dimensional gratings RG that face each head structure a pair of X linear encoders, and heads 66b, 66c, and 66e and the two-dimensional gratings RG that face each head structure three Y linear encoders.

With the liquid crystal exposure apparatus according to the third embodiment, the structure of other parts is similar to the liquid crystal exposure apparatus according to the second embodiment described earlier.

In the third embodiment, although the arrangement of scales 152 lined on the +Y side and the −Y side is not shifted in the X-axis direction, as long as the pair of head units 60 moves (or the Y position of substrate holder 4 is maintained at a position where the pair of head units 60 faces the line of scale 152) in the Y-axis direction synchronously with substrate holder 34, three heads of heads 66a to 66e constantly faces scale 152 (two-dimensional grating RG) regardless of the X position of substrate holder 34.

The liquid crystal exposure apparatus according to the third embodiment described so far has a working effect equivalent to the liquid crystal exposure apparatus according to the second embodiment described earlier.

Note that in the third embodiment described above, the plurality of heads for measuring position information of substrate holder 34 can also be regarded to include one head 66a in addition to, e.g. heads 66e, 66b, 66c, and 66d necessary for switching of the heads, whose non-measurement period partly overlaps one head 66c of the four heads. And, in the third embodiment, on measuring position information (X, Y, θz) of substrate holder 34, of the five heads including the four heads 66e, 66b, 66c, and 66d and the one head 66c, measurement information is used of at least three heads irradiating at least one of the plurality of grating areas (two-dimensional grating RG) with a measurement beam.

Note that the third embodiment described above is an example of a case when the non-measurement period overlaps in at least two heads of a plurality of heads, for example, two heads move off of scale 152 (grating area, e.g. two-dimensional grating RG) at the same time, and simultaneously move to face an adjacent scale 152 (grating area, e.g. two-dimensional grating RG). In this case, to continue measurement even if the measurement is cut off for the at least two heads, at least three heads need to face the grating area (two-dimensional grating) of the grating section. Moreover, as a premise, the measurement should not be cut off for the at least three heads until one or more of the at least two heads whose measurement has been cut off switches to face an adjacent grating area. That is, even if there is at least two heads whose non-measurement period overlaps, if there is at least three heads adding to the at least two heads, measurement can be continued even if the grating areas are arranged spaced apart.

Fourth Embodiment

Figure 22:
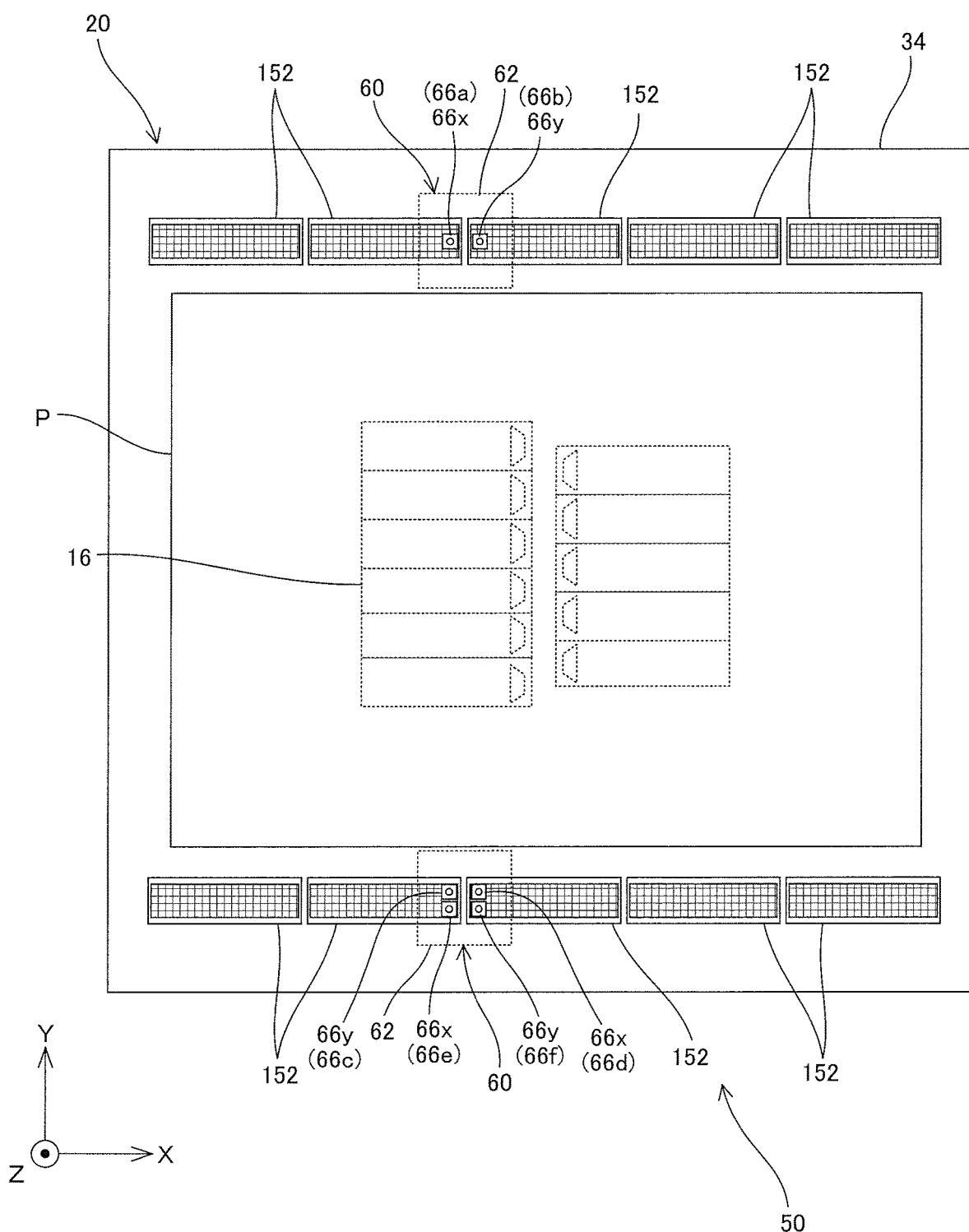
FIG. 22 is a view used to explain a characteristic structure of a liquid crystal exposure apparatus according to a fourth embodiment.

Next, a fourth embodiment will be described, based on FIG. 22. While the structure of the liquid crystal exposure apparatus according to the fourth embodiment is different from the structure of the liquid crystal exposure apparatus according to the second embodiment described earlier on the points that scales 52 lined in each of the areas on both the +Y side and the −Y side of the substrate mounting area of substrate holder 34 are arranged facing each other similarly as in the third embodiment, and that one of the head units 60 positioned on the −Y side has two each of X heads 66x and Y heads 66y similarly to the first embodiment, as is shown in FIG. 22, the structure of other parts is similar to the liquid crystal exposure apparatus according to the second embodiment.

To the lower surface (surface on the −Z side) of Y slide table 62 of one of the head units 60, X head 66x (hereinafter appropriately called head 66e) is provided arranged adjacent to Y head 66y (head 66c) on the −Y side, along with Y head 66y (hereinafter appropriately called head 66f) provided arranged adjacent to X head 66x (head 66d) on the −Y side.

With the liquid crystal exposure apparatus according to the embodiment, in a state when the pair of head units 60 is moving in the Y-axis direction (or when the Y position of substrate holder 34 is maintained at a position where the pair of head units 60 face the scales 152 lined), a case may occur when one of three heads 66a, 66c, and 66e (to be referred to as heads of a first group) and three heads 66b, 66d, and 66f (to be referred to as heads of a second group) do not face any of the scales due to substrate holder 34 moving in the X-axis direction, and when this occurs, the other of the heads of the first group and the heads of the second group face scale 152 (two-dimensional grating RG) without fail. That is, in the liquid crystal exposure apparatus according to the fourth embodiment, although the arrangement of scales 152 lined on the +Y side and the −Y side is not shifted in the X-axis direction, as long as the pair of head units 60 moves (or the Y position of substrate holder 4 is maintained at a position where the pair of head units 60 faces the line of scale 152) in the Y-axis direction, the positions (X, Y, θz) of substrate holder 34 can be measured regardless of the X position of substrate holder 34, by the three heads included in at least one of the heads of the first group and the heads of the second group.

Here, a case will be considered, for example, of restoring (re-start measurement of) the heads of the first group (heads 66a, 66c, and 66e) when the heads face scale 152 again, after heads 66a, 66c, and 66e no longer face any of the scales and have become non-measurable. In this case, at the point before measurement is re-started by the heads of the first group (heads 66a, 66c, and 66e), the positions (X, Y, θz) of substrate holder 34 is being continuously measured and controlled by the heads of the second group (heads 66b, 66d, and 66f). Therefore, main controller 90, as is shown in FIG. 22, at the point when the pair of head units 60 crosses over adjacent two scales 152 arranged on each of the +Y side and the −Y side and the heads of the first group and the heads of the second group face one and the other of the adjacent two scales 152, respectively, calculates the positions (X, Y, θz) of substrate holder 34 by the method described in detail in the second embodiment based on measurement values of the heads of the second group (heads 66b, 66d, and 66f), and by substituting the positions (X, Y, θz) of the substrate holder into the formula of affine transformation described earlier, initial values of the heads of the first group (heads 66a, 66c, and 66e) are calculated and set at the same time. This allows the heads of the first group to be restored and to re-start measurement and control of the position of substrate holder 34 with these heads easily.

With the liquid crystal exposure apparatus according to the fourth embodiment described so far, the apparatus exhibits a working effect equivalent to the liquid crystal exposure apparatus according to the second embodiment described earlier.

Modified Example of the Fourth Embodiment

This modified example describes a case when a head unit having an identical structure (or a structure symmetrical in the vertical direction of the page surface) as one of the head units 60 is used as the other head unit 60 positioned on the +Y side, in the liquid crystal exposure apparatus according to the fourth embodiment.

In this case, similarly to the description above, eight heads are grouped into four heads each being arranged on the same straight line in the Y-axis direction; heads of a first group, and heads of a second group.

A case will be considered of restoring the heads of a first group and re-starting measurement with these heads when the heads face scale 152 again, after the heads of the first group no longer face any of the scales and can no longer perform measurement.

In this case, at the point before measurement is re-started by the heads of the first group, the positions (X, Y, θz) of substrate holder 34 are being continuously measured and controlled by three heads of the heads of the second group. Therefore, main controller 90, as is described earlier, at the point when the pair of head units 60 crosses over adjacent two scales 152 arranged on each of the +Y side and the −Y side and the heads of the first group and the heads of the second group face one and the other of the adjacent two scales 152, respectively, calculates initial values of each of the heads of the first group, however, in this case, the main controller cannot calculate the initial values of all four heads of the first group at the same time. This is because if the heads to be restored for measurement were three (the number of X heads and Y heads added), when the initial values of the measurement values of the three heads are set in the procedure described earlier, by solving the simultaneous equations described earlier using the initial values as measurement values $C_1$, $C_2$, $C_3$ and the like, the positions (X, Y, θz) of the substrate holder is uniquely decided, which causes no problems in particular. However, simultaneous equations using the affine transformation relation that can uniquely decide the positions (X, Y, θz) of the substrate holder using measurement values of four heads cannot be conceived.

Therefore, in the modified example, the first group to be restored is to be grouped into two groups, each having three heads including different heads and the initial values are calculated and set simultaneously for the three heads for each group in the method described earlier. After the initial values have been set, the measurement values of either of the groups may be used for position control of substrate holder 34. Position measurement of substrate holder 34 by the heads of the group not used for position control may be executed in parallel with position control of substrate holder 34. Note that the initial values of each head of the first group to be restored can be sequentially calculated individually, by the method described earlier.

Note that the structures described so far in the first to fourth embodiments can be changed as appropriate. For example, in mask encoder system 48 and substrate encoder system 50 of the first embodiment, the arrangement of encoder heads and scales may be reversed. That is, for example, X linear encoder 92x and Y linear encoder 92y for obtaining position information of mask holder 40 may be structured so that encoder heads are attached to mask holder 40 and scales are attached to encoder base 43. Also, X linear encoder 94x and Y linear encoder 94y for obtaining position information of substrate holder 34 may have encoder heads attached to substrate holder 34 and scales attached to Y slide table 62. In this case, the encoder heads attached to substrate holder 34 may be arranged, for example, along the X-axis direction in a plurality of numbers, and are preferably structured switchable with one another. Also, the encoder heads provided at substrate holder 34 may be made movable and sensors to measure position information of the encoder heads may be provided, and the scales may be provided at encoder base 43. In this case, the scales provided at encoder base 43 are fixed. Similarly, X linear encoder 96x and Y linear encoder 96y for obtaining position information of Y slide table 62 may have scales attached to Y slide table 62 and encoder heads attached to encoder base 54 (apparatus main section 18). In this case, the encoder heads attached to encoder base 54 may be arranged, for example, along the Y-axis direction in a plurality of numbers, and are preferably structured switchable with one another. In the case the encoder heads are fixed to substrate holder 34 and encoder base 54, the scales fixed to Y slide table 62 may be used in common.

Also, in substrate encoder system 50, while the case has been described where a plurality of scales 52 are fixed extending in the X-axis direction on the substrate stage device 20 side and a plurality of scales 56 are fixed extending in the Y-axis direction on the apparatus main section 18 (encoder base 54) side, the substrate encoder system is not limited to this, and a plurality of scales extending in the Y-axis direction may be fixed on the substrate stage device 20 side and a plurality of scales extending in the X-axis direction may be fixed on the apparatus main section 18 side. In this case, head unit 60 is moved in the X-axis direction while substrate holder 34 is being moved in exposure operation and the like of substrate P.

Also, while the case has been described in which in mask encoder system 48, for example, threes scales 46 are arranged separate in the X-axis direction, and in substrate encoder system 50, for example, two scales 52 are arranged separate in the Y-axis direction and five scales 56 are arranged separate in the X-axis direction, the number of scales is not limited to this, and may be appropriately changed, for example, according to the size of mask M and substrate P, or movement strokes. Also, the plurality of scales may not necessarily have to be arranged separate, and for example, a longer single scale (in the case of the embodiment above, for example, a scale about three times the length of scale 46, a scale about two times the length of scale 52, and a scale about five times the length of scale 56) may be used. Also, a plurality of scales having different lengths may be used, and the number of scales structuring the grating section does not matter, as long as each of the grating sections includes a plurality of grating areas arranged side by side in the X-axis direction or the Y-axis direction.

Also, although the structure was employed in which Y slide table 62 and belt driver 68 are provided at the lower surface (refer to FIG. 4) of upper mount section 18a of apparatus main section 18, Y slide table 62 and belt driver 68 may be provided at lower mount section 18b or middle mount section 18c.

Also, in the first embodiment described above, while the case has been described where X scales and Y scales are formed independently on the surface of each of the scales 46, 52, and 56, the embodiment is not limited to this, and a scale having a two-dimensional grating formed may be used, similarly to the second or fourth embodiments described earlier. In this case, an XY two-dimensional head can be used as the encoder head. Also, in scale 52 formed on substrate holder 34, while X scale 53x and Y scale 53y are formed having the same length in the X-axis direction, these lengths may be made mutually different. Also, X scale 53x and Y scale 53y may be arranged relatively shifted in the X-axis direction. Also, while the case of using a diffraction interference encoder system has been described, the encoder is not limited to this, and other encoders such as the so-called pick-up system or a magnetic system may also be used, and the so-called scan encoder whose details are disclosed in, for example, U.S. Pat. No. 6,639,686 may also be used. Also, position information of Y slide table 62 may be obtained by a measurement system other than the encoder system (e.g. an optical interferometer system).

Note that in the second to fourth embodiments and the modified example (hereinafter shortly referred to as the fourth embodiment) described above, while the case has been described in which at least four heads are provided, in such a case, the number of scales 152 structuring the grating section does not matter, as long as the grating section includes a plurality of grating areas arranged side by side in the first direction. The plurality of grating areas does not necessarily have to be arranged on both one side and the other side in the Y-axis direction with substrate P of substrate holder 34 in between, and may be arranged only on one side. However, to continuously control the positions (X, Y, θz) of substrate holder 34 at least during the exposure operation of substrate P, the following conditions need to be satisfied.

That is, while a measurement beam of one head of the at least four heads moves off of the plurality of grating areas (e.g. two-dimensional grating RG described earlier), along with at least the three heads remaining irradiate at least one of the plurality of grating areas with the measurement beams, by movement of substrate holder 34 in the X-axis direction (the first direction), the one head described above whose measurement beam moves off of the plurality of grating areas is switched in the at least four heads described above. In this case, the at least four heads include; two heads whose positions (irradiation positions) of the measurement beams in the X-axis direction (the first direction) are different from each other, and two heads whose positions of the measurement beams in the Y-axis direction (the second direction) are different from at least one of the two heads along with positions (irradiation positions) of the measurement beams in the X-axis direction (the first direction) being different from each other, and the two heads irradiate measurement beams in the X-axis direction at a spacing wider than the spacing of a pair of adjacent grating areas of the plurality of grating areas.

Note that the grating areas (e.g. two-dimensional grating RG) arranged side by side in the X-axis direction may be arranged in the Y-axis direction in three or more rows. For example, in the fourth embodiment described above, instead of the five scales 152 on the −Y side, a structure may be employed in which two rows of grating areas (e.g. two-dimensional gratings RG) adjacent in the Y-axis direction are provided, consisting of 10 grating areas (e.g. two-dimensional gratings RG) having an area which is half of each of the five scales 152 in the Y-axis direction, and heads 66e and 66f can be made to face two-dimensional grating RG, at one of the rows and heads 66c and 66d can be made to to face two-dimensional grating RG at the other of the rows. Also, in the modified example of the fourth embodiment described above, also for the five scales 152 on the +Y side, a structure may be employed in which two rows of grating areas (e.g. two-dimensional gratings RG) adjacent in the Y-axis direction are provided, consisting of 10 grating areas similar to the description above, and a pair of heads can be made to face two-dimensional grating RG at one of the rows, and the remaining pair of heads can be made to face two-dimensional grating RG at the other of the rows.

Note that in the second to fourth embodiments described above, when substrate holder 34 moves in the X-axis direction (the first direction), it is important to set position or spacing, or position and spacing and the like of at least one of scales and heads, so that at least among the four heads mutually, measurement beams not being irradiated on (move off of the grating areas of) any of the two-dimensional grating RG, that is, measurement with the heads being non-measurable (non-measurement section) does not overlap for any two heads.

Note that in the second or the fourth embodiment described above, instead of each X head 66x measuring position information of substrate holder 34, an encoder head (XZ head) whose measurement direction is in the X-axis direction and the Z-axis direction may be used, together with an encoder head (YZ head) whose measurement direction is in the Y-axis direction and the Z-axis direction. As these heads, a sensor head having a structure similar to the displacement measurement sensor head disclosed in, for example, U.S. Pat. No. 7,561,280, can be used. In such a case, on switching and linkage process of the heads described earlier, adding to the linkage process performed to secure continuity of measurement results of the position of substrate holder 34 in directions of three degrees of freedom (X, Y, θz) in the XY plane by performing a predetermined calculation using measurement values of three heads used for position control of substrate holder 34 before switching, main controller 90 may also perform the linkage process to secure continuity of measurement results of the position of substrate holder 34 in the remaining directions of three degrees of freedom (Z, θx, θy) by a similar method described earlier. Specifically, taking the second embodiment representatively as an example, main controller 90 may acquire correction information for controlling the movement of substrate holder 34 in the remaining directions of three degrees of freedom (Z, θx, θy) using one head whose measurement beam moves off of one two-dimensional grating RG (grating area) and moves to irradiate another two-dimensional grating RG (grating area) of the four heads 66a, 66b, 66c, and 66d, based on measurement information in the Z-axis direction (a third direction) by the remaining three heads or position information of substrate holder 34 in the remaining directions of three degrees of freedom (Z, θx, θy) measured by the remaining three heads.

Note that in the second or the fourth embodiment, while the initial value of another head to be switched is to be set when a measurement beam moves off of one scale and moves to irradiate another scale, the embodiment is not limited to this, and correction information for controlling the substrate holder may be acquired using another head, such as correction information of the measurement values of another head. In the correction information to control the movement of the substrate holder using another head, the initial value is naturally included, but the information is not limited to this, and as long as the information may be used so that the another head can start the measurement again, the information may also be an offset value from the values to be measured after re-starting the measurement.

Note that in the first to fourth embodiments described above, while the substrate position measurement system is structured by Z-tilt position measurement system 98 and substrate encoder system 50, for example, instead of the X heads and Y heads, by using XZ head and YZ heads, the substrate position measurement system may be structured only by substrate encoder system 50.

Also, in the first to fourth embodiments described above, separate from the pair of head units 60 of substrate encoder system 50, at least one head may be provided arranged separate from head unit 60 in the X-axis direction. For example, a head unit the same as head unit 60 may be provided, arranged apart from projection optical system 16 in the X-axis direction, at each of the +Y side and the −Y side with respect to the mark detection system (alignment system) that detects alignment marks of substrate P, and on detection operation of the substrate marks, the pair of head units arranged on the +Y side and the −Y side of the mark detection system may be used to measure the position information of substrate holder 34. In this case, on the mark detection operation, even if all measurement beams of the pair of head units move off of scales 152 (or 52), substrate encoder system 50 (the another pair of head units) can continue to measure position information of substrate holder 34, which allows the degree of freedom when designing the exposure apparatus to be increased, such as in the position of the mark detection system. Note that by arranging the substrate position measurement system measuring the position information of substrate P in the Z-axis direction close to the mark detection system, substrate encoder system 50 can measure the position information of substrate holder 34 also on detection operation of the Z position of the substrate. Alternately, the substrate position measurement system may be arranged close to projection optical system 16 so that the pair of head units 60 may be used to measure the position information of substrate holder 34 on detection operation of the Z position of the substrate. Also, in the embodiments, when substrate holder 34 is arranged at a substrate exchange position set apart from projection optical system 16, measurement beams of all heads of the pair of head units 60 move off of scales 152 (or 52). Therefore, at least one head (which may either be a movable head or a fixed head) may be provided facing at least one of the plurality of scales 152 (or 52) of substrate holder 34 arranged at the substrate exchange position, so that substrate encoder system 50 can measure the position information of substrate holder 34 also on the substrate exchange operation. Here, before substrate holder 34 arrives at the substrate exchange position, or in other words, before the at least one head arranged at the substrate exchange position faces scale 152 (or 52), in the case the measurement beams move off of scales 152 (or 52) in all heads of the pair of head units 60, at least one head is to be added arranged during the moving route of substrate holder 34 so that substrate encoder system 50 can continue to measure the position information of substrate holder 34. Note that in the case of using the at least one head provided separately from the pair of head units 60, the linkage process described earlier may be performed using the measurement information of the pair of head units 60.

Also, in the first to fourth embodiments described above, the XZ head described earlier may be used instead of each X head of mask encoder system 48, along with using the YZ head described earlier instead of each Y head. Or, in the first to fourth embodiments described above, the mask encoder system may be structured so that a plurality of heads can move relatively with respect to scales 46 in the Y-axis direction, similar to the encoder for position measurement of substrate holder 34 of substrate encoder system 50. Also, instead of scales 46, a scale may be used, having a two-dimensional grating RG formed similar to scale 152 described earlier.

Similarly, in the first to fourth embodiments described above, the XZ head described earlier may be used instead of each X head 64x, along with using the YZ head described earlier instead of each Y head 64y. In such a case, also instead of scales 56, a scale may be used, having a two-dimensional grating RG formed similar to scale 152 described earlier. In such a case, with a pair of XZ heads and a pair of YZ heads and an encoder system that these heads can face, position information of at least one of rotation (θz) and tilt (at least one of θx and θy) of a plurality of heads 66x and 66y may be measured.

Note that while a grating is formed (the surface is a grating surface) on the surface of scales 46, 52, 56, 152 and the like, for example, a cover member (such as glass or a thin film) that covers the grating may be provided so that the grating surface is provided inside the scale.

Note that in the first to fourth embodiments described above, while the case has been described in which one pair each of X head 64x and Y head 64y are provided at Y slide table 62, along with the heads for measuring the position of substrate holder 34, one pair each of X head 64x and Y head 64y may be provided at the heads used for measuring the position of substrate holder 34 without the Y slide table.

Note that in the description so far, while the case has been described in which the measurement directions within the XY plane of each head that the mask encoder system and the substrate encoder system are equipped with is the X-axis direction or the Y-axis direction, the embodiments are not limited to this, and for example, in the case of the second to fourth embodiments, instead of the two-dimensional grating RG, a two-dimensional grating may be used that intersects in the X-axis direction and the Y-axis direction and also has periodic directions in two directions (called α direction and β direction for convenience) orthogonal to each other, and corresponding to this, as each head described earlier, heads with measurement directions in the α direction (and the Z-axis direction) or the β direction (and the Z-axis direction) may be used. Also, in the first embodiment described earlier, instead of each X scale and Y scale, for example, a one-dimensional grating whose periodic direction is in the α direction or β direction may be used, and corresponding to this, as each head described earlier, heads with measurement directions in the α direction (and the Z-axis direction) or the β direction (and the Z-axis direction) may be used.

Note that in the second to fourth embodiments described above, the first grating group may be structured by the row of X scales described earlier and the second grating group may be structured by the row of Y scales described earlier, and corresponding to this, a plurality of X heads (or XZ heads) that can face the X scales may be arranged at a predetermined spacing (spacing wider than the spacing between adjacent X scales) along with a plurality of Y heads (or YZ heads) that can face the Y scales being arranged at a predetermined spacing (spacing wider than the spacing between adjacent Y scales).

Note that in the first to fourth embodiments described above, as each scale arranged side by side in the X-axis direction or the Y-axis direction, a plurality of scales of different lengths may naturally be used. In this case, when two or more rows of scales having the same or orthogonal periodic directions are provided side by side, scales may be chosen with lengths that can be set so that the spacing between the scales do not overlap one another. That is, the arrangement spacing of the space between the scales structuring one row of scales does not have to be an equal spacing. Also, for example, in the row of scales on substrate holder 34, the scales arranged in the center may have a length in the X-axis direction physically longer than that of the scales (scales arranged at each edge in the row of scales) arranged at both ends in the X-axis direction.

Note that in the first to fourth embodiments described above, while encoders for movable heads only have to measure position information of at least the movement direction (the Y-axis direction in the embodiments described above), the encoders may also measure position information of at least one direction (at least one of X, Z, θx, θy, and θz) different from the movement direction. For example, position information in the X-axis direction of a head (X head) whose measurement direction is in the X-axis direction may also be measured, and position information in the X-axis direction may be obtained with this X information and measurement information of the X head. However, with the head (Y head) whose measurement direction is in the Y-axis direction, position information in the X-axis direction orthogonal to the measurement direction does not have to be used. Similarly, with the X head, position information in the Y-axis direction orthogonal to the measurement direction does not have to be used. In short, position information of substrate holder 34 in the measurement direction may be obtained, measuring position information in at least one direction different from the measurement direction of the heads, and by using this measurement information and measurement information of the heads. Also, for example, position information (rotation information) of the movable head in the θz direction may be measured using two measurement beams having different positions in the X-axis direction, and by using this rotation information with measurement information of the X head and the Y head, position information in the X-axis direction and the Y-axis direction may be obtained. In this case, by arranging two of one of the X heads and Y heads and one of the other of the X heads and Y heads so that the two heads having the same measurement direction are not arranged at the same position in the direction orthogonal to the measurement direction, position information in the X direction, the Y direction, and the θz direction can be measured. The other head preferably irradiates a position different from the two heads with the measurement beam. Moreover, if the heads of encoders for movable heads is an XZ head or a YZ head, by arranging, for example, two of one of the XZ heads and the YZ heads and the other of the XZ heads and the YZ heads so that the heads are not located on the same straight line, not only Z information but also position information (tilt information) in the θx direction and the θy direction can be measured. Position information in the X-axis direction and the Y-axis direction may be obtained by at least one of the position information in the θx direction and the θy direction and the measurement information of the X heads and Y heads. Similarly, with XZ heads or YZ heads, position information in a direction different from the X-axis direction of the movable heads may also be measured, and position information in the Z-axis direction may be obtained with this measurement information and measurement information of the movable heads. Note that when the scales of the encoders measuring the position information of the movable heads is a single scale (grating area), XYθz and ZθxθY may be measured by three heads, however, in the case a plurality of scales (grating areas) are arranged separately, two each of X heads and Y heads, or two each of XZ heads and YZ heads should be arranged and the spacing in the X-axis direction should be set so that the non-measurement period among the four heads do not overlap one another. While this explanation was made on the premise that the grating area is arranged parallel to the XY plane, this also can be applied similarly to a scale having a grating area parallel to the YZ plane.

Also, in the first to fourth embodiments described above, while the encoder was used as the measurement device for measuring position information of the movable heads, devices other than the encoder, such as, for example, an interferometer may also be used. In this case, for example, a reflection surface may be provided at the movable head (or its holding section) and a measurement beam parallel to the Y-axis direction should be irradiated on the reflection surface. Especially when the movable head is moved only in the Y-axis direction, the reflection surface does not have to be large, which makes it easy to locally air-condition the optical path of the interferometer beam to reduce air fluctuation.

Also, in the first to fourth embodiments described above, while the movable heads that irradiate the scales of the substrate holder with measurement beams are arranged one each in the Y-axis direction on both sides of the projection system, a plurality of movable heads may each be arranged. For example, if adjacent movable heads (measurement beams) are arranged so that the measurement period of a plurality of movable heads partly overlaps in the Y-axis direction, the plurality of movable heads can continue to measure position information even when the substrate holder moves in the Y-axis direction. In this case, linkage process becomes necessary among the plurality of movable heads. Therefore, measurement information of a plurality of heads arranged only on one side of the +Y side and the –Y side of the projection system irradiating measurement beams on at least one scale may be used to acquire correction information related to another head whose measurement beam is within the scale, or measurement information of not only the heads arranged on the +Y side but at least one head arranged on the other side may also be used. In short, of the plurality of heads each arranged on the +Y side and the –Y side, measurement information of at least three heads irradiating measurement beams on the scale may preferably be used.

Also, with substrate encoder system 50 of the first to fourth embodiments described above, while a plurality of scales (grating areas) is arranged separately in the scanning direction (the X-axis direction) in which substrate P is moved on scanning exposure, along with a plurality of heads being movable in the stepping direction (the Y-axis direction), conversely, the plurality of scales may be arranged in the stepping direction (the Y-axis direction) along with the plurality of heads being movable in the scanning direction (the X-axis direction).

Also, in the first to fourth embodiments described above, the heads of mask encoder system 48 and encoder system 50 do not necessarily have to have all the optical system that irradiates a scale with a beam from the light source, and may have a part of the light source, such as for example, only the light-emitting section.

Also, in the second to fourth embodiments described above, the heads of the pair of head units 60 are not limited to the arrangement in FIG. 17 (X heads and Y heads are arranged on the +Y side and the –Y side, and on the +Y side and the –Y side, the arrangement of the X head and Y head on one side is opposite to the other side in the X-axis direction), and for example, X heads and Y heads may be arranged on the +Y side and the –Y side, and on the +Y side and the –Y side, the arrangement of the X head and Y head on one side may be the same as the other side in the X-axis direction. However, in the case the X position of two Y heads is the same, when measurement of one of the two X heads is cut off, then the θz information can no longer be measured, therefore, the X position of the two Y heads should preferably be different.

Also, in the first to fourth embodiments described above, when the scales (scale members, grating section) irradiated with the measurement beams from the heads of the encoder system are provided at the projection optical system 16 side, the scales provided are not limited to only a part of apparatus main section 18 (frame member) supporting projection optical system 16, and may be provided at the barrel part of projection optical system 16.

Also, in the first to fourth embodiments described above, while the case has been described in which the movement direction (scanning direction) of mask M and substrate P at the time of scanning exposure is in the X-axis direction, the scanning direction may be in the Y-axis direction. In this case, long stroke direction of the mask stage has to be set in a direction rotated by 90 degrees around the Z-axis, along with having to rotate the direction of projection optical system 16 by 90 degrees around the Z-axis.

Note that in the first to fourth embodiments described above, in the case of arranging a scale group (row of scales) in which a plurality of scales arranged in the X-axis direction is continuously arranged with gaps of a predetermined spacing in between on substrate holder 34 in a plurality of rows at different positions (e.g. a position on one side (+Y side) and a position on the other side (–Y side) with respect to projection optical system 16) separate from each other in the Y axis direction, a structure may be employed so that the plurality of scale groups (plurality of rows of scales) can be used differently depending on arrangement of shots (shot map) on the substrate. For example, by making the whole length of the plurality of rows of scales different from one another between the rows of scales, the scales are applicable to different shot maps, and are also applicable to changes in the number of shot areas formed on the substrate, as in the case of a four-piece setting and the case of a six-piece setting. Also, along with this arrangement, if position of gaps of each row of scales are made to be at different positions in the X-axis direction, the heads corresponding to each of the plurality of rows of scales do not move off away from the measurement range simultaneously, which allows the number of sensors considered as an undefined value in linkage process to be reduced and the linkage process to be performed with high precision.

Also, in a scale group (row of scales) in which a plurality of scales arranged in the X-axis direction is continuously arranged with gaps of a predetermined spacing in between on substrate holder 34, the length in the X-axis direction of one scale (pattern for X-axis measurement) may be a length that can be continuously measured only by a length of one shot area (the length in which a device pattern is irradiated and formed on a substrate when exposure is performed while moving the substrate on the substrate holder in the X-axis direction). This makes position measurement (position control) of substrate P (substrate holder) during scanning exposure easy, since relay control of heads with respect to the plurality of scales does not have to be performed during the scanning exposure of one shot area.

Also, in the first to fourth embodiments described above, a scale for substrate exchange may be provided at substrate stage device 20 or another stage device for the substrate encoder system to acquire position information of substrate stage device 20 moving to the substrate exchange position with the substrate loader, and the substrate encoder system may use the heads facing downward (such as X head 66x) to acquire the position information of substrate stage device 20. Or, a head for substrate exchange may be provided at substrate stage device 20 or another stage device, and position information of substrate stage device 20 may be acquired by measuring scale 56 or the scale for substrate exchange.

Also, a scale for mask exchange may be provided at mask stage device 14 or another stage device for the mask encoder system according to each of the embodiments to acquire position information of mask stage device 14 moving to the mask exchange position with the mask loader, and the mask encoder system may use head unit 44 to acquire the position information of mask stage device 14.

Also a position measurement system (e.g. a mark on a stage and an observation system for observing the mark) separate from the encoder system may be provided to perform exchange position control (management) of the stage.

Also, in each of the embodiments described above, while a structure is employed of providing the scales on substrate holder 34, the scales may be directly formed on substrate P in the exposure process. For example, the scales may be formed on scribe lines between shot areas. This allows the scales formed on the substrate to be measured, and based on results of the position measurement, nonlinear component errors can be obtained for each shot area on the substrate, and overlay accuracy on exposure can also be improved based on the errors.

Note that substrate stage device 20 only has to be able to at least move substrate P along the horizontal plane in long strokes, and in some cases does not have to be able to perform fine position setting in directions of six degrees of freedom. The substrate encoder system according to the first to fourth embodiments described above can also be suitably applied to such a two-dimensional stage device.

Also, the illumination light may be an ultraviolet light such as an ArF excimer laser beam (wavelength 193 nm) or a KrF excimer laser beam (wavelength 248 nm), or a vacuum ultraviolet light such as an $F_2$ laser beam (wavelength 157 nm). Also, as the illumination light, a harmonic wave may be used, which is a single-wavelength laser beam in the infrared or visual region oscillated from a DFB semiconductor laser or a fiber laser as vacuum ultraviolet light that is amplified by a fiber amplifier doped by, e.g. erbium (or both erbium and ytterbium), and then is subject to wavelength conversion into ultraviolet light using a nonlinear crystal. Also, a fixed laser (wavelength: 355 nm, 266 nm) may also be used.

Also, while the case has been described where projection optical system 16 is a projection optical system of a multiple lens method equipped with a plurality of optical systems, the number of projection optical systems is not limited to this, and one or more will be fine. Also, the projection optical system is not limited to the projection optical system of a multiple lens method, and may also be an Offner type projection optical system which uses a large mirror. Also, as projection optical system 16, a magnifying system or a reduction system may also be used.

Also, the exposure apparatus is not limited to the exposure apparatus for liquid crystals which transfers the liquid crystal display device pattern onto a square-shaped glass plate, and may also be widely applied, for example, to an exposure apparatus for manufacturing organic EL (Electro-Luminescence) panels, an exposure apparatus for manufacturing semiconductors, or to an exposure apparatus for manufacturing thin film magnetic heads, micromachines, and DNA chips. Also, the above embodiments can be applied not only to an exposure apparatus for manufacturing microdevices such as semiconductors, but also to an exposure apparatus that transfers a circuit pattern onto a glass substrate or a silicon wafer to manufacture a reticle or a mask used in an optical exposure apparatus, an EUV exposure apparatus, an X-ray exposure apparatus, and an electron-beam exposure apparatus.

Also, the object subject to exposure is not limited to a glass plate, and may also be other objects, such as, for example, a wafer, a ceramic substrate, a film member, or a mask blanks. Also, in the case the exposure object is a substrate for a flat panel display, the thickness of the substrate is not limited in particular, and includes, for example, a film-like substrate (a sheet-like member having flexibility). Note that the exposure apparatus of the embodiments is especially effective in the case when the exposure object is a substrate whose length of a side or diagonal length is 500 mm or more.

Electronic devices such as liquid crystal display devices (or semiconductor devices) are manufactured through the steps such as; a step for performing function/performance design of a device, a step for making a mask (or a reticle) on the basis of this design step, a step for making a glass substrate (or a wafer), a lithography step for transferring a pattern of a mask (reticle) onto the glass substrate by the exposure apparatus and the exposure method described in each of the above embodiments, a development step for developing the glass substrate which has been exposed, an etching step for removing by etching an exposed member of an area other than the area where the resist remains, a resist removing step for removing the resist that is no longer necessary since etching has been completed, a device assembly step, and an inspection step. In this case, in the lithography step, because the device pattern is formed on the glass substrate by carrying out the exposure method previously described using the exposure apparatus of the embodiments described above, a highly integrated device can be manufactured with good productivity.

Note that the disclosures of U.S. Patent Application Publications and U.S. Patents related to the exposure apparatus and the like quoted in each of the embodiments above, in their entirety, are incorporated herein by reference as a part of the present specification.

INDUSTRIAL APPLICABILITY

As is described so far, the exposure apparatus and the exposure method of the present invention is suitable for performing exposure by irradiating and object with an illumination light in a lithography process. Also, the flat panel display manufacturing method of the present invention is suitable for producing flat panel displays.

REFERENCE SIGNS LIST

10 . . . liquid crystal exposure apparatus,
14 . . . mask stage device,
20 . . . substrate stage device,
34 . . . substrate holder,
40 . . . mask holder,
44 . . . head unit,
46 . . . scale,
48 . . . mask encoder system,
50 . . . substrate encoder system,
52 . . . scale,
56 . . . scale,
60 . . . head unit,
90 . . . main controller,
M . . . mask,
P . . . substrate.

The invention claimed is:

1. An exposure method irradiating an object with an illumination light via an optical system, comprising:
measuring position information of a movable body in at least directions of three degrees of freedom within a predetermined plane orthogonal to an optical axis of the optical system by a measurement system in which one of a grating member with a plurality of grating areas arranged apart from the plurality of first grating areas in a second direction orthogonal to the first direction within the predetermined plane and apart from one another in the first direction, and a plurality of heads each irradiating the grating member with a measurement beam that can move in the second direction orthogonal to the first direction within the predetermined plane is provided at the movable body, and the other of the grating member and the plurality of heads is provided facing the movable body, and by the measurement system having a measurement device that measures position information of the plurality of heads in the second direction, position information of the movable body is measured based on measurement information of at least three heads of the plurality of heads irradiating at least one of the plurality of grating areas with the measurement beams and measurement information of the measurement device; and
moving the movable body based on position information measured by the measurement system; wherein
with each of the plurality of heads, the measurement beam moves off one of the plurality of grating areas, and moves to irradiate another grating area adjacent to the one grating area while the movable body is moving in the first direction.

2. The exposure method according to claim 1, wherein each of the plurality of heads has a measurement direction in one of two directions intersecting each other in the predetermined plane, and
the at least three heads used for measurement in the measurement system include at least one head whose measurement direction is one of the two directions and at least two heads whose measurement direction is the other of the two directions.

3. The exposure method according to claim 2, wherein the plurality of heads includes at least two heads whose measurement direction is in the first direction and at least two heads whose measurement direction is in the second direction.

4. The exposure method according to claim 1, wherein the plurality of heads includes a head whose measurement direction is in a direction different from the first direction in the predetermined plane, and
measurement information of the measurement device is used to measure position information of the movable body using the head whose measurement direction is different from the first direction.

5. The exposure method according to claim 4, wherein the plurality of heads includes at least two heads whose measurement direction is in the first direction and at least two heads whose measurement direction is in the second direction.

6. The exposure method according to claim 1, wherein the plurality of heads can be relatively moved with the movable body in the second direction.

7. The exposure method according to claim 1, wherein the plurality of heads includes two heads irradiating the measurement beams at a spacing wider than a pair of adjacent grating areas of the plurality of grating areas in the first direction, and at least one head whose position of the measurement beam is different from at least one of the two heads in the second direction.

8. The exposure method according to claim 1, wherein each of the plurality of grating areas has one of a reflective two-dimensional grating and two reflective one-dimensional gratings whose arrangement direction is different from each other.

9. The exposure method according to claim 1, wherein each of the plurality of grating areas is formed on a plurality of scales different from one another.

10. The exposure method according to claim 1, wherein the at least three heads used for measurement in the measurement system are moved so that each of the measurement beams of the at least three heads does not move off of the plurality of grating areas in the second direction while the movable body is moving.

11. The exposure method according to claim 1, wherein one or a plurality of heads of the plurality of heads each is held by each of a plurality of movable sections, and position information of the head is measured by the measurement device at each of the plurality of movable sections.

12. The exposure method according to claim 1, wherein in each of the plurality of heads, measurement direction is in two directions that are one of two directions intersecting each other within the predetermined plane, and a third direction orthogonal to the predetermined plane, and
position information of the movable body is measured in directions of three degrees of freedom including the third direction, which is different from the directions of three degrees of freedom, using the at least three heads.

13. The exposure method according to claim 1, wherein the plurality of heads has at least four heads, and
while the measurement beam of one head of the at least four heads moves off of the plurality of grating areas, the measurement beams of at least three heads remaining are to irradiate at least one of the plurality of grating areas, and by the movable body moving in the first direction, the one head whose measurement beam moves off of the plurality of grating areas is switched among the at least four heads.

14. The exposure method according to claim 13, wherein the at least four heads include two heads whose position of the measurement beam is different from each other in the first direction, and two heads whose position of the measurement beam is different from at least one of the two heads in the second direction and position of the measurement beam is different from each other in the first direction, and the two heads whose position of the measurement beam is different from each other in the first direction irradiate the measurement beams at a spacing wider than a spacing between a pair of adjacent grating areas of the plurality of grating areas in the first direction.

15. The exposure method according to claim 13, wherein the grating member has at least two of the plurality of grating areas arranged apart from each other in the second direction, and on each of the at least two of the plurality of grating areas, the measurement beam is irradiated via the at least two heads whose position of the measurement beam is different from each other in the first direction, and the at least two heads irradiate the measurement beams at a spacing wider than a spacing between a pair of adjacent grating areas of the plurality of grating areas in the first direction.

16. The exposure method according to claim 15, wherein the grating member is provided at the movable body, and the at least two of the plurality of grating areas includes a pair of the plurality of grating areas arranged on both sides of an object mounting area of the movable body in the second direction.

17. The exposure method according to claim 13, wherein non-measurement section in which the measurement beams of the at least four heads move off the plurality of grating areas in the at least four heads does not overlap while the movable body is moving in the first direction.

18. The exposure method according to claim 17, wherein the plurality of heads includes at least one head whose non-measurement section at least partly overlaps with the non-measurement section of at least one of the at least four heads, and in measurement of position information of the movable body, of at least five heads including the at least four heads and the at least one head, measurement information is used of at least three heads irradiating at least one of the plurality of grating areas with the measurement beam.

19. The exposure method according to claim 13, wherein correction information to control movement of the movable body is acquired, using one head of the at least four heads whose measurement beam moves off of the one grating area and moves to irradiate the another grating area, based on measurement information of at least three heads remaining, or position information of the movable body measured using the at least three heads remaining.

20. The exposure method according to claim 19, wherein the correction information is acquired while each of the measurement beams of the at least four heads irradiates at least one of the plurality of grating areas.

21. The exposure method according to claim 19, wherein position information of the movable body is measured, using at least three heads including the one head whose correction information has been acquired, instead of one head of the at least three heads remaining, before the measurement beam of the one head of the at least three heads remaining moves off of the plurality of grating areas.

22. The exposure method according to claim 19, wherein each of the plurality of heads has a measurement direction in two directions that are one of two directions intersecting each other within the predetermined plane and a third direction orthogonal to the predetermined plane, and position information of the movable body is measured in directions of three degrees of freedom including the third direction, which is different from the directions of three degrees of freedom, using the at least three heads, and correction information to control movement of the movable body in the different directions of three degrees of freedom is acquired, using one head of the at least four heads irradiating the measurement beam that moves off of the one grating area and moves to irradiate the another grating area, based on measurement information in the third direction of at least three heads remaining, or position information of the movable body in the different directions of three degrees of freedom measured using the at least three heads remaining.

23. The exposure method according to claim 1, wherein the other of the grating member and the plurality of heads is provided at a frame member supporting the projection optical system.

24. The exposure method according to claim 1, wherein position information of the plurality of heads is measured by the measurement device in which one of a scale member and a second head is provided at the plurality of heads and the other of the scale member and the second head is provided facing the plurality of heads, the measurement device irradiating the scale member with a measurement beam via the second head.

25. The exposure method according to claim 24, wherein one of the scale member and the second head is provided at the plurality of heads, and the other of the scale member and the second head is provided at one of the projection optical system and a frame member supporting the projection optical system.

26. The exposure method according to claim 25, wherein the grating member is provided at the movable body, and the plurality of heads is provided at the frame member, the second head is provided at the plurality of heads, and the scale member is provided at the frame member.

27. The exposure method according to claim 25, wherein a plurality of the measurement beams is irradiated at positions mutually different on the scale member, and position information of the plurality of heads is measured in a direction different from the second direction.

28. The exposure method according to claim 25, wherein position information on one of rotation and tilt of the plurality of heads is measured by the measurement device.

29. The exposure method according to claim 25, wherein the scale member has at least one of a reflective two-dimensional grating and two reflective one-dimensional gratings whose arrangement direction is different from each other.

30. The exposure method according to claim 24, wherein the scale member has a plurality of grating sections arranged mutually separate in the second direction, the measurement system measures position information of the plurality of heads by the measurement device having a plurality of the second heads including at least two of the second heads whose position of the measurement beams is different in the second direction, and the at least two of the second heads irradiate the measurement beams at a spacing wider than a pair of adjacent grating sections of the plurality of grating sections in the second direction.

31. The exposure method according to claim 30, wherein the plurality of second heads include at least one second head whose position of the measurement beam is different from at least one of the at least two of the second heads in one of the first direction and a third direction orthogonal to the predetermined plane.

32. The exposure method according to claim 30, wherein a plurality of the measurement beams is irradiated at positions mutually different on the scale member, and position information of the plurality of heads is measured in a direction different from the second direction.

33. The exposure method according to claim 30, wherein position information on one of rotation and tilt of the plurality of heads is measured by the measurement device.

34. The exposure method according to claim 30, wherein the scale member has at least one of a reflective two-dimensional grating and two reflective one-dimensional gratings whose arrangement direction is different from each other.

35. The exposure method according to claim 1, wherein the object is a mask illuminated with the illumination light via the optical system.

36. The exposure method according to claim 35, wherein the other of the grating member and the plurality of heads is provided at one of the projection system and a frame member supporting the projection system, and the projection system projecting a pattern of the mask on a substrate has a plurality of projection optical systems each projecting a partial image of the pattern on projection areas of mutually different positions.

37. The exposure method according to claim 1, wherein the object is a substrate exposed with the illumination light via the optical system.

38. The exposure method according to claim 37, wherein position information of a holding member that can move holding a mask illuminated with the illumination light is measured by an encoder system in which one of a scale member and a third head is provided at the holding member and the other of the scale member and the third head is provided at one of the projection system and a frame member supporting the projection system.

39. The exposure method according to claim 37, wherein the optical system has a plurality of projection optical systems, and
each of a partial image of a pattern of the mask illuminated with the illumination light is projected on the substrate via the plurality of projection optical systems.

40. The exposure method according to claim 39, wherein the substrate is scanned and exposed with the illumination light via the projection optical system, and
the plurality of projection optical systems each projects the partial image in a plurality of projection areas of mutually different positions in a direction orthogonal to a scanning direction in which the substrate is moved on the scan and exposure.

41. The exposure method according to claim 37, wherein the substrate is scanned and exposed with the illumination light via the projection system, and is moved in one of the first direction and the second direction on the scan and exposure.

42. The exposure method according to claim 37, wherein the substrate has at least one of a length of a side and a diagonal length that is 500 mm or more, and is used in a flat panel display.

43. A flat panel display manufacturing method, comprising:
exposing a substrate using the exposure method according to claim 1; and
developing the substrate that has been exposed.

* * * * *